(12) United States Patent
Cameron et al.

(10) Patent No.: US 7,499,503 B2
(45) Date of Patent: Mar. 3, 2009

(54) PARALLEL CONCATENATED CODE WITH SOFT-IN SOFT-OUT INTERACTIVE TURBO DECODER

(75) Inventors: Kelly Brian Cameron, Irvine, CA (US); Ba-Zhong Shen, Irvine, CA (US); Hau Thien Tran, Irvine, CA (US); Christopher R. Jones, Los Angeles, CA (US); Thomas A. Hughes, Jr., Dana Point, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/728,519

(22) Filed: Mar. 26, 2007

(65) Prior Publication Data

US 2008/0043878 A1 Feb. 21, 2008

(51) Int. Cl.
 *H04L 27/36* (2006.01)
(52) U.S. Cl. ............... 375/298; 375/262; 375/265; 375/341; 375/295; 714/701; 714/746; 714/755
(58) Field of Classification Search ............... 375/298, 375/295, 341, 262, 265; 714/746, 701, 755
 See application file for complete search history.

(56) References Cited

U.S. PATENT DOCUMENTS 6,023,783 A * 2/2000 Divsalar et al. ............ 714/792
6,427,214 B1 * 7/2002 Li et al. .................... 714/701
6,789,218 B1 * 9/2004 Edmonston et al. ........ 714/701

* cited by examiner

*Primary Examiner*—Ted Wang
(74) *Attorney, Agent, or Firm*—Garlick Harrison & Markison; Shayne X. Short

(57) ABSTRACT

A method for parallel concatenated (Turbo) encoding and decoding. Turbo encoders receive a sequence of input data tuples and encode them. The input sequence may correspond to a sequence of an original data source, or to an already coded data sequence such as provided by a Reed-Solomon encoder. A turbo encoder generally comprises two or more encoders separated by one or more interleavers. The input data tuples may be interleaved using a modulo scheme in which the interleaving is according to some method (such as block or random interleaving) with the added stipulation that the input tuples may be interleaved only to interleaved positions having the same modulo-N (where N is an integer) as they have in the input data sequence. If all the input tuples are encoded by all encoders then output tuples can be chosen sequentially from the encoders and no tuples will be missed. If the input tuples comprise multiple bits, the bits may be interleaved independently to interleaved positions having the same modulo-N and the same bit position. This may improve the robustness of the code. A first encoder may have no interleaver or all encoders may have interleavers, whether the input tuple bits are interleaved independently or not. Modulo type interleaving also allows decoding in parallel.

20 Claims, 61 Drawing Sheets rate 2/3 feedforward encoder

Fig. 5 rate 2/3 feedforward encoder rate 2/3 basic constituent encoder

Fig. 14B table 7

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| seq. #1 | 1 | | | | 2 | | | | 5 | | | | 0 | | | | 4 | | | | 3 | | | |
| seq. #2 | | 3 | | | | 0 | | | | 1 | | | | 5 | | | | 4 | | | | 2 | | |
| seq. #3 | | | 4 | | | | 3 | | | | 0 | | | | 5 | | | | 1 | | | | 2 | |
| seq. #4 | | | | 2 | | | | 4 | | | | 5 | | | | 1 | | | | 0 | | | | 3 |
| seq. 1-2-3-4 | 1 | 3 | 4 | 2 | 2 | 0 | 3 | 4 | 5 | 1 | 0 | 5 | 0 | 5 | 5 | 1 | 4 | 4 | 1 | 0 | 3 | 2 | 2 | 3 | table 8

| position | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| seq. 1-2-3-4 | 1 | 3 | 4 | 2 | 2 | 0 | 3 | 4 | 5 | 1 | 0 | 5 | 0 | 5 | 5 | 1 | 4 | 4 | 1 | 0 | 3 | 2 | 2 | 3 |
| X4 (mod) | 4 | 12 | 16 | 8 | 8 | 0 | 12 | 16 | 20 | 4 | 0 | 20 | 0 | 20 | 20 | 4 | 16 | 16 | 4 | 0 | 12 | 8 | 8 | 12 |
| +mod 4 (position) | 0 | 1 | 2 | 3 | 0 | 1 | 2 | 3 | 0 | 1 | 2 | 3 | 0 | 1 | 2 | 3 | 0 | 1 | 2 | 3 | 0 | 1 | 2 | 3 |
| seq. #8 | 4 | 13 | 18 | 11 | 8 | 1 | 14 | 19 | 20 | 5 | 2 | 23 | 0 | 21 | 22 | 7 | 16 | 17 | 6 | 3 | 12 | 9 | 10 | 15 |

Fig. 14C rate 2/3 encoder rate 1/2 encoder rate 3/4 encoder

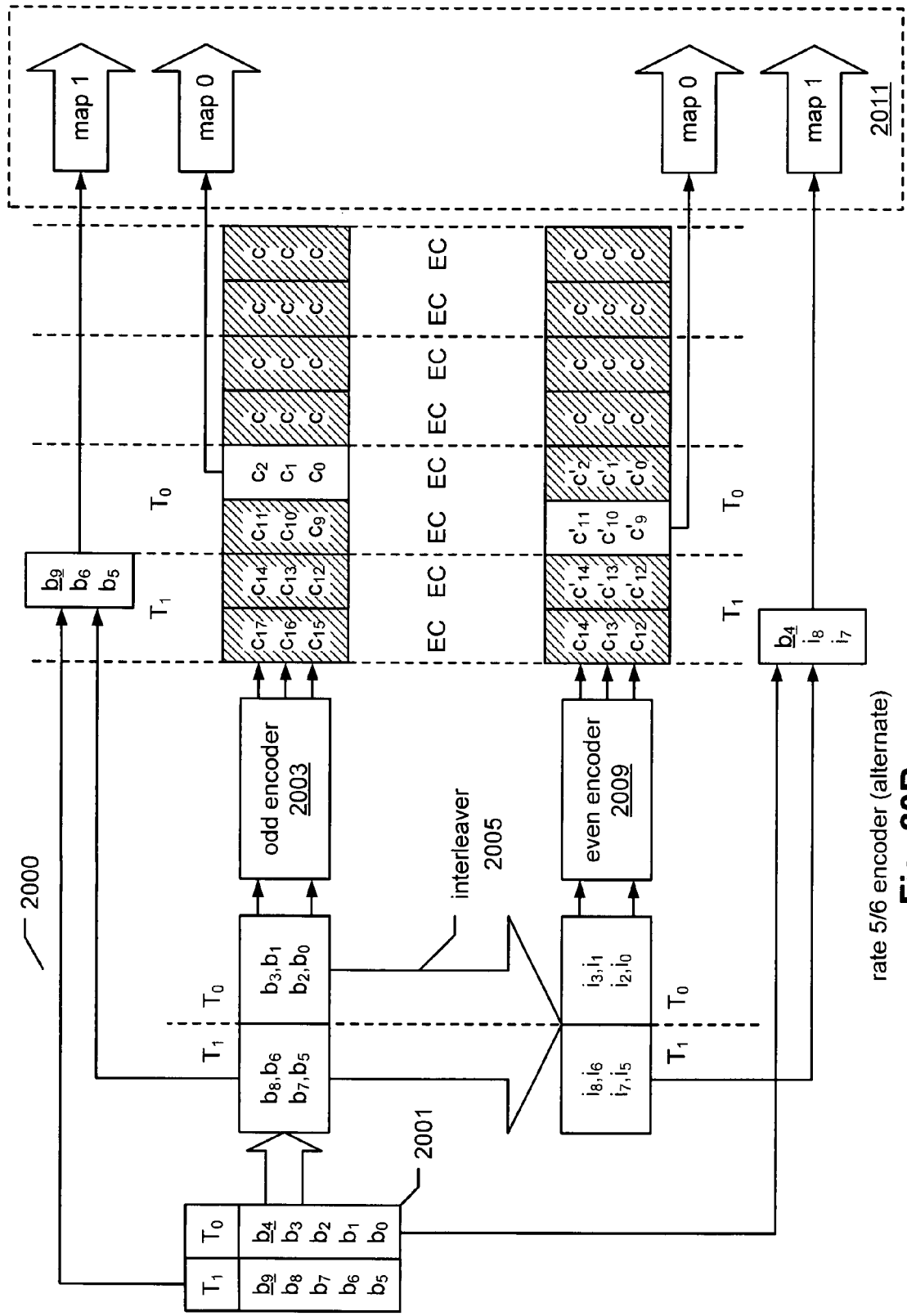
Fig. 20B rate 5/6 encoder (alternate)

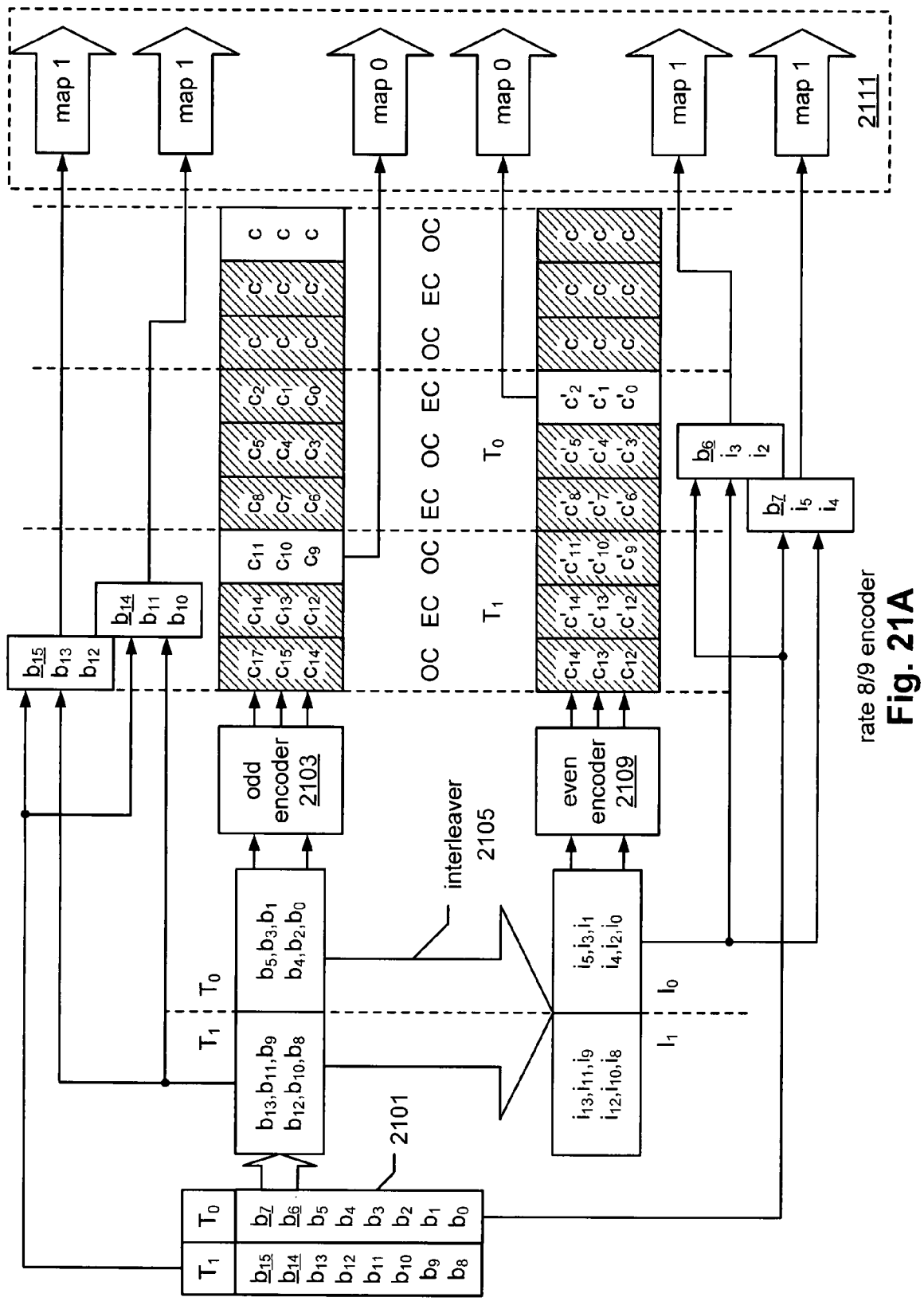
Fig. 21A rate 8/9 encoder min* circuit (or min* processing functional block)

| Δ[2:0] | log saturation (5113 out) |
|---|---|
| 1.75 | 0.5 |
| 1.50 | 0.5 |
| 1.25 | 0 |
| 1.00 | 0 |
| 0.75 | 0 |
| 0.50 | 0 |
| 0.25 | 0 |
| 0.00 | 0 |
| -0.25 | 0 |
| -0.50 | 0 |
| -0.75 | 0 |
| -1.00 | 0 |
| -1.25 | 0 |
| -1.50 | 0.5 |
| -1.75 | 0.5 |
| -2.00 | 0.5 | alpha/beta (α/β) min* table
(used by log saturation circuit 5113 of Fig. 51)

Fig. 51A

| delta[9:0] or Δ[9:0] | 9 | 8 | 7 | 6 | 5 | 4 | 3 | 2 | 1 | 0 | |
|---|---|---|---|---|---|---|---|---|---|---|---|
| 127.75 | 0 | 1 | 1 | 1 | 1 | 1 | 1 | 1 | 1 | 1 | ⎫ ln_out=1 range #1 |
| ... | | | | | | | | | | | |
| 2.25 | 0 | 0 | 0 | 0 | 0 | 0 | 1 | 0 | 0 | 1 | |
| 2.00 | 0 | 0 | 0 | 0 | 0 | 0 | 1 | 0 | 0 | 0 | |
| 1.75 | 0 | 0 | 0 | 0 | 0 | 0 | 0 | 1 | 1 | 1 | |
| 1.50 | 0 | 0 | 0 | 0 | 0 | 0 | 0 | 1 | 1 | 0 | |
| 1.25 | 0 | 0 | 0 | 0 | 0 | 0 | 0 | 1 | 0 | 1 | ⎫ ln_out=0 range #2 |
| 1.00 | 0 | 0 | 0 | 0 | 0 | 0 | 0 | 1 | 0 | 0 | |
| 0.75 | 0 | 0 | 0 | 0 | 0 | 0 | 0 | 0 | 1 | 1 | |
| 0.50 | 0 | 0 | 0 | 0 | 0 | 0 | 0 | 0 | 1 | 0 | |
| 0.25 | 0 | 0 | 0 | 0 | 0 | 0 | 0 | 0 | 0 | 1 | |
| 0.00 | 0 | 0 | 0 | 0 | 0 | 0 | 0 | 0 | 0 | 0 | |
| -0.25 | 1 | 1 | 1 | 1 | 1 | 1 | 1 | 1 | 1 | 1 | ⎫ ln_out=0 range #3 |
| -0.50 | 1 | 1 | 1 | 1 | 1 | 1 | 1 | 1 | 1 | 0 | |
| -0.75 | 1 | 1 | 1 | 1 | 1 | 1 | 1 | 1 | 0 | 1 | |
| -1.00 | 1 | 1 | 1 | 1 | 1 | 1 | 1 | 1 | 0 | 0 | |
| -1.25 | 1 | 1 | 1 | 1 | 1 | 1 | 1 | 0 | 1 | 1 | |
| -1.50 | 1 | 1 | 1 | 1 | 1 | 1 | 1 | 0 | 1 | 0 | ⎫ ln_out=1 range #4 |
| -1.75 | 1 | 1 | 1 | 1 | 1 | 1 | 1 | 0 | 0 | 1 | |
| -2.00 | 1 | 1 | 1 | 1 | 1 | 1 | 1 | 0 | 0 | 0 | |
| -2.25 | 1 | 1 | 1 | 1 | 1 | 1 | 0 | 1 | 1 | 1 | |
| -2.50 | 1 | 1 | 1 | 1 | 1 | 1 | 0 | 1 | 1 | 0 | |
| ... | | | | | | | | | | | |
| -128.00 | 1 | 0 | 0 | 0 | 0 | 0 | 0 | 0 | 0 | 0 | | delta[8:3] or Δ[8:3]  delta[3] or Δ[3]  delta[2:0] or Δ[2:0]

Fig. 51B simplified version of Table of Fig. 51A

PARALLEL CONCATENATED CODE WITH SOFT-IN SOFT-OUT INTERACTIVE TURBO DECODER

CROSS REFERENCE TO RELATED PATENTS/PATENT APPLICATIONS

The present U.S. Utility Patent Application claims priority pursuant to 35 U.S.C. § 120, as a division, to the following U.S. Utility Patent Application which is hereby incorporated herein by reference in its entirety and made part of the present U.S. Utility Patent Application for all purposes:

1. U.S. Utility application Ser. No. 09/878,148, entitled "Parallel concatenated code with soft-in soft-out interactive turbo decoder," filed Jun. 8, 2001 (Jun. 8, 2001), pending, which claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Patent Application Ser. No. 60/232,053, entitled "Turbo trellis encoder and decoder," filed Sep. 12, 2000 (Sep. 12, 2000).

2. U.S. Provisional Patent Application Ser. No. 60/232,288, entitled "Parallel concatenated code with SISO interactive turbo decoder," filed Sep. 12, 2000 (Sep. 12, 2000).

BACKGROUND OF THE INVENTION

1. Technical Field of the Invention

The invention relates to methods, apparatus, and signals used in channel coding and decoding, and, in particular embodiments to methods, apparatus and signals for use with turbo and turbo-trellis encoding and decoding for communication channels.

2. Description of Related Art

A significant amount of interest has recently been paid to channel coding. For example a recent authoritative text states:

"Channel coding refers to the class of signal transformations designed to improve communications performance by enabling the transmitted signals to better withstand the effects of various channel impairments, such as noise, interference, and fading. These signal-processing techniques can be thought of as vehicles for accomplishing desirable system trade-offs (e.g., error-performance versus bandwidth, power versus bandwidth). Why do you suppose channel coding has become such a popular way to bring about these beneficial effects? The use of large-scale integrated circuits (LSI) and high-speed digital signal processing (DSP) techniques have made it possible to provide as much as 10 dB performance improvement through these methods, at much less cost than through the use of most other methods such as higher power transmitters or larger antennas."

From "Digital Communications" Fundamentals and Applications Second Edition by Bernard Sklar, page 305 © 2001 Prentice Hall PTR.

Stated differently, improved coding techniques may provide systems that can operate at lower power or may be used to provide higher data rates.

Conventions and Definitions:

Particular aspects of the invention disclosed herein depend upon and are sensitive to the sequence and ordering of data. To improve the clarity of this disclosure the following convention is adopted. Usually, items are listed in the order that they appear. Items listed as #1, #2, #3 are expected to appear in the order #1, #2, #3 listed, in agreement with the way they are read, i.e. from left to right. However, in engineering drawings, it is common to show a sequence being presented to a block of circuitry, with the right most tuple representing the earliest sequence, as shown in FIG. 2, where 207 is the earliest tuple, followed by tuple 209. The IEEE Standard Dictionary of Electrical and Electronics Terms, Sixth Edition, defines tuple as a suffix meaning an ordered set of terms (sequence) as in N-tuple. A tuple as used herein is merely a grouping of bits having a relationship to each other.

Herein, the convention is adopted that items, such as tuples will be written in the same convention as the drawings. That is in the order that they sequentially proceed in a circuit. For example, "Tuples 207 and 209 are accepted by block 109" means tuple 207 is accepted first and then 209 is accepted, as is seen in FIG. 2. In other words the text will reflect the sequence implied by the drawings. Therefore a description of FIG. 2 would say "tuples 207 and 209 are provided to block 109" meaning that tuple 207 is provided to block 109 before tuple 209 is provided to block 109.

Herein an interleaver is defined as a device having an input and an output. The input accepting data tuples and the output providing data tuples having the same component bits as the input tuples, except for order.

An integral tuple (IT) interleaver is defined as an interleaver that reorders tuples that have been presented at the input, but does not separate the component bits of the input tuples. That is the tuples remain as integral units and adjacent bits in an input tuple will remain adjacent, even though the tuple has been relocated. The tuples, which are output from an IT interleaver are the same as the tuples input to interleaver, except for order. Hereinafter when the term interleaver is used, an IT interleaver will be meant.

A separable tuple (ST) interleaver is defined as an interleaver that reorders the tuples input to it in the same manner as an IT interleaver, except that the bits in the input tuples are interleaved independently, so that bits that are adjacent to each other in an input tuple are interleaved separately and are interleaved into different output tuples. Each bit of an input tuple, when interleaved in an ST interleaver, will typically be found in a different tuple than the other bits of the input tuple from where it came. Although the input bits are interleaved separately in an ST interleaver, they are generally interleaved into the same position within the output tuple as they occupied within the input tuple. So for example, if an input tuple comprising two bits, a most significant bit and a least significant bit, is input into an ST interleaver the most significant bit will be interleaved into the most significant bit position in a first output tuple and the least significant bit will be interleaved into the least significant bit position in a second output tuple.

Modulo-N sequence designation is a term meaning the modulo-N of the position of an element in a sequence. If there are k item $s^{(1)}$ in a sequence then the items have ordinal numbers 0 to k−1, i.e. $I_0$ through $I_{(k-1)}$ representing the position of each time in the sequence. The first item in the sequence occupies position 0, the second item in a sequence $I_1$ occupies position 1, the third item in the sequence $I_2$ occupies position 2 and so forth up to item $I_{k-1}$, which occupies the k'th or last position in the sequence. The modulo-N sequence designation is equal to the position of the item in the sequence modulo-N. For example, the modulo-2 sequence designation of $I_0$=0, the modulo-2 sequence designation of $I_1$=1, and the modulo-2 sequence designation of $I_2$=0 and so forth.

A modulo-N interleaver is defined as an interleaver wherein the interleaving function depends on the modulo-N value of the tuple input to the interleaver. Modulo interleavers are further defined and illustrated herein.

A modulo-N encoding system is one that employs one or more modulo interleavers.

BRIEF SUMMARY OF THE INVENTION

In one aspect of the invention, the disclosure illustrates the use of a nonsystematic component code in a parallel concatenated (turbo) encoding.

In another aspect of the invention, the disclosure illustrates the use of modulo encoding in which binary N-tuples (groups of N bits) are interleaved to positions depending on the modulo value of their sequential location (modulo position) in an input data stream.

In yet another aspect of the invention, methods of creating modulo interleavers from a seed sequence are disclosed.

In yet another illustrative aspect of the invention, modulo interleaving is used in turbo-trellis coded modulation (TTCM) encoders.

In another aspect of the invention, non-traditional constellation mapping is used with TTCM encoders.

In a further aspect of the invention, modulo encoding techniques are used to enable a parallel decoding of properly encoded signals at whatever degree of parallelism is desired.

BRIEF DESCRIPTION OF THE SEVERAL VIEWS OF THE DRAWINGS

The features, aspects, and advantages of the present invention which have been described in the above summary will be better understood with regard to the following description, appended claims, and accompanying drawings where:

FIG. 14B is a graphical illustration of a process by which modulo-2 and modulo-3 interleaving sequences may be generated.

FIG. 14C is a graphical illustration of a process by which a modulo-4 interleaving sequence may be generated.

FIG. 20B is a graphical illustration which represents an alternate encoding that will yield the same coding rate as FIG. 20A.

FIG. 21A is a graphical illustration of a rate 8/9 TTCM encoder, with constituent 2/3 rate encoders, according to an embodiment of the invention.

FIG. 51A is a graphical illustration of the table used by the log saturation block of FIG. 51.

FIG. 51B is a graphical illustration of a simplified version of the table of FIG. 51A.

DETAILED DESCRIPTION OF THE INVENTION

Figure 1:
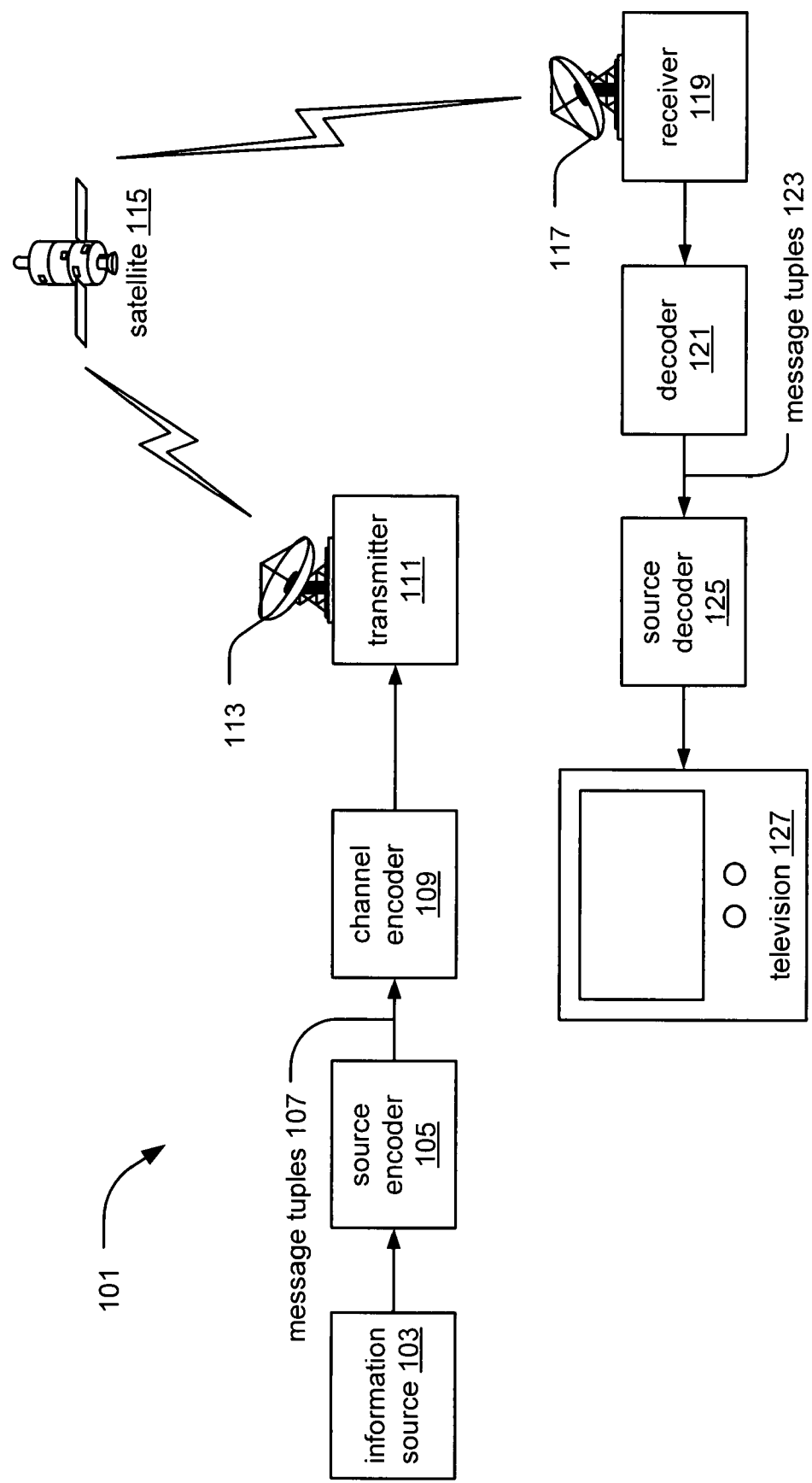
FIG. 1 is a graphical illustration of an environment in which embodiments of the present invention may operate.

FIG. 1 is a graphic illustration of an environment in which embodiments of the present invention may operate. The environment illustrated at 101 is an information distribution system, such as may be found in a cable television distribution system.

In FIG. 1 data is provided to the system from an information source 103. For purposes of illustration, the information source displayed in FIG. 1 may be considered to be a cable television system head end which provides video data to end users. A formatter 105 accepts data from the information source 103. The data provided by information source 103 may comprise analog or digital signals such as (but not limited to) video signals, audio signals, and data signals. The formatter block 105 accepts the data from the information source and formats it into an appropriate form, such as message tuples, which are illustrated at 107. The formatted data is then provided to a channel encoder 109. Channel encoder 109 encodes that data provided to it. In some embodiments of the present invention, the channel encoder 109 may provide an encoding, with different goals depending on the particular implementation, for example to make the signal more robust, to reduce the error probability, to operate the system using less transmission power or to enable a more efficient decoding of the signal. Channel encoder 109 then provides the encoded data to a transmitter 111. The transmitter transmits the encoded data provided to it by the channel encoder 109, for example, using an antenna 113. The signal broadcast from antenna 113 is received by a relay satellite 115 and then rebroadcast to a receiving terrestrial antenna, such as earth station antenna 117. Earth station antenna 117 collects the satellite signal and provides the collected signal to a receiver 119. The receiver 119 will amplify and demodulate/detect the signal as appropriate and provide the detected signal to a decoder 121. Decoder 121 will essentially, reverse the process of the channel encoder 109 and recreate the message tuples 123, which should represent a good estimate of the message tuples 107 that had been broadcast. The decoder 121 may use Forward Error Correction (FEC), in order to correct errors in the received signal. The tuples 123 provided by the decoder are then provided to a formatting unit 125, which prepares the received message tuples for use by an information sink, such as the television display illustrated at 127.

Figure 2:
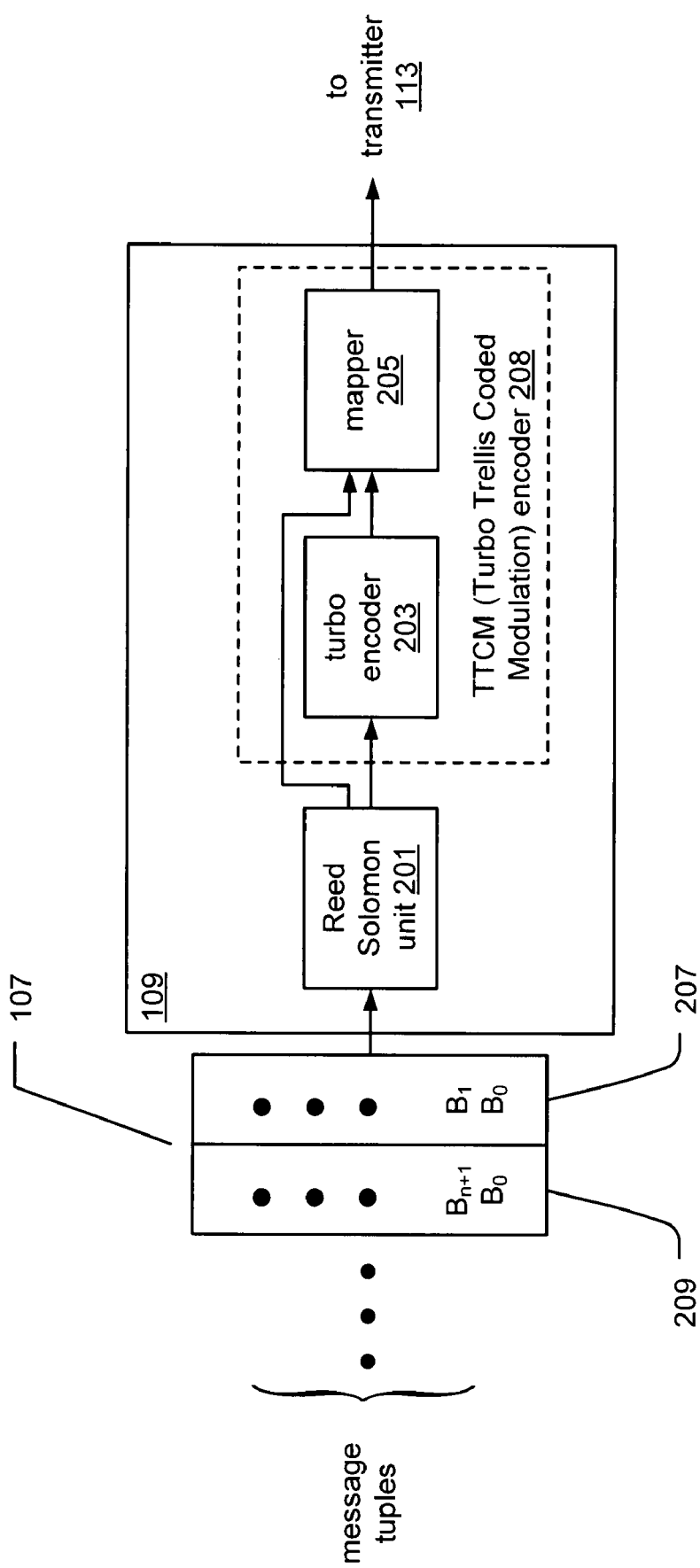
FIG. 2 is a block diagram of a portion of a signal encoder according to an embodiment of the invention.

FIG. 2 is a block diagram of a portion of a signal encoder according to an embodiment of the invention. In FIG. 2 message tuples 107 are provided to channel encoder 109. Channel encoder 109 comprises a Reed-Solomon unit 201, which provides a first encoding of the message tuples 107. The output of the Reed-Solomon (RS) unit 201 which includes a RS encoder and may include an interleaver and may include an interleaver, is then provided a turbo trellis-coded modulation (TTCM) encoder 208. The output of the Reed-Solomon unit 201 is then provided to a turbo encoder 203, which applies a parallel concatenated (turbo) encoding to the input received from the Reed-Solomon unit 201, and further provides it to a mapper 205. In addition, some of the bits of the data output from the Reed-Solomon unit 201 may bypass the turbo encoder 203 entirely and be coupled directly into the mapper 205. Such data bits which bypass the turbo encoder 203 are commonly referred to as uncoded bits. The uncoded bits are taken into account in the mapper 205 but are never actually encoded in the turbo encoder 203. In some embodiments of the invention there are no uncoded bits. In other embodiments of the invention there may be several uncoded bits depending on the data rate of the overall turbo trellis-coded modulation (TTCM) encoder desired. The output of the Reed-Solomon unit 201 may vary in form depending on the overall rate desired from the TTCM encoder 208. Turbo encoders, such as that illustrated at 203, may have a variety of forms and classifications. One of the classifications of encoders in general and turbo encoders in particular is illustrated in FIG. 3.

Figure 3:
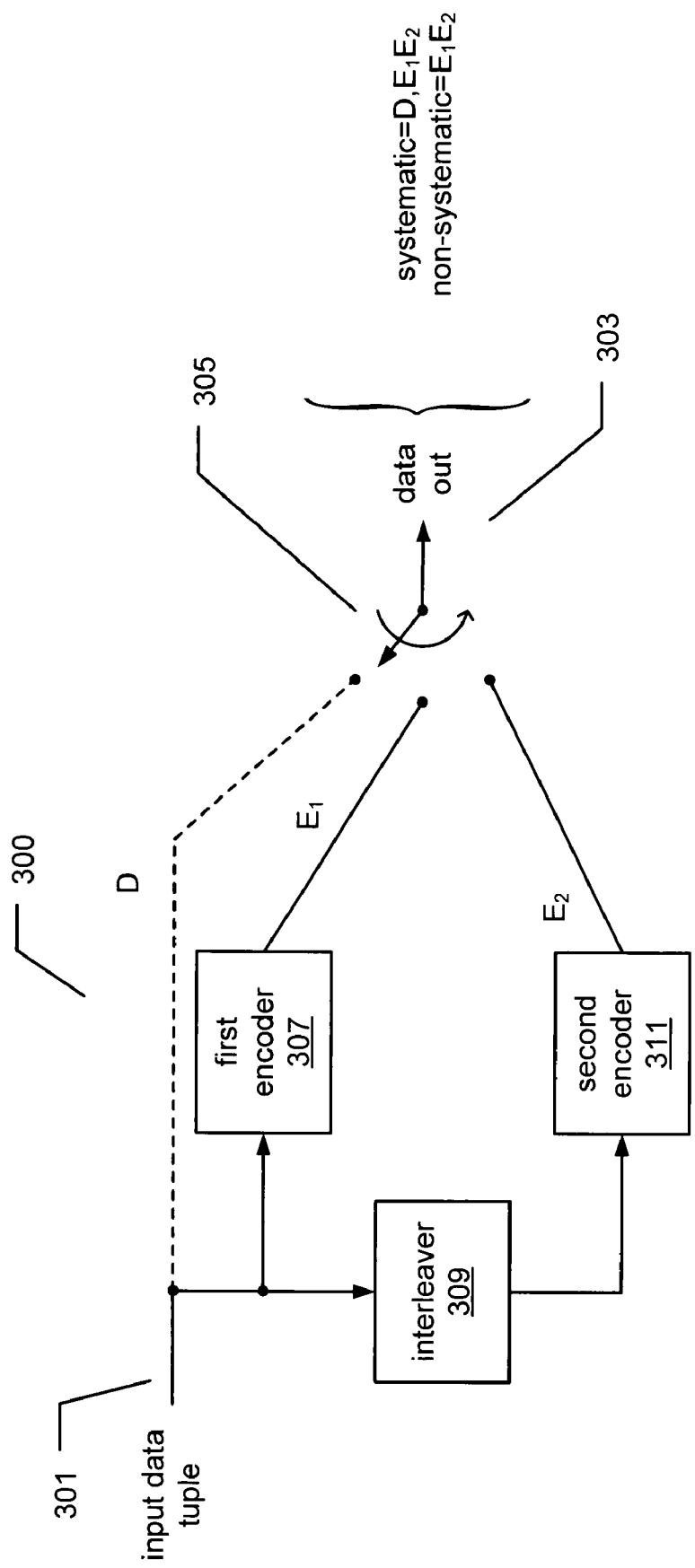
FIG. 3 is a block diagram of a parallel concatenated (turbo) encoder, illustrating the difference between systematic and nonsystematic forms.

FIG. 3 is a block diagram of a parallel concatenated encoder illustrating the difference between systematic and nonsystematic forms. In FIG. 3 data is input into the circuit at 301. Data is output from the parallel concatenated encoder (PCE) circuit 300 at 303. The data output 303 of the PCE illustrated at 300 may reach the output via three different paths. Input data tuples (groups of one or more bits) may be received at 301 and coupled directly to the data output 303 through selector mechanism 305 along the path labeled D. The data input may also be coupled into a first encoder 307 where it will be encoded and then coupled along the path $E_1$ through selector 305 and into data output 303. The data accepted into the PCE circuit at 301 may also be provided to an interleaver 309. Interleaver 309 rearranges the input sequence of the data accepted by the PCE circuit at 301. In other words, the interleaver shuffles the order of the data so that the data out of the interleaver 309 is not the same order as the data into the interleaver 309. The data out of the interleaver 309 is then provided to a second encoder 311. The second encoder 311 encodes the data provided to it by the interleaver 309 and then provides the encoded data along path $E_2$ through the selector 305 into the data output 303. If the selector 305 selects the data from path D and $E_1$ and $E_2$, where D represents all of the input data tuple, then a systematic-type turbo encoding is performed. However, if the data selector selects only between path $E_1$ and $E_2$, such that there is no direct path between the data input and data output, a nonsystematic turbo encoding is performed. In general the data input at 301 comprises input data tuples which are to be encoded. The data output at 303 comprises code words, which are the encoded representation of the input data tuples. In general, in a systematic type of encoding, the input tuples are used as part of the output code words to which they correspond. Within parallel concatenated encoders, such as that illustrated at 300, encoders such as the first encoder 307 and second encoder 311 are commonly referred to as component or constituent encoders because they provide encoding, which are used as components of the overall turbo encoding. The first encoder 307 and the second encoder 311 may also have a variety of forms and may be of a variety of types. For example, the first encoder 307 may be a block encoder or a convolutional-type encoder. Additionally, the second encoder 311 may also be a block or convolutional-type encoder. The first and second encoders themselves may also be of systematic or nonsystematic form. The types of encoders may be mixed and matched so that, for example, the first encoder 307 may comprise a nonsystematic encoder and second encoder 311 may comprise a systematic-type encoder.

Constituent encoders, such as first encoder 307 and second encoder 311 may have delays incorporated within them. The delays within the encoders may be multiple clock period delays so that the data input to the encoder is operated on for several encoder clock cycles before the corresponding encoding appears at the output of the encoder.

Figure 4:
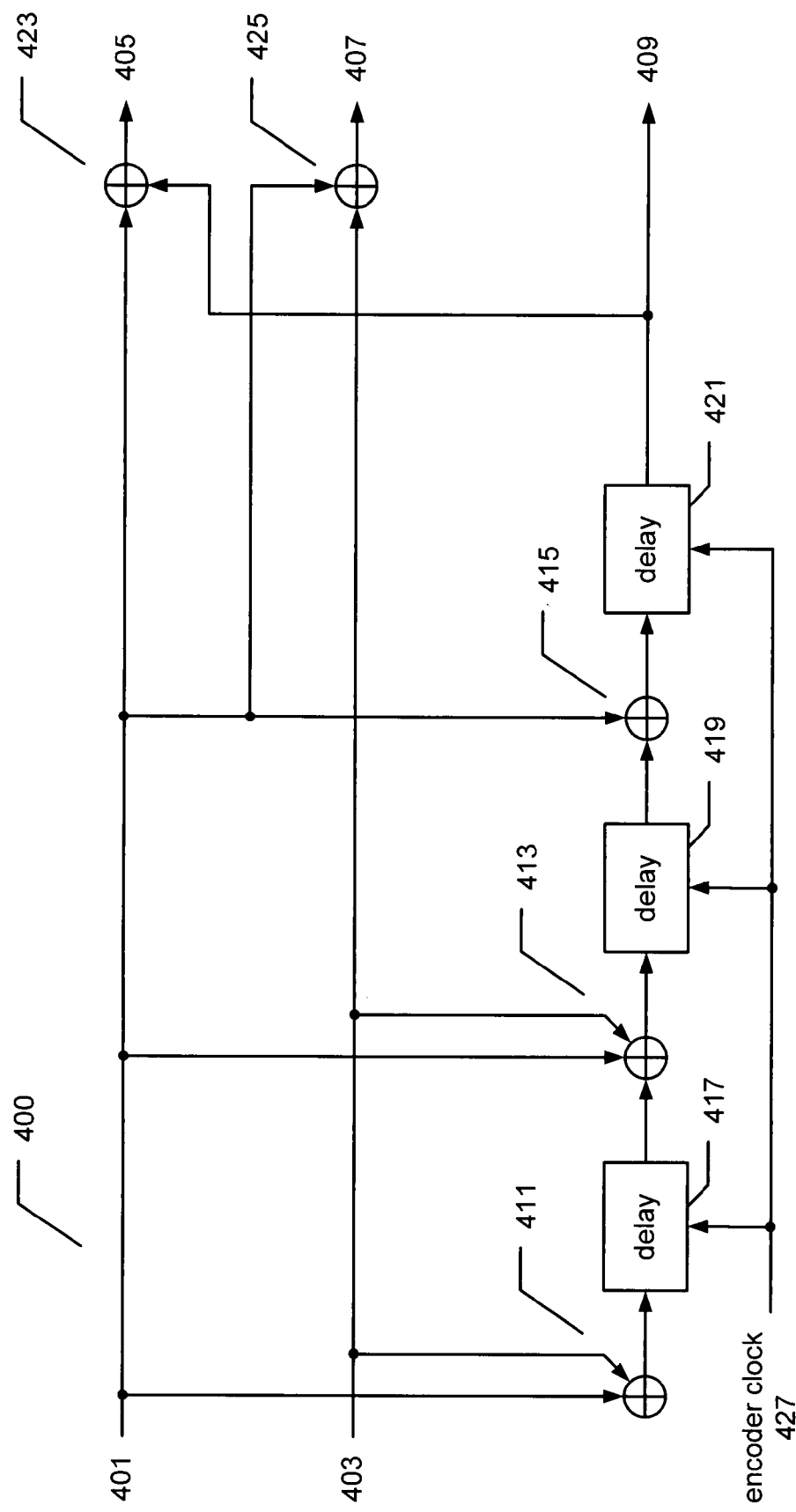
FIG. 4 is a schematic diagram of a rate 2/3 "feed forward" convolutional nonsystematic encoder.

One of the forms of a constituent encoder is illustrated in FIG. 4.

FIG. 4 is a schematic diagram of a rate two-thirds feed forward nonsystematic convolutional encoder. The encoder illustrated at 400 in FIG. 4 is a rate two-thirds because there are two inputs 401 and 403 and three outputs 405, 407 and 409. Accordingly, for each input tuple comprising two input bits 401 and 403, which are accepted by the encoder 400, the output is a code word having three bits 405, 407 and 409. Therefore, for each two bits input at inputs 401 and 403 three bits are output at 405, 407 and 409. The encoder of FIG. 4 comprises three delays 417, 419 and 421. Such delays may be formed from D-type flip flops or any other suitable delay or storage element. The rate two-thirds feed forward encoder of FIG. 4 also comprises five modulo-2 adders 411, 413, 415, 423 and 425. Modulo-2 adders are adders in which the outputs of the modulo-2 adder is equal to the modulo-2 sum of the inputs. Delay elements 417, 419 and 421 are clocked by an encoder clock. Modulo-2 adders 411, 413, 415, 423 and 425 are combinational circuits which are unclocked. In combinational circuits the output appears a time delay after the inputs are changed. This time delay is due to the propagation time of the signal within the combinational circuits (this delay is assumed as a near zero delay herein) and not due to any clocking mechanisms. In contrast, a delay unit, such as 417, will not change its output until it receives an appropriate clock signal. Therefore, for an input signal to propagate, for example from input 403 through modulo-2 adder 411, through delay 417, through modulo-2 adder 413, through delay 419, through modulo-2 adder 415, through delay 421 in order to appear at output 409, the encoder clock 427 must first clock the input signal from 403 through delay unit 417, then through delay unit 419, and finally through delay unit 421. Therefore, once an input signal appears at 403 three encoder clocks 427 in succession will be required for the resultant output 409, which is associated with that input at 403, to be seen at the output.

The encoder of FIG. 4 is a feed forward encoder. The signal is always fed forward and at no point in the circuit is there a path to feed back a signal from a later stage to an earlier stage. As a consequence a feed forward encoder, such as that illustrated in FIG. 4, is a finite impulse response (FIR) type of state machine. That is, for an impulse signal applied at the input, the output will eventually settle into a stable state.

The encoder illustrated in FIG. 4 may further be classified as a nonsystematic encoder because none of the inputs, that is either 401 or 403, appear at the output of the encoder. That is outputs 405, 407 or 409 don't reproduce the inputs in an encoded output associated with that input. This can be inferred from the fact that output 407, 405 and 409 have no direct connection to inputs 401 or 403.

Figure 5:
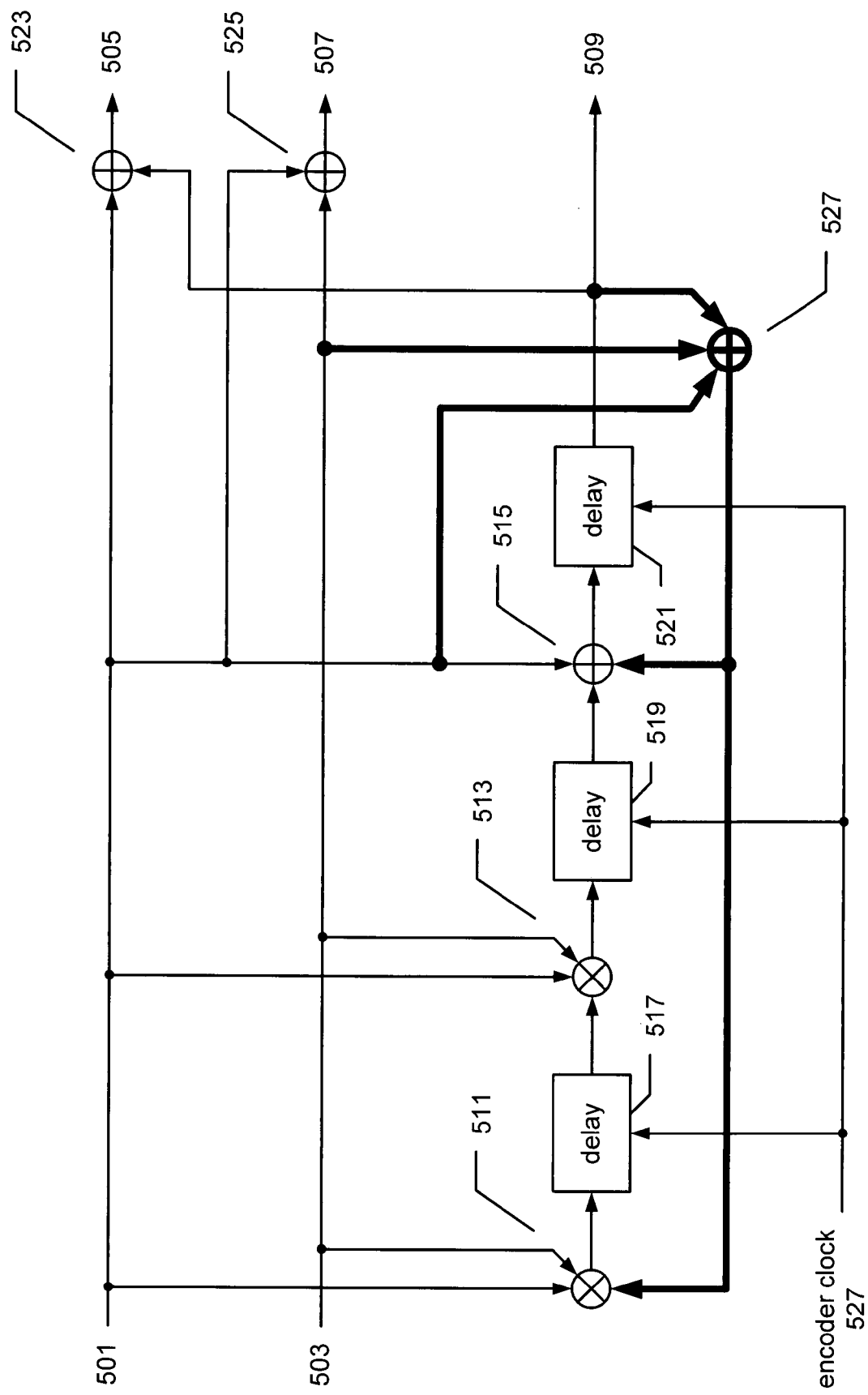
FIG. 5 is a schematic diagram of a rate 2/3 "recursive" convolutional nonsystematic encoder.

FIG. 5 is a schematic diagram of a rate two-thirds, recursive, convolutional nonsystematic encoder. The encoder of FIG. 5 is similar to the encoder of FIG. 4 in that both encoders are nonsystematic and convolutional. The encoder of FIG. 5 is the same schematically as the encoder of FIG. 4 with the addition of a third input at modulo-2 adder 511 and a third input at modulo-2 adder 515. The third input for each of modulo-2 adders 511 and 515 is formed by an additional modulo-2 adder 527. Modulo-2 adder 527 is formed in part by the output of delay 521. Modulo-2 adder 527 receives an input from delay 521 which is provided to modulo-2 adders 511 and 515. Accordingly the encoder of FIG. 5 is recursive. In other words, the inputs of delays 517 and 521 are partially formed from outputs occurring later in the signal path and fed back to an earlier stage in the circuit. Recursive encoders may exhibit outputs that change when repeatedly clocked even when the inputs are held constant. The encoder of FIG. 5 is a constituent encoder, and is used with an embodiment of the invention as will be described later.

Figure 6:
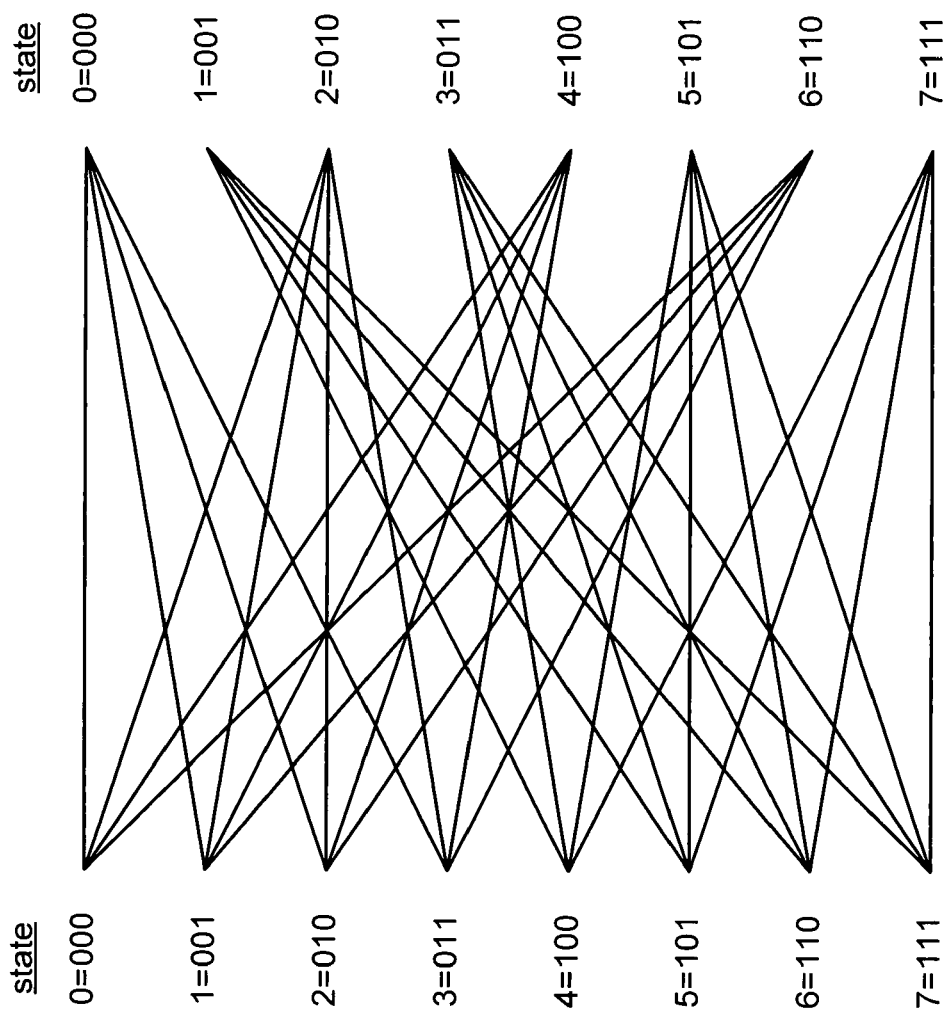
FIG. 6 is a trellis diagram of the convolutional encoder illustrated in FIG. 5.

FIG. 6 is a trellis diagram for the encoder illustrated in FIG. 5. A trellis diagram is a shorthand method of defining the behavior of a finite state machine such as the basic constituent encoder illustrated in FIG. 5. The state values in FIG. 6 represent the state of the encoder. As can be seen from the trellis diagram in FIG. 6, when the encoder of FIG. 5 is in any single state, it may transition to any one of four different states. It may transition to four different states because there are two inputs to the encoder of FIG. 5 resulting in four different possible input combinations which cause transitions. If there had been only one input to the encoder of FIG. 5, for example, if inputs 501 and 503 were connected, then each state in the trellis diagram would have two possible transitions. As illustrated in the trellis diagram in FIG. 6, if the encoder is in state 0, state 1, state 2 or state 3, the encoder may then transition into state 0, state 2, state 4 or state 6. However, if the encoder is in state 4, state 5, state 6 or state 7, it may transition into state 1, state 3, state 5, or state 7.

Figure 7:
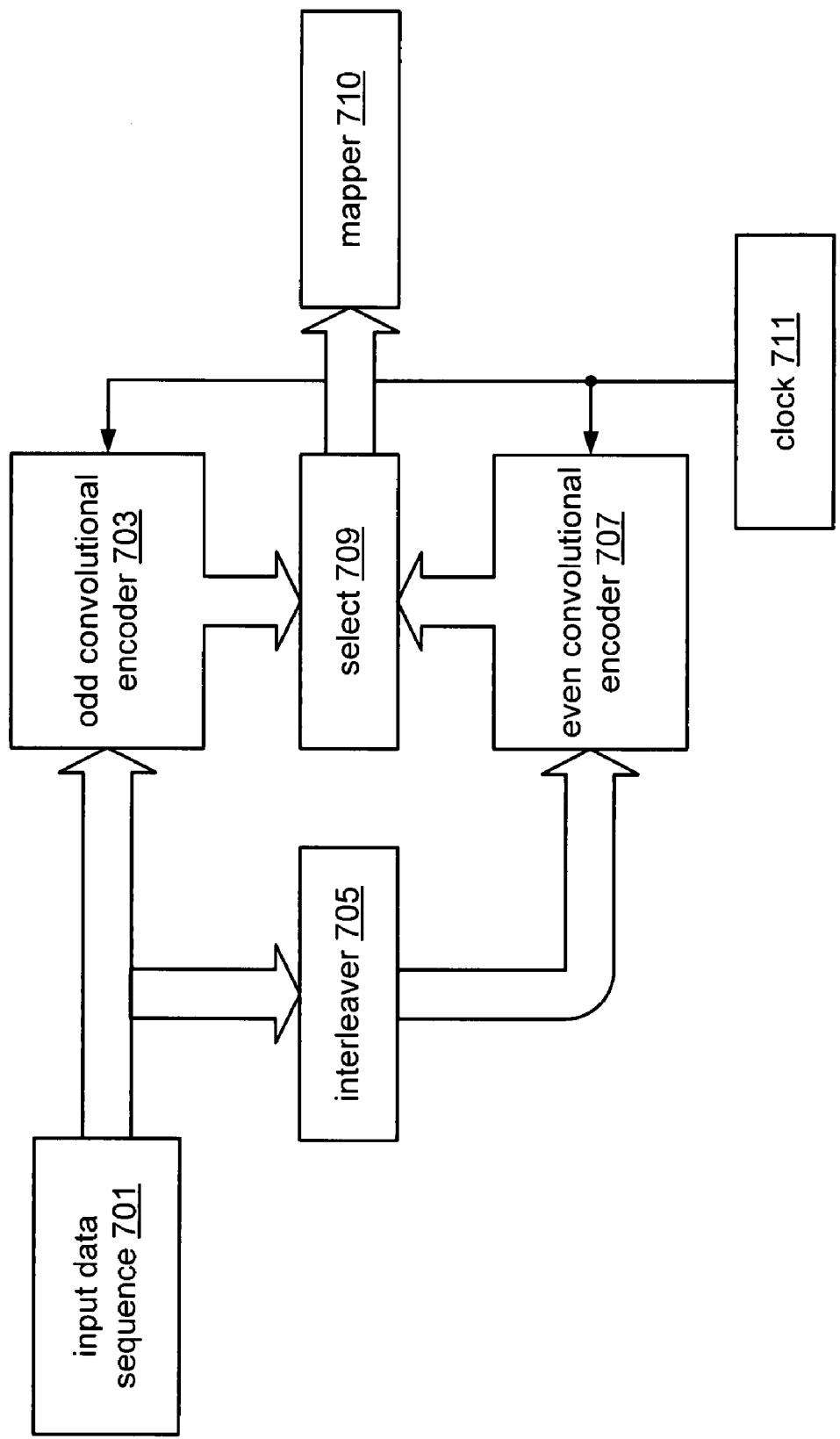
FIG. 7 is a block diagram of a turbo-trellis coded modulation (TTCM) encoder.

FIG. 7 is a block diagram of a turbo trellis-coded modulation (TTCM) encoder. In FIG. 7 an input data sequence 701 is provided to an "odd" convolutional encoder 703 and an interleaver 705. The interleaver 705 interleaves the input data sequence 701 and then provides the resulting interleaved sequence to "even" convolutional encoder 707. Encoders 703 and 707 are termed "odd" and "even" respectively because encodings corresponding to odd input tuples (i.e. input tuple no. 1, 3, 5, etc.) are selected by selector 709 from encoder 703 and encodings corresponding to even input tuples (i.e., input tuple no. 0, 2, 4, etc.) are selected by selector 709 from encoder 707. The output of either the odd convolutional encoder 703 or the even convolutional encoder 707 is selected by a selecting mechanism 709 and then passed to a mapper 710. FIG. 7 is a generalized diagram according to an embodiment of the invention which illustrates a general arrangement for a TTCM encoder. The odd convolutional encoder 703 receives the input data sequence and, in an embodiment of the invention, convolutionally, nonsystematically, encodes the input data sequence. Even convolutional encoder 707 receives the same input data as the odd convolutional encoder, except that the interleaver 705 has rearranged the order of the data. The odd and even convolutional encoders may be the same encoders, different encoders or even different types of encoders. For example, the odd convolutional encoder may be a nonsystematic encoder, whereas the even convolutional encoder may be a systematic encoder. In fact the convolutional encoders 703 and 707 may be replaced by block-type encoders such as Hamming encoders or other block-type encoders well known in the art. For the purposes of illustration, both constituent encoders 703 and 707 are depicted as nonsystematic, convolutional, recursive encoders as illustrated in FIG. 5. The select mechanism 709 selects, from convolutional encoder 703, outputs corresponding to odd tuples of the input data sequence 701. The select mechanism 709 selects, from convolutional encoder 707, outputs which correspond to even tuples of the input data sequence 701. Select mechanism 709 alternates in selecting symbols from the odd convolutional encoder 703 and the even convolutional encoder 707. The selector 709 provides the selected symbols to the mapper 710. The mapper 710 then maps the output of either the even convolutional encoder 707 or the odd convolutional coder 703 into a data constellation (not shown). In order to maintain a sequence made up of distance segments stemming from the even and odd input tuples, the selector 709 selects only encodings corresponding to even tuples of the input data sequence 701 from one encoder (e.g. 703), and selects only encoding corresponding to odd tuples of the input data sequence from the other encoder (e.g. 707). This can be accomplished by synchronizing the selection of encoded tuples from the odd (703) and even (707) encoders, for example using a clock 711, and by using an odd/even interleaver 705 to maintain an even/odd ordering of input data tuples to the even encoder 707. The odd/even interleaver 705 will be described in detail later.

The encoder illustrated in FIG. 7 is a type which will be known herein as a turbo trellis-coded modulation (TTCM) encoder. The interleaver 705, odd convolutional encoder 703, even convolutional encoder 707 and selector form a turbo encoder, also known as a parallel concatenated encoder (PCE). The encoder is known as a parallel concatenated encoder because two codings are carried on in parallel. For the parallel encoding, in the FIG. 7 example one coding takes place in the odd convolutional encoder 703, and the other takes place in the even convolutional encoder 707. An output is selected sequentially from each encoder and the outputs are concatenated to form the output data stream. The mapper 710 shown in FIG. 7 provides the trellis coded modulation (TCM) function. Hence, the addition of the mapper makes the encoder a turbo trellis-type encoder. As shown in FIG. 7, the encoders may have any number of bits in the input data tuple. It is the topology that defines the encoder-type.

The encoder of FIG. 7 is an illustration of only one of the possible configurations that may form embodiments of the present invention. For example, more than one interleaver may be employed, as shown in FIG. 8.

Figure 8A:
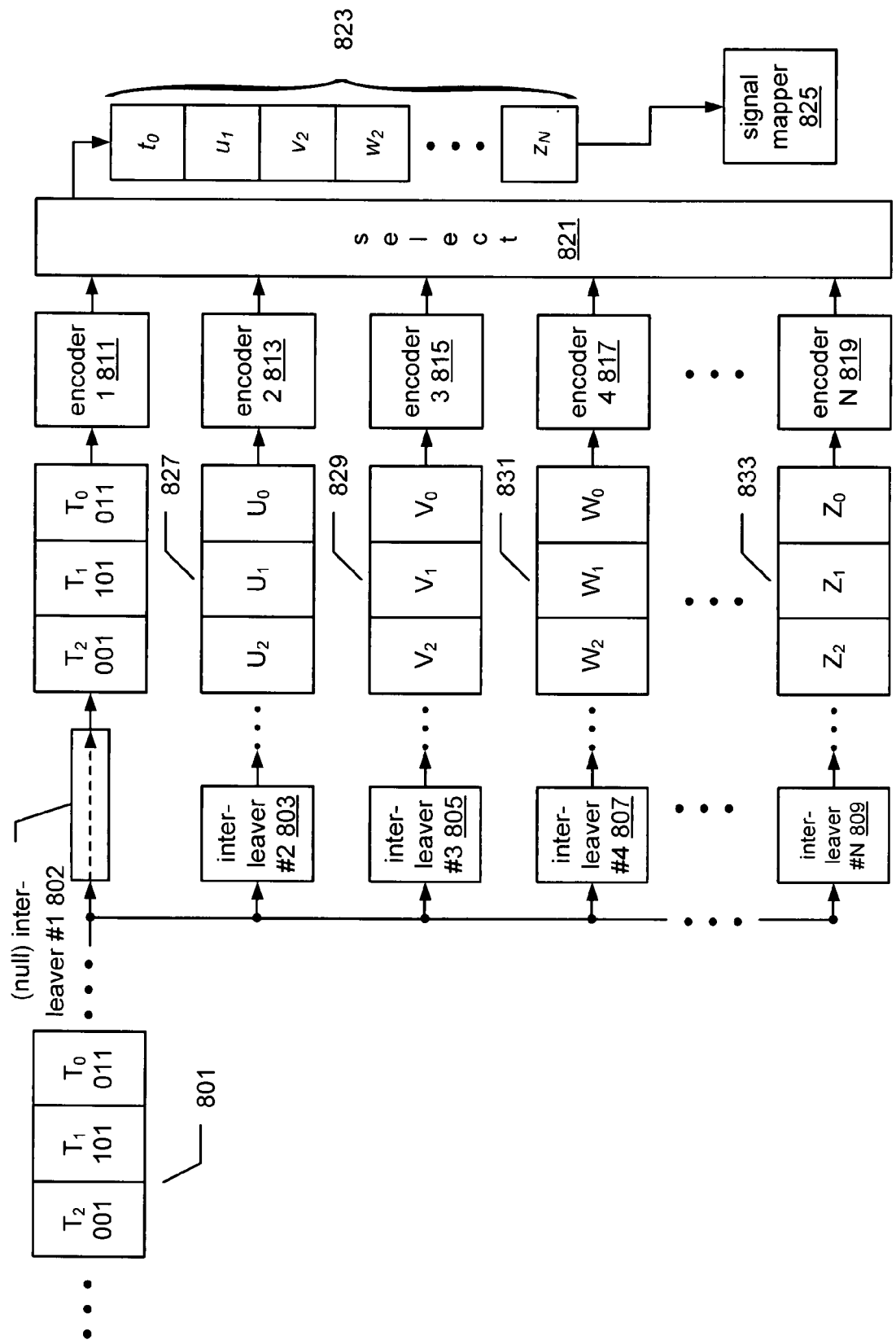
FIG. 8A is a block diagram of a TTCM encoder utilizing multiple interleavers.

FIG. 8A is a block diagram of a TTCM encoder using multiple interleavers. FIG. 8A illustrates an exemplary embodiment of the present invention utilizing N interleavers.

The first interleaver 802 is called the null interleaver or interleaver 1. Generally in embodiments of the invention the null interleaver will be as shown in FIG. 8A, that is a straight through connection, i.e. a null interleaver. All interleaving in a system will be with respect to the null sequence produced by the null interleaver. In the case where the null interleaver is merely a straight through connection the null sequence out of the- null interleaver will be the same as the input sequence. The concept of null interleaver is introduced as a matter of convenience, since embodiments of the invention may or may not have a first interleaver a convenient way to distinguish is to say "where the first interleaver is the null interleaver" when the first encoder receives input tuples directly and to say "where the first interleaver is an ST interleaver", when an ST interleaver occupies a position proximal to a first encoder.

In FIG. 8A source input tuples 801 are provided to encoder 811 and to interleavers 802 through 809. There are N interleavers counting the null interleaver as interleaver No. 1 and N encoders present in the illustration in FIG. 8A. Other embodiments may additionally add an ST interleaver as interleaver No. 1 to process input tuples 801 prior to providing them to encoder 811.

Source tuples $T_0$, $T_1$ and $T_2$ are shown as three bit tuples for illustrative purposes. However, those skilled in the art will know that embodiments of the invention can be realized with a varying number of input bits in the tuples provided to the encoders. The number of input bits and rates of encoders 811 through 819 are implementation details and may be varied according to implementation needs without departing from scope and spirit of the invention.

Interleavers 803 through 809 in FIG. 8A each receive the same source data symbols 801 and produce interleaved sequences 827 through 833. Interleaved sequences 827 through 833 are further coupled into encoders 813 through 819. Select mechanism 821 selects an encoded output from encoders 811 through 819. Selector 821 selects from each encoder 811 through 819 in sequence so that one encoded tuple is selected from each encoder in one of every N+1 selections. That is the selection number 0 (encoded tuple $t_0$) is chosen from encoder 811, the selection number 1 (encoded tuple $u_1$ is chosen from encoder 813, $V_2$ is chosen from encoder 815, and so forth. The same selection sequence is then repeated by selector 821.

In order not to miss any symbols, each interleaver is a modulo-type interleaver. To understand the meaning of the term modulo interleaver, one can consider the interleaver of FIG. 7 as a modulo-2 interleaver. The interleaver of FIG. 7 is considered a modulo-2 interleaver because input tuples provided to the interleaver during odd times (i.e. provided as input tuple 1, 3, 5 etc.) will be interleaved into odd time positions at the output of the interleaver (e.g. output tuple 77, 105, 321 etc.) That is the first tuple provided by an odd/even interleaver may be the third, fifth, seventh, etc. tuple provided from the interleaver, but not the second, fourth, sixth, etc. The result of any modulo-2 operation will either be a 0 or a 1, that is even or odd respectively, therefore the interleaver of FIG. 7 is termed a modulo-2 or odd/even interleaver. In general, according to embodiments of the invention, the value of N for a modulo-N interleaving system is equal to the number of interleavers counting the Null interleaver as the first interleaver in the case where there is no actual first interleaver. The modulo interleaving system of FIG. 8A is modulo-N because there are N interleaves, including null interleaver 1, interleaving system. The interleavers in a modulo interleaver system may interleave randomly, S randomly, using a block interleaver, or using any other mechanism for interleaving known in the art, with the additional restriction that input/output positional integrity be maintained. When a sequence of tuples is interleaved, the modulo position value of an output will be the same as the modulo positional value of the input tuple. The position of a tuple modulo-N is known as a sequence designation, modulo designation, or modulo sequence designation. For example, in a modulo-4 interleaver the first tuple provided to the interleaver occupies position 0 of the input tuple stream. Because 0 modulo-4 is zero the modulo sequence designation of the first input tuple is 0. The tuple occupying the position 0 may then be interleaved to a new output position #4, #8, #12, #16, etc., which also have the same modulo sequence designation, i.e. 0. The tuples occupying output position #4, #8, #12, #16 all have a sequence designation of 0 because 4 mod 4=8 mod 4=12 mod 4=16 mod 4=0. Similarly, the input tuple occupying position 2 and having sequence designation of 2 may be interleaved to a new output position #6, #10, #14, #18, etc, which also have the same modulo sequence designation of 2. The tuples in output positions #6, #10, #14, #18 etc have a modulo sequence designation of 2 because 6 mod 4=10 mod 4=14 mod 4=18 mod 4=2.

For example, in FIG. 7 the modulo-2 interleaver 705, also known as an odd/even interleaver, may employ any type of interleaving scheme desired with the one caveat that the input data sequence is interleaved so that each odd sequence input to the interleaver is interleaved into another odd sequence at the output of the interleaver. Therefore, although interleaver 705 may be a random interleaver, it cannot interleave the inputs randomly to any output. It can, however, interleave any odd input to any random odd output and interleave any even input into any random even interleaved output. In embodiments of the present invention, a modulo interleaving system, such as that illustrated in FIG. 8A, the interleavers must maintain the modulo positional integrity of interleaved tuples. For example, if there are 5 interleavers including the null interleaver (numbers 0-4) in FIG. 8A, then FIG. 8A would describe a modulo-5 interleaving system. In such a system, the input source data would be categorized by a modulo sequence number equal to the sequence position of the source data tuple modulo-5. Therefore, every input data tuple would have a sequence value assigned to it between 0 and 4 (modulo-5). In each of the 5 interleavers of the modulo-5 system, source data elements (characterized using modulo numbers) could be interleaved in any fashion, as long as they were interleaved into an output data tuple having an output sequence modulo number designation equal to the input sequence modulo number designation. The terms modulo sequence number sequence designation, modulo position value modulo designation, modulo position all refer to the same modulo ordering.

In other words an interleaver is a device that rearranges items in a sequence. The sequence is input in a certain order. An interleaver receives the items form the input sequence, I, in the order $I_0$, $I_1$, $I_2$, etc., $I_0$ being the first item received, $I_1$ being the second item received, item $I_2$ being the third item received. Performing a modulo-N operation on the subscript of I yields the modulo-N position value of each input item. For example, if N=2 modulo-N position $I_0=Mod_2(0)=0$ i.e. even, modulo-N position $I_1=Mod_2(1)=1$ i.e., odd, modulo-N position $I_2=Mod_2(2)=0$ i.e. even.

Figure 8B:
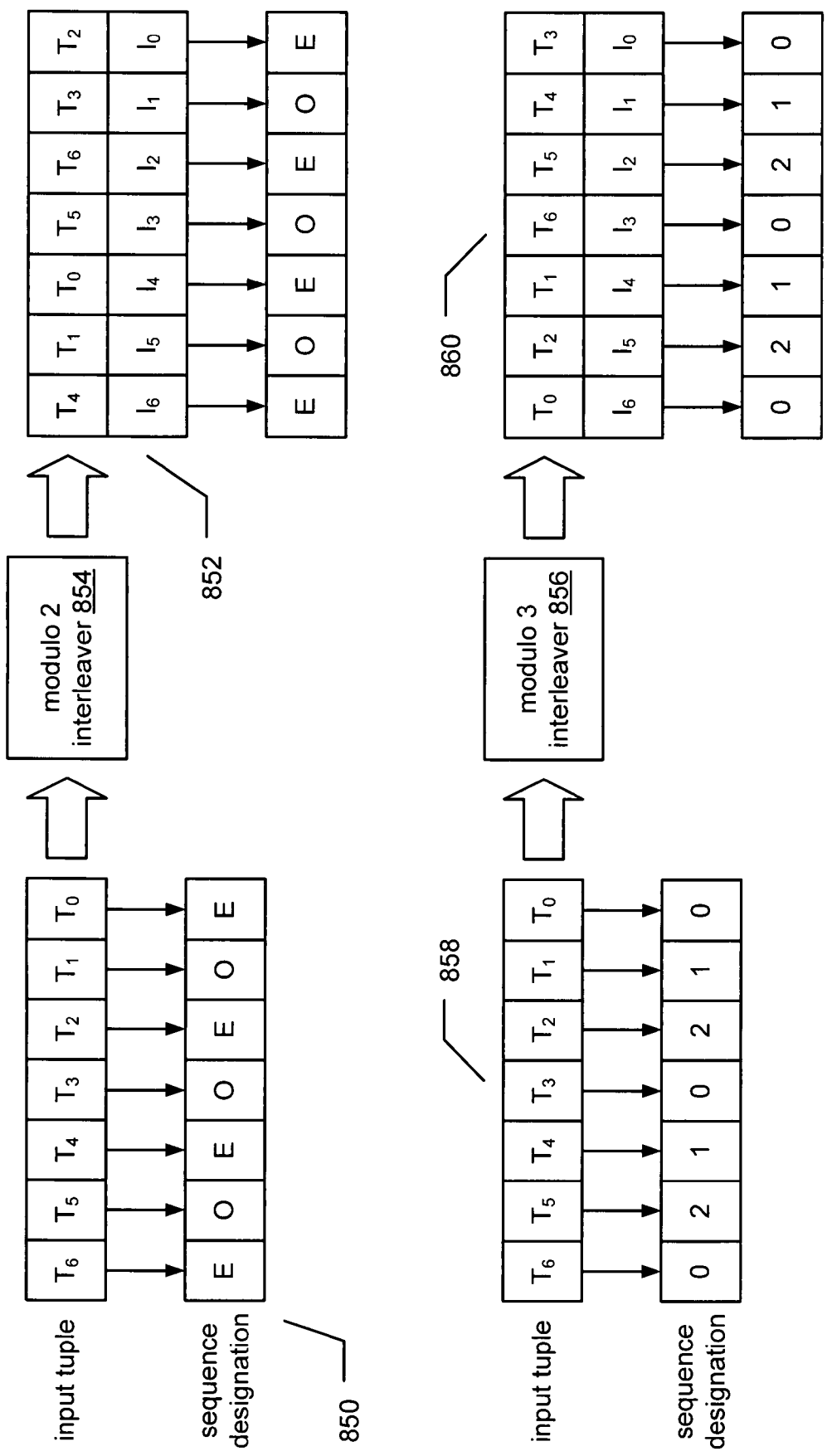
FIG. 8B is a graphical illustration of the process of modulo interleaving.

FIG. 8B is a graphical illustration of examples of modulo interleaving. Interleaving is a process by which input data tuples are mapped to output data tuples.

FIG. 8B illustrates of the process of modulo interleaving. As previously stated for the purposes of this disclosure an interleaver is defined as a device having one input and one output that receives a sequence of tuples and produces an output sequence having the same bit components as the input sequence except for order. That is, if the input sequence contains X bits having values of one, and Y bits having values of zero then the output sequence will also have X bits having values of 1 and Y bits having values of zero. An interleaver may reorder the input tuples or reorder the components of the input tuples or a combination of both. In embodiments of the invention the input and output tuples of an interleaver are assigned a modulo sequence designation which is the result of a modulo division of the input or output number of a tuple. That is, each input tuple is assigned a sequence identifier depending on the order in which it is accepted by the interleaver, and each output tuple is assigned a sequence identifier depending on the order in which it appears at the output of the interleaver.

For example, in the case of a modulo-2 interleaver the sequence designation may be even and odd tuples as illustrated at 850 in FIG. 8B. In such an example, the input tuple in the 0 position, indicating that it was the first tuple provided, is designated as an even tuple $T_0$. Tuple $T_1$, which is provided after tuple $T_0$ is designated as an odd tuple, tuple $T_2$, which is provided after $T_1$ is designated as an even tuple and so forth. The result of the modulo interleaving is illustrated at 852. The input tuples received in order $T_0$, $T_1$, $T_2$, $T_3$, $T_5$, $T_6$ have been reordered to $T_2$, $T_3$, $T_6$, $T_5$, $T_0$, $T_1$, $T_4$. Along with the reordered tuples at 852 is the new designation $I_0$ through $I_6$ which illustrates the modulo sequence position of the interleaved tuples.

The modulo-2 type interleaver illustrated in FIG. 8B at 854 can be any type of interleaver, for example, a block interleaver, a shuffle interleaver or any other type of interleaver known in the art if it satisfies the additional constraint that input tuples are interleaved to positions in the output sequence that have the modulo position value. Therefore an input tuple having an even modulo sequence designation will always be interleaved to an output tuple having an even modulo sequence designation and never will be interleaved to an output tuple having an odd modulo sequence designation. A modulo-3 interleaver 856 will function similarly to a modulo-2 interleaver 854 except that the modulo sequence designation will not be even and odd but zero, one and two. The sequence designation is formed by taking the modulo-3 value of the input position (beginning with input position 0. Referring to FIG. 8B modulo-3 interleaver 856 accepts input sequence $T_0$, $T_1$, $T_2$, $T_3$, $T_4$, $T_5$ and $T_6$ (858) and interleaves it to interleaved sequence 860: $T_3$, $T_4$, $T_5$, $T_6$, $T_1$, $T_2$ which are also designated as interleaved tuples $I_0$ through $I_6$.

Figure 8C:
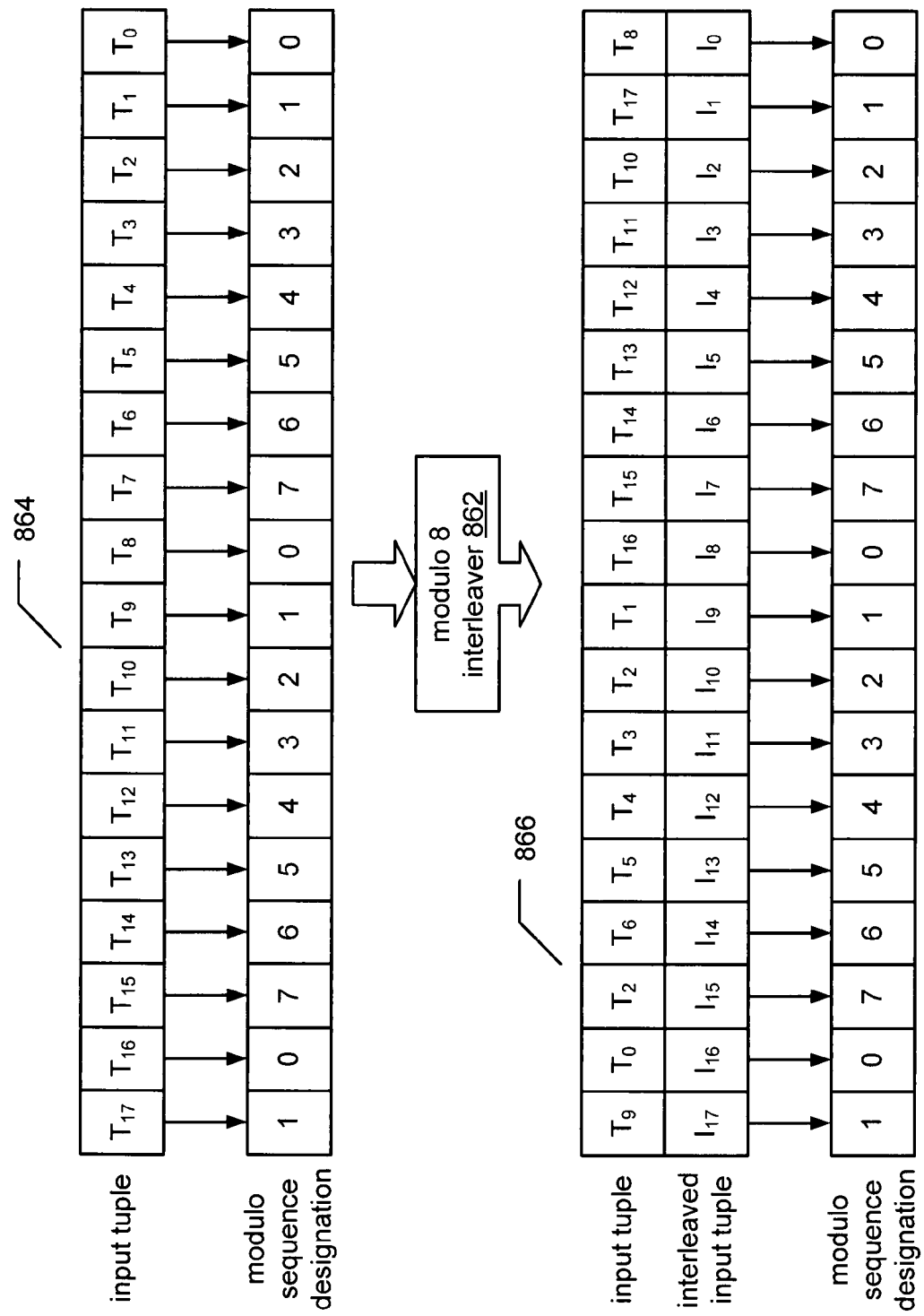
FIG. 8C is a further graphical illustration of the process of modulo interleaving.

As a further illustration of modulo interleaving, a modulo-8 interleaver is illustrated at 862 FIG. 8C. The modulo-8 interleaver at 862 takes an input sequence illustrated at 864 and produces an output sequence illustrated at 866. The input sequence is given the modulo sequence designations of 0 through 7 which is the input tuple number modulo-8. Similarly, the interleaved sequence is given a modulo sequence designation equal to the interleaved tuple number modulo-8 and reordered compared to the input sequence under the constraint that the new position of each output tuple has the same modulo-8 sequence designation value as its corresponding input tuple.

In summary, a modulo interleaver accepts a sequence of input tuples which has a modulo sequence designation equal to the input tuple number modulo-N where N=H of the interleaver counting the null interleaver. The modulo interleaver then produces an interleaved sequence which also has a sequence designation equal to the interleaved tuple number divided by the modulo of the interleaver. In a modulo interleaver bits which start out in an input tuple with a certain sequence designation must end up in an interleaved modulo designation in embodiments of the present invention. Each of the N interleavers in a modulo N interleaving system would provide for the permuting of tuples in a manner similar to the examples in FIG. 8C; however, each interleaver would yield a different permutation.

The input tuple of an interleaver, can have any number of bits including a single bit. In the case where a single bit is designated as the input tuple, the modulo interleaver may be called a bit interleaver.

Inputs to interleavers may also be arbitrarily divided into tuples. For example, if 4 bits are input to in interleaver at a time then the 4 bits may be regarded as a single input tuple, two 2 bit input tuples or four 1 bit input tuples. For the purposes of clarity of the present application if 4 bits are input into an interleaver the 4 bits are generally considered to be a single input tuple of 4 bits. The 4 bits however may also be considered to be 2 of an 8 bit input tuple, two 2 bit input tuples or four 1 bit input tuples the principles described herein. If all input bits input to the interleaver are kept together and interleaved then the modulo interleaver is designated a tuple interleaver (a.k.a. integral tuple interleaver) because the input bits are interleaved as a single tuple. The input bits may be also interleaved as separate tuples. Additionally, a hybrid scheme may be implemented in which the input tuples are interleaved as tuples to their appropriate sequence positions, but additionally the bits of the input tuples are interleaved separately. This hybrid scheme has been designated as an ST interleaver. In an ST interleaver, input tuples with a given modulo sequence designation are still interleaved to interleaved tuples of similar sequence designations. Additionally, however, the individual bits of the input tuple may be separated and interleaved into different interleaved tuples (the interleaved tuples must all have the same modulo sequence designation as the input tuple from which the interleaved tuple bits were obtained). The concepts of a tuple modulo interleaver, a bit modulo interleaver, and a bit-tuple modulo interleaver are illustrated in the following drawings.

Figure 9:
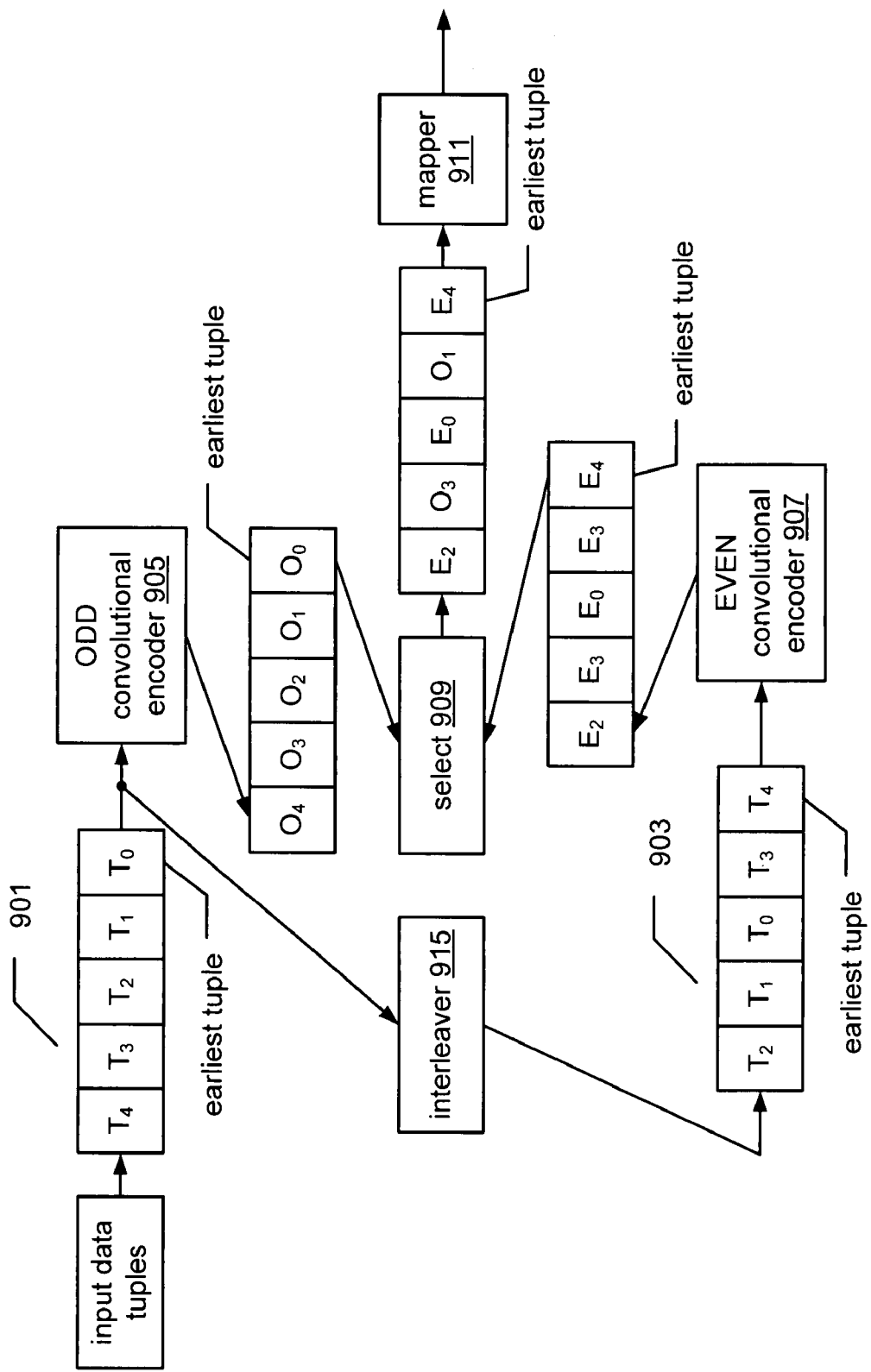
FIG. 9 is a block diagram of a TTCM encoder employing a tuple interleaver.

FIG. 9 is a block diagram of TTCM encoder employing a tuple type interleaver. In FIG. 9 an exemplary input data sequence 901 comprises a sequence of data tuples $T_0$, $T_1$, $T_2$, $T_3$ and $T_4$. The tuples are provided in an order such that $T_0$ is provided first, $T_1$ is provided second, etc. Interleaver 915 interleaves data sequence 901. The output of the interleaver comprises a new data sequence of the same input tuples but in different order. The data sequence 903, after interleaving, comprises the data tuples $T_4$, $T_3$, $T_0$, $T_1$ and $T_2$ in that order. The tuple interleaver illustrated in FIG. 9 at 915 is a modulo-2 or odd/even type interleaver. The original data sequence 901 is provided to odd convolutional encoder 905 and the interleaved data sequence 903 is provided to an even convolutional encoder 907. A select mechanism 909 selects encoded outputs from the odd convolutional encoder 905 and the even convolutional encoder 907, according to the procedure provided below and illustrated in FIG. 9, and provides the encoder output selected to the mapper 911. The select mechanism 909 illustratively chooses encoded outputs from the "odd" convolutional encoder 905 that correspond to odd tuples in the input data sequence 901. The select device 909 also chooses encoded tuples from the even convolutional encoder 907, that correspond to the even tuples of input sequence 903. So if the odd convolutional encoder 905 produces encoded tuples $O_0$, $O_1$, $O_2$, $O_3$ and $O_4$ corresponding to the input sequence of data tuples 901, the selector will select $O_1$ and $O_3$ (which have an odd modulo sequence designation) to pass through the mapper. In like manner if the even convolutional encoder produces symbols $E_4$, $E_3$, $E_0$, $E_1$ and $E_2$ from the input sequence 903 and select mechanism 909 selects $E_4$, $E_0$ and $E_2$ and passes those encoded tuples to the mapper 911. The mapper will then receive a composite data stream corresponding to encoded outputs $E_4$, $O_1$, $E_0$, $O_3$, and $E_2$. In this manner an encoded version of each of the input data sequence tuples 901 is passed onto the mapper 911. Accordingly, all of the input data sequence tuples 901 are represented in encoded form in the data 913 which is passed onto the mapper 911. Although both encoders encode every input tuple, the encoded tuples having an odd sequence designation are selected from encoder 905 and the encoded tuples having an even sequence designation are selected from encoder 907. In the interleaver 915 of FIG. 9, each tuple is maintained as an integral tuple and there is no dividing of the bits which form the tuple. A contrasting situation is illustrated in FIG. 10.

Figure 10:
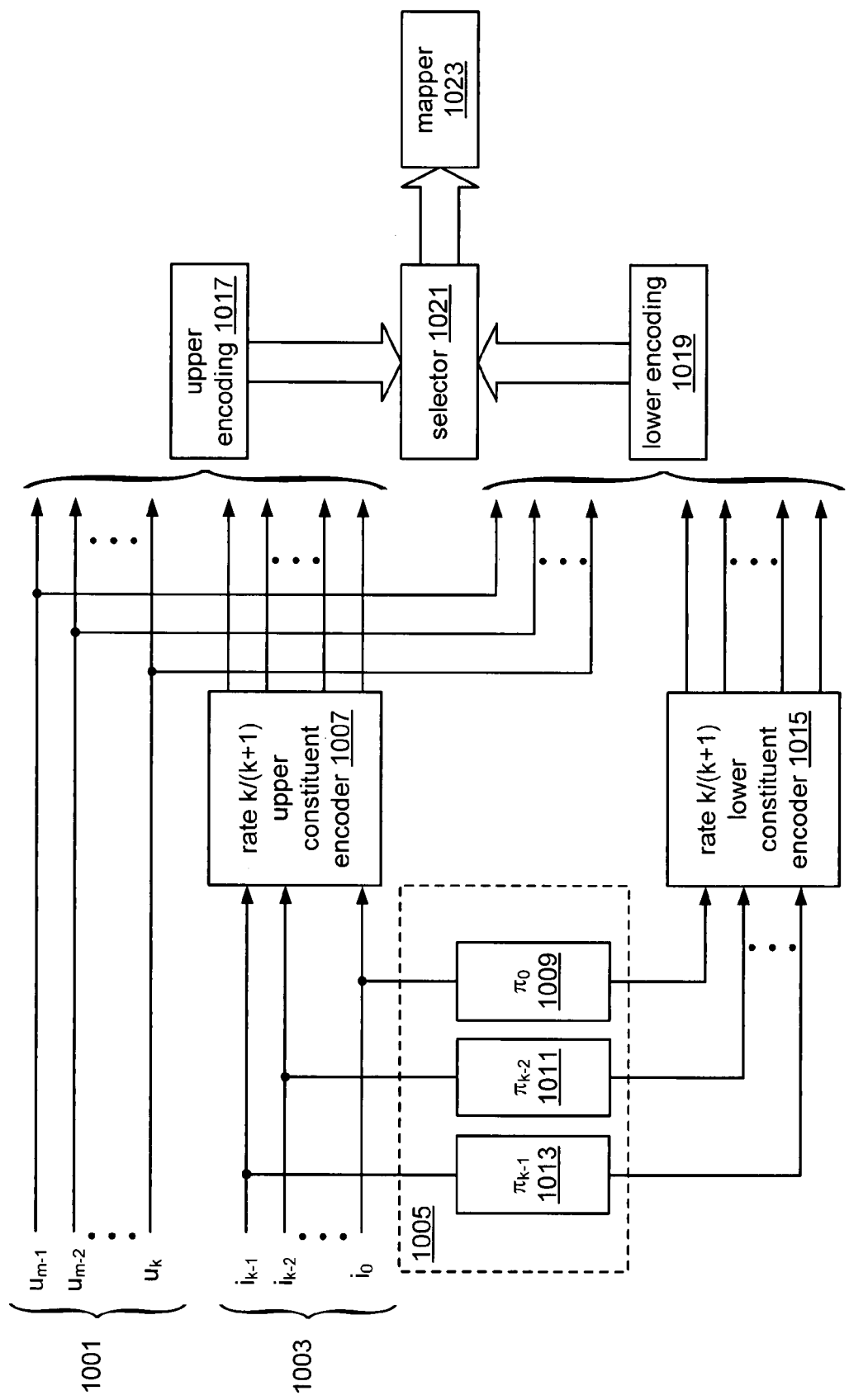
FIG. 10 is a block diagram of a TTCM encoder employing a bit interleaver.

FIG. 10 is a block diagram of a TTCM encoder employing a bit type interleaver. In FIG. 10 an input tuple is represented at 1003 as input bits $i_0$ through $i_{k-1}$. The input bits $i_0$ through $i_{k-1}$ are coupled into an upper constituent encoder of 1007. The input tuple 1003 is also coupled into interleaver 1005. The interleaver 1005 is further divided into interleavers 1009, 1011 and 1013. Each of the interleavers 1009, 1011 and 1013 accepts a single bit of the input tuple. The input tuple 1003 is then rearranged in the interleaver 1005 such that each bit occupies a new position in the sequence that is coupled into the lower constituent encoder 1015. The interleaving performed by the interleaver 1005 may be any type of suitable interleaving. For example, the interleaver may be a block interleaver a modulo interleaver as previously described, or any other type of interleaver as known in the art.

In the illustrated interleaver of FIG. 10 the interleaving sequence provided by interleaver 1005, and hence by sub-interleavers 1009, 1011 and 1013, is independent of the positions of the bits within the input 1003. Input tuple 1001 represents input bits which are not passed through either of the constituent encoders 1007 or 1015. The upper encoding 1017 comprises the uncoded input tuple 1001 plus the encoded version of input tuple 1003, which has been encoded in the upper constituent encoder 1007. The lower encoding 1019 comprises the uncoded input tuple 1001 plus the output of the lower constituent encoder 1015 which accepts the interleaved version of input tuple 1003. A selector 1021 accepts either the upper or lower encoding and passes selected encoding to a symbol mapper 1023.

Figure 11A:
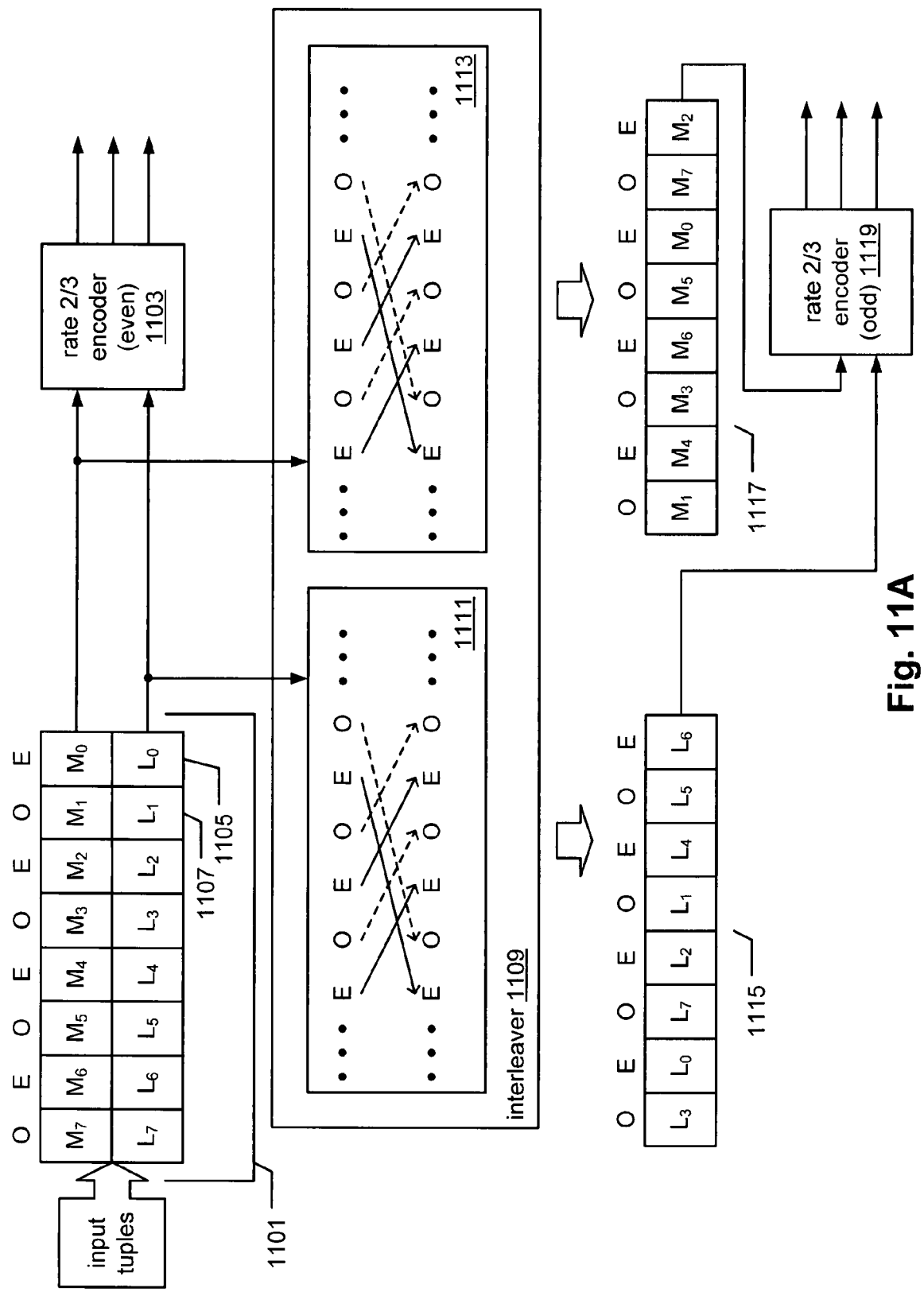
FIG. 11A is a first portion of combination block diagram and graphical illustration of a rate 2/3 TTCM encoder employing a ST interleaver, according to an embodiment of the invention.
Figure 11B:
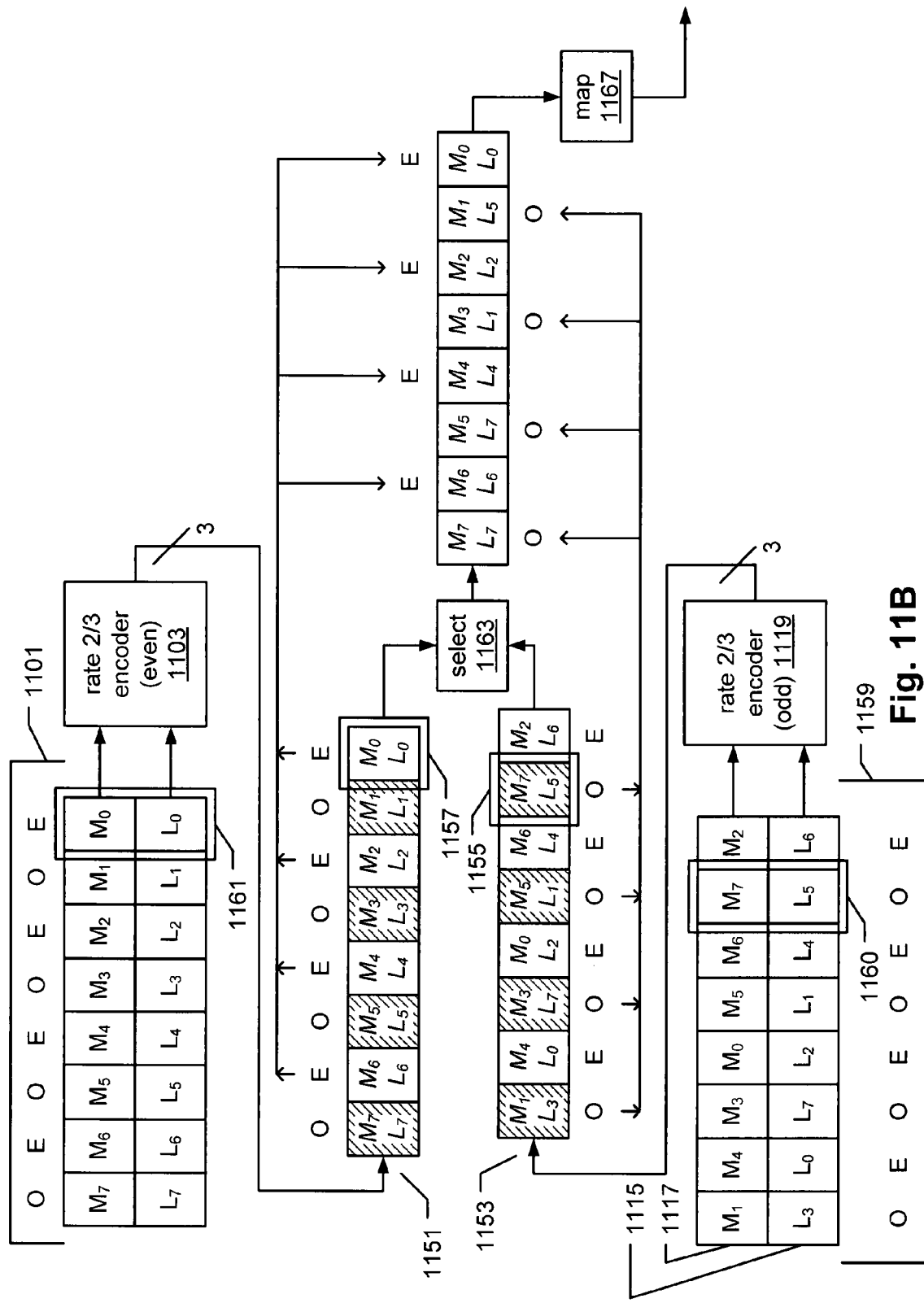
FIG. 11B is a second portion of combination block diagram and graphical illustration of a rate 2/3 TTCM encoder employing a ST interleaver, according to an embodiment of the invention.

FIG. 11A is a first part of a combination block diagram and graphic illustration of a rate 2/3 TTCM encoder employing a ST interleaver according to an embodiment of the invention. FIG. 11A and 11B in combination illustrate a modulo-2 ST interleaver as may be used with a rate 2/3 TTCM encoder. In FIG. 11A input tuples 1101 are provided to a rate 2/3 encoder 1103. The rate 2/3 encoder 1103 is designated as an even encoder because, although it will encode every input tuple, only the tuples corresponding to encoded even tuples will be selected from encoder 1103 by the selection circuit. Input tuples comprise 2 bits, a most significant bit designated by an M designation and a least significant bit designated by an L designation. The first tuple that will be accepted by the rate 2/3 even encoder 1103 will be the even tuple 1105. The even input tuple 1105 comprises 2 bits where $M_0$ is the most significant bit, and $L_0$ is the least significant bit. The second tuple to be accepted by the rate 2/3 even encoder 1103 is the 1107 tuple. The 1107 tuple is designated as an odd tuple and comprises a most significant bit $M_1$ and a least significant bit $L_1$. The input tuples are designated even and odd because the interleaver 1109, which is being illustrated in FIG. 11A, is modulo-2 interleaver also known as an even/odd interleaver.

The same principles, however, apply to any modulo-N interleaver. If the modulo interleaver had been a mod 3 interleaver instead of a mod 2 interleaver then the input tuples would have sequence designations 0, 1 and 2. If the modulo interleaver had been a modulo-4 interleaver then the input tuples would have modulo sequence designations 0, 1, 2, 3. The modulo interleaving scheme, discussed here with respect to modulo-2 interleavers and 2 bit tuples, may be used with any size of input tuple as well as any modulo-N interleaver. Additionally, any rate encoder 1103 and any type encoder may be used with the modulo ST interleaving scheme to be described. A rate 2/3 encoder, a modulo-2 ST interleaver, and 2 bit input tuples have been chosen for ease of illustration but are not intended to limit embodiments of the invention to the form disclosed. In other words, the following modulo-2 ST interleaver is chosen along with 2 bit input tuples and a rate 2/3 encoder system in order to provide for a relatively uncluttered illustration of the principles involved. The ST interleaver 1109 in this case actually can be conceptualized as two separate bit type interleavers 1111 and 1113. The separation of the interleavers is done for conceptual type purposes in order to make the illustration of the concepts disclosed easier to follow. In an actual implementation the interleaver 1109 may be implemented in a single circuit or multiple circuits depending on the needs of that particular implementation. Interleaver 1111 accepts the least significant bits of the input tuple pairs 1101. Note input tuple pairs designate input tuples having a pair, i.e. MSB (Most Significant Bit) and LSB (Least Significant Bit), of bits. The interleaver 1111 interleaves the least significant bits of the input tuple pairs 1101 and provides an interleaved sequence of least significant bits of the input tuple pairs for example those illustrated in 1115.

In the example, only eight input tuple pairs are depicted for illustration purposes. In an actual implementation the number of tuple pairs in a block to be interleaved could number tens of thousands or even more. Eight input tuple pairs are used for ease of illustration purposes. The least significant bits of the input tuple pairs 1101 are accepted by the interleaver 1111 in the order $L_0$, $L_1$, $L_2$, $L_3$, $L_4$, $L_5$, $L_6$, and $L_7$. The interleaver, in the example of FIG. 11A, then provides an interleaved sequence 1115 in which the least significant bits of the input tuples have been arranged in the order $L_6$, $L_5$, $L_4$, $L_1$, $L_2$, $L_7$, $L_0$ and $L_3$. Note that although the least significant bit of the input tuple pairs have been shuffled by the interleaver 1111 each least significant bit in an even tuple in the input tuple pairs is interleaved to an even interleaved position in the output sequence 1115. In like manner, odd least significant bits in the input sequence 1101 are interleaved by interleaver 1111 into odd position in the output sequence 1115. This is also a characteristic of modulo ST interleaving. That is although the data input is interleaved, and the interleaving may be done by a variety of different interleaving schemes know in the art, the interleaving scheme, however, is modified such that even data elements are interleaved to even data elements and odd data elements are interleaved to odd data elements. In general, in modulo-N interleavers the data input to an interleaver would be interleaved to output positions having the same modulo sequence designation as the corresponding modulo sequence designation in the input sequence. That is, in a modulo-4 interleaver an input data element residing in a input tuple with a modulo sequence designation of 3 would end up residing in an interleaved output sequence with a modulo sequence designation of 3. In other words, no matter what type of interleaving scheme the interleaver (such as 1111) uses, the modulo sequence designation of each bit of the input data tuples sequence is maintained in the output sequence. That is, although the positions of the input sequence tuples are changed the modulo interleaved positions are maintained throughout the process. This modulo sequence designation, here even and odd because a modulo-2 interleaver is being illustrated, will be used by the selection mechanism to select encoded tuples corresponding to the modulo sequence designation of the input tuples. In other words, the modulo sequence designation is maintained both through the interleavers and through the encoders. Of course, since the input tuples are encoded the encoded representation of the tuples appearing at the output of the encoder may be completely different and may have more bits than the input tuples accepted by the encoder.

Similarly, the most significant bits of input tuples 1101 are interleaved in interleaver 1113. In the example of FIG. 11A, the sequence $M_0$ through $M_7$ is interleaved into an output sequence $M_2$, $M_7$, $M_0$, $M_5$, $M_6$, $M_3$, $M_4$, and $M_1$. The interleaved sequence 1117, produced by interleaving the most significant bits of the input tuples 1101 in interleaver 1113, along with the interleaved sequence of least significant bits 1115 is provided to into the "odd" rate 2/3 encoder 1119. Note that in both cases all data bits are interleaved into new positions which have the same modulo sequence designation as the corresponding input tuples modulo sequence designation.

FIG. 11B is a second part of a combination block diagram and graphic illustration of a rate 2/3 TTCM encoder employing an ST interleaver. In FIG. 11B the even rate 2/3 encoder 1103 and the odd rate 2/3 encoder 1119, as well as the tuples input to the encoders, are reproduced for clarity. Even encoder 1103 accepts the input tuple sequence 1101. The odd encoder 1119 accepts an input sequence of tuples, which is formed from the interleaved sequence of most significant bits 1117 combined with the interleaved sequence of least significant bits 1115. Both encoders 1103 and 1119 are illustrated as rate 2/3 nonsystematic convolutional encoders and therefore each have a 3 bit output. Encoder 1119 produces an output sequence 1153. Encoder 1103 produces an output sequence 1151. Both sequences 1151 and 1153 are shown in script form in order to indicate that they are encoded sequences. Both rate 2/3 encoders accept 2 bit input tuples and produce 3 bit output tuples. The encoded sequences of FIG. 11B may appear to have 2 bit elements, but in fact the two letter designation and comprise 3 encoded bits each. Therefore, output tuple 1155 which is part of sequence 1153 is a 3 bit tuple. The 3 bit tuple 1155 however, is designated by a script $M_7$ and a script $L_5$ indicating that that output tuple corresponds to an input tuple 1160, which is formed from most significant bit $M_7$ and least significant bit $L_5$. In like manner, output tuple 1157 of sequence 1151 comprises 3 bits. The designation of output tuple 1157 as $M_0$ and $L_0$ indicates that that output tuple corresponds to the input tuple 1101, which is composed of input most significant bit $M_0$ and input least significant bit $L_0$. It is worthwhile to note that output tuple of encoder 1103, which corresponds to input tuple 1161 maintains the same even designation as input tuple 1161. In other words, the output tuple of an encoder in a modulo interleaving system maintains the same modulo sequence designation as the input tuple to which it corresponds. Additionally, in a ST interleaver input tuple bits are interleaved independently but are always interleaved to tuples having the same modulo sequence designation.

Selector mechanism 1163 selects between sequences 1153 and 1151. Selector 1163 selects tuples corresponding to an even modulo sequence designation from the sequence 1151 and selects tuples corresponding to an odd modulo sequence designation from sequence 1153. The output sequence created by such a selection process is shown at 1165. This output sequence is then coupled into mapper 1167. The modulo sequence 1165 corresponds to encoded tuples with an even modulo sequence designation selected from sequence 1151 and encoded tuples with an odd modulo sequence designation selected from 1153. The even tuples selected are tuple $M_0 L_0$, tuple $M_2 L_2$, tuple $M_4, L_4$ and tuple $M_4, L_4$. Output sequence also comprises output tuples corresponding to odd modulo sequence designation $M_7 L_5$, tuple $H_5 L_1$, tuple $M_3 L_7$ and tuple $M_1$ and $L_3$.

A feature of modulo tuple interleaving systems, as well as a modulo ST interleaving systems is that encoded versions of all the input tuple bits appear in an output tuple stream. This is illustrated in output sequence 1165, which contains encoded versions of every bit of every tuple provided in the input tuple sequence 1101.

Those skilled in the art will realize that the scheme disclosed with respect to FIG. 11A and FIG. 11B can be easily extended to a number of interleavers as shown in FIG. 8A. In such a case, multiple modulo interleavers may be used. Such interleavers may be modulo tuple interleavers in which the tuples that will be coupled to the encoders are interleaved as tuples or the interleavers may be ST interleavers wherein the input tuples are interleaved to the same modulo sequence designation in the output tuples but the bits are interleaved separately so that the output tuples of the interleavers will correspond to different bits than the input sequence. By interleaving tuples and bits within tuples a more effective interleaving may be obtained because both bits and tuples are interleaved. Additionally, the system illustrated in FIG. 11A and FIG. 11B comprise an encoder 1103 which accepts the sequence of input tuples 1101. The configuration of FIG. 11A and 11B illustrates one embodiment. In a second embodiment the input tuples are ST interleaved before being provided to either encoder. In this way both the even and odd encoders can receive tuples which have had their component bits interleaved, thus forming an interleaving which may be more effective. In such a manner, an even encoder may produce a code which also benefits from IT or ST tuple interleaving. Therefore, in a second illustrative embodiment of the invention the input tuples are modulo interleaved before being passed to either encoder. The modulo interleaving may be a tuple interleaving, or a ST interleaving. Additionally, the types of interleaving can be mixed and matched.

Additionally, the selection of even and odd encoders is arbitrary and although the even encoder is shown as receiving uninterleaved tuples, it would be equivalent to switch encoders and have the odd encoder receive uninterleaved tuples. Additionally, as previously mentioned the tuples provided to both encoders may be interleaved.

Figure 12:
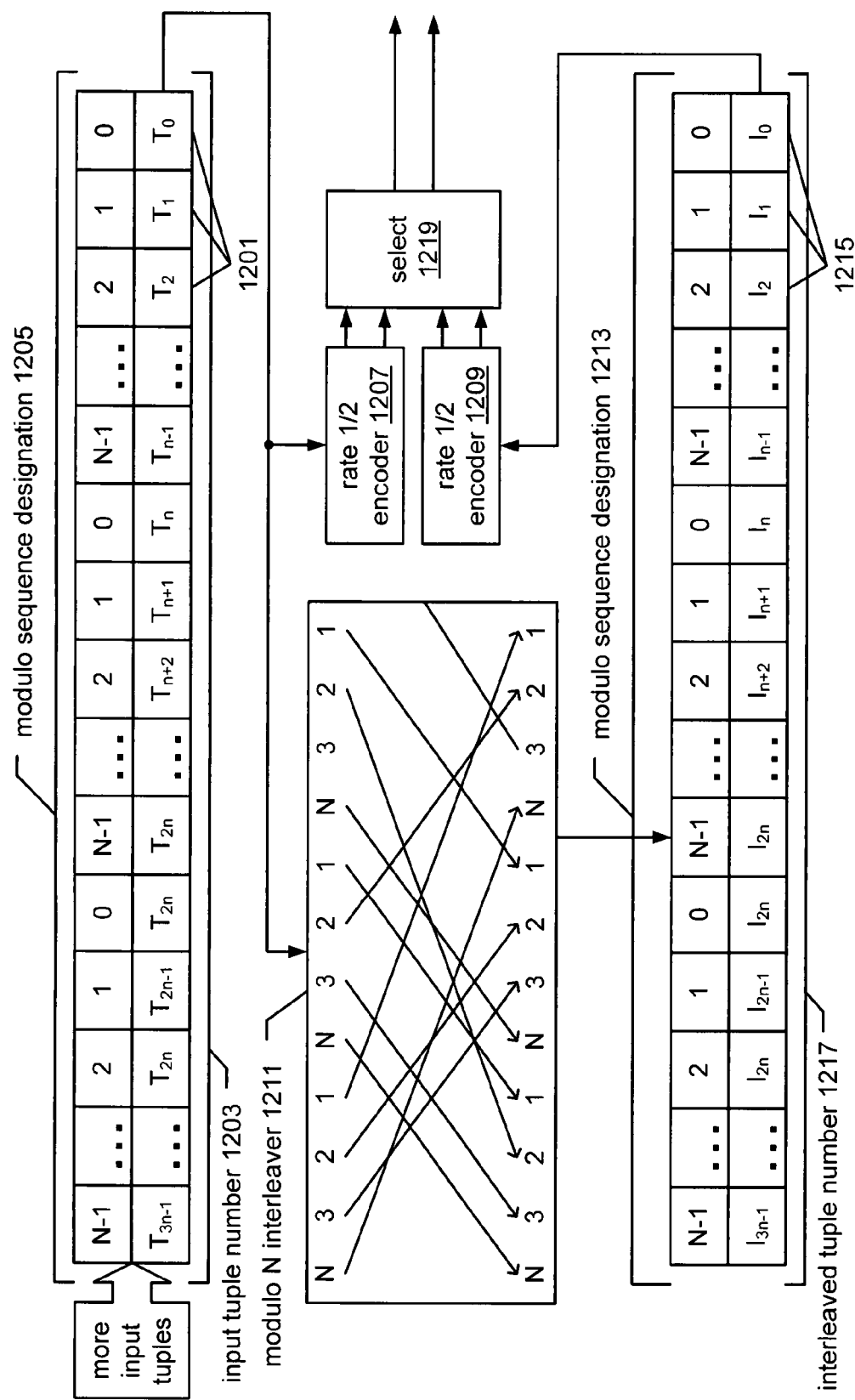
FIG. 12 is a combination block diagram and graphical illustration of rate 1/2 parallel concatenated encoder (PCE) employing a modulo-N Interleaver.

FIG. 12 is a combination block diagram and graphical illustration of a rate 1/2 parallel concatenated encoder (PCE) employing a modulo-N interleaver. FIG. 12 is provided for further illustration of the concept of modulo interleaving. FIG. 12 is an illustration of a parallel concatenated encoder with rate 1/2 constituent encoders 1207 and 1209. The input tuples to the encoder 1201 are provided to rate 1/2 encoder 1207. Each input tuple, for example, $T_0$, $T_1$, $T_2$ and $T_n$ given an input tuple number corresponding to the order in which it is provided to the encoder 1207 and interleaver 1211. The input tuple number corresponds to the subscript of the input tuple. For example, $T_0$ the zero tuple is the first tuple provided to the rate 1/2 encoder 1207, $T_1$ is the second tuple provided to the rate 1/2 encoder 1207, $T_2$ is the third tuple provided to the rate 1/2 input encoder 1207 and $T_n$ is the N plus first tuple provided to the rate 1/2 encoder 1207. The input tuples may be a single bit in which case the output of the rate 1/2 encoder 1207 would comprise 2 bits. The input tuples may also comprise any number of input bits depending on the number of inputs to the rate 1/2 encoder 1207.

The modulo concept illustrated is identical where the rate 1/2 encoder is provided with tuples having a single bit or multiple bits. The input tuples 1201 are assigned a modulo sequence designation 1205. The modulo sequence designation is formed by taking the input tuple number modulo-N, which is the modulo order of the interleaver. In the example illustrated, the modulo order of the interleaver 1211 is N. Because the modulo order of the interleaver is N the modulo sequence designation can be any integer value between 0 and N−1. Therefore, the $T_0$ tuple has a modulo sequence designation of 0, the $T_1$ tuple has a modulo sequence designation of 1, the $T_{n−1}$ input tuple has a modulo sequence designation of N−1, the $T_n$ input tuple has a modulo sequence designation of 0 and the $T_{n+1}$ input tuple has a modulo sequence designation of 1 and so forth. Interleaver 1211 produces interleaved tuples 1215. Similarly to the input tuples the interleaved tuples are given a modulo sequence designation which is the same modulo order as the interleaver 1211. Therefore, if the input tuples have a modulo sequence designation from 0 to N−1 then the interleaved tuples will have a modulo sequence designation of 0 to N−1. The interleaver 1211 can interleave according to a number of interleaving schemes known in the art. In order to be a modulo interleaver, however, each of the interleaving schemes must be modified so that input tuples with a particular modulo sequence designation are interleaved to interleaved tuples with the same modulo sequence designation. The interleaved tuples are then provided to a second rate 1/2 encoder 1209. The encoder 1207 encodes the input tuples, the encoder 1209 encodes the interleaved tuples and selector 1219 selects between the output of the encoder 1207 and the output of encoder 1209. It should be obvious from the foregoing description that modulo type interleaving can be carried out using any modulo sequence designation up to the size of the interleaver. A modulo-2 interleaver is typically referred to herein as an odd/even interleaver as the modulo sequence designation can have only the values of 1 or 0, i.e., odd or even respectively.

Figure 13:
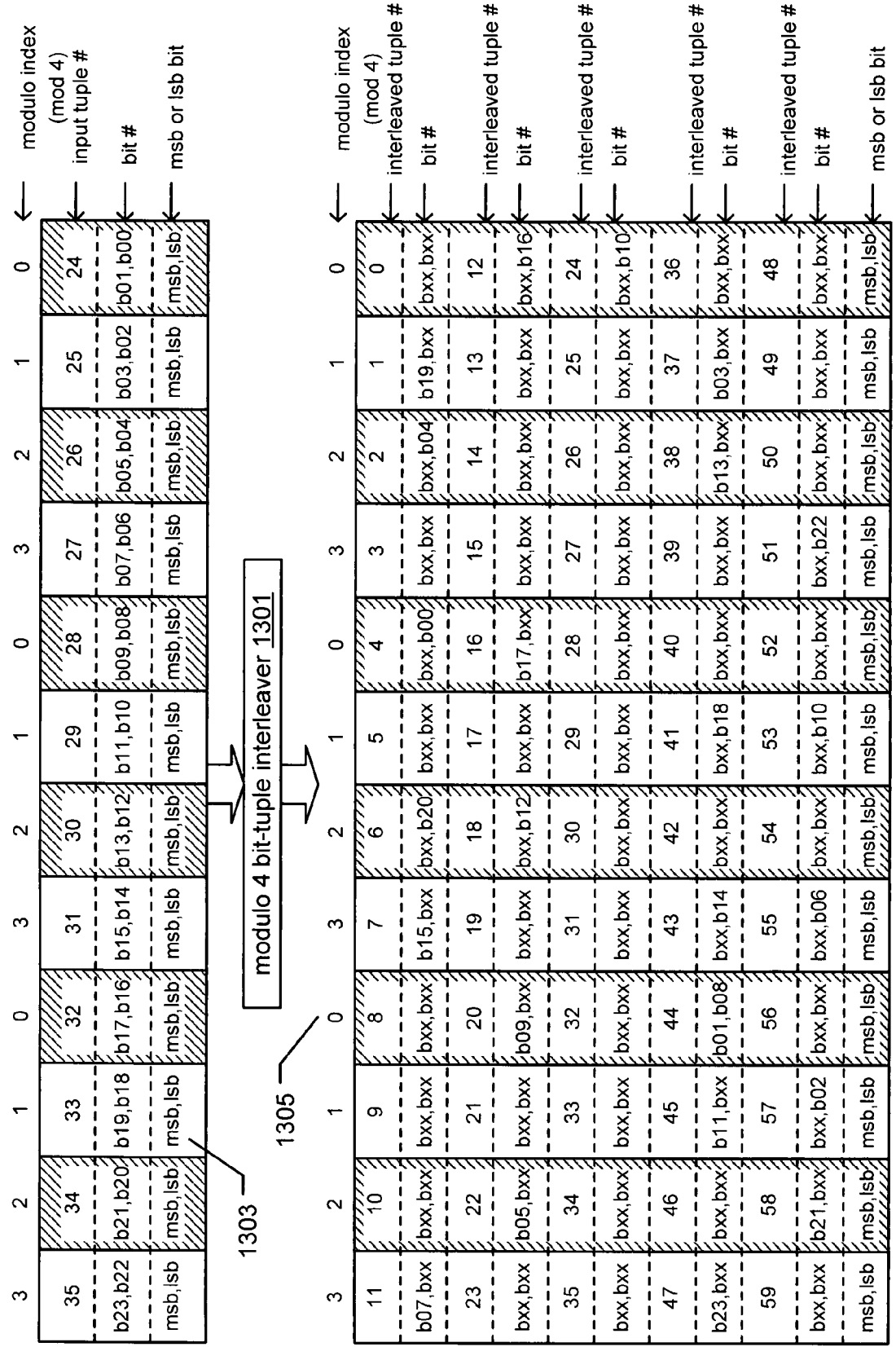
FIG. 13 is a graphical illustration of the functioning of a modulo-4 ST interleaver, according to an embodiment of the invention.

FIG. 13 is a graphic illustration of the functioning of a modulo-4 ST interleaver according to an embodiment of the invention. In the illustrated example, the modulo-4 ST interleaver 1301 interleaves a block of 60 tuples. That is the interleaver can accommodate 60 input tuples and perform and interleaving on them. Input tuples 24 through 35 are illustrated at 1303, to demonstrate an exemplary interleaving. Interleaved tuples 0-59 are illustrated at 1305. Input tuples 24 through 35 are illustrated at 1303 as 2 bit tuples. Input tuple 24 includes bit $b_{00}$ which is the LSB or least significant bit of input tuple 24 and $b_{01}$ the MSB or most significant bit of input tuple 24. Similarly, input tuple 25 includes $b_{02}$ which is the least significant bit (LSB) of tuple 25 and $b_{03}$ which is the most significant bit of input tuple 25. Each input tuple 1303 is assigned a modulo sequence designation which is equal to the tuple number modulo-4. The modulo sequence designation of tuple 24 is 0, the modulo sequence designation of tuple 25 is 1, the modulo sequence designation of tuple 26 is 2, the modulo sequence designation of tuple 27 is 3, the modulo sequence designation of tuple 28 is 0 and so forth. Because 1301 is a ST interleaver, the bits of each tuple are interleaved separately. Although the bits of each tuple are interleaved separately, they are interleaved into an interleaved tuple having the same modulo sequence designation, i.e. tuple number mod 4 in the interleaved tuple as in the corresponding input tuple. Accordingly, bit $b_{00}$ the LSB of tuple 24 is interleaved to interleaved tuple number 4 in the least significant bit position. $b_{01}$ the MSB of input tuple 24 is interleaved to interleaved tuple 44 in the most significant bit position. Note that the modulo sequence designation of input tuple 24 is a 0 and modulo sequence designation of interleaved tuple 4 and interleaved tuple 44 are both 0. Accordingly, the criteria that bits of an input tuple having a given modulo sequence designation are interleaved to interleave positions having the same modulo sequence designation. Similarly, $b_{02}$ and $b_{03}$ of input tuple 25 are interleaved to interleaved tuple 57 and interleaved tuple 37 respectively. $B_{04}$ and $b_{05}$ of input tuple 26 are interleaved to interleaved tuples 2 and 22. In like manner the MSB and LSB of all illustrated input tuples 24 through 35 are interleaved to corresponding interleaved tuples having the same modulo sequence designation, as illustrated in FIG. 13.

Figure 14A:
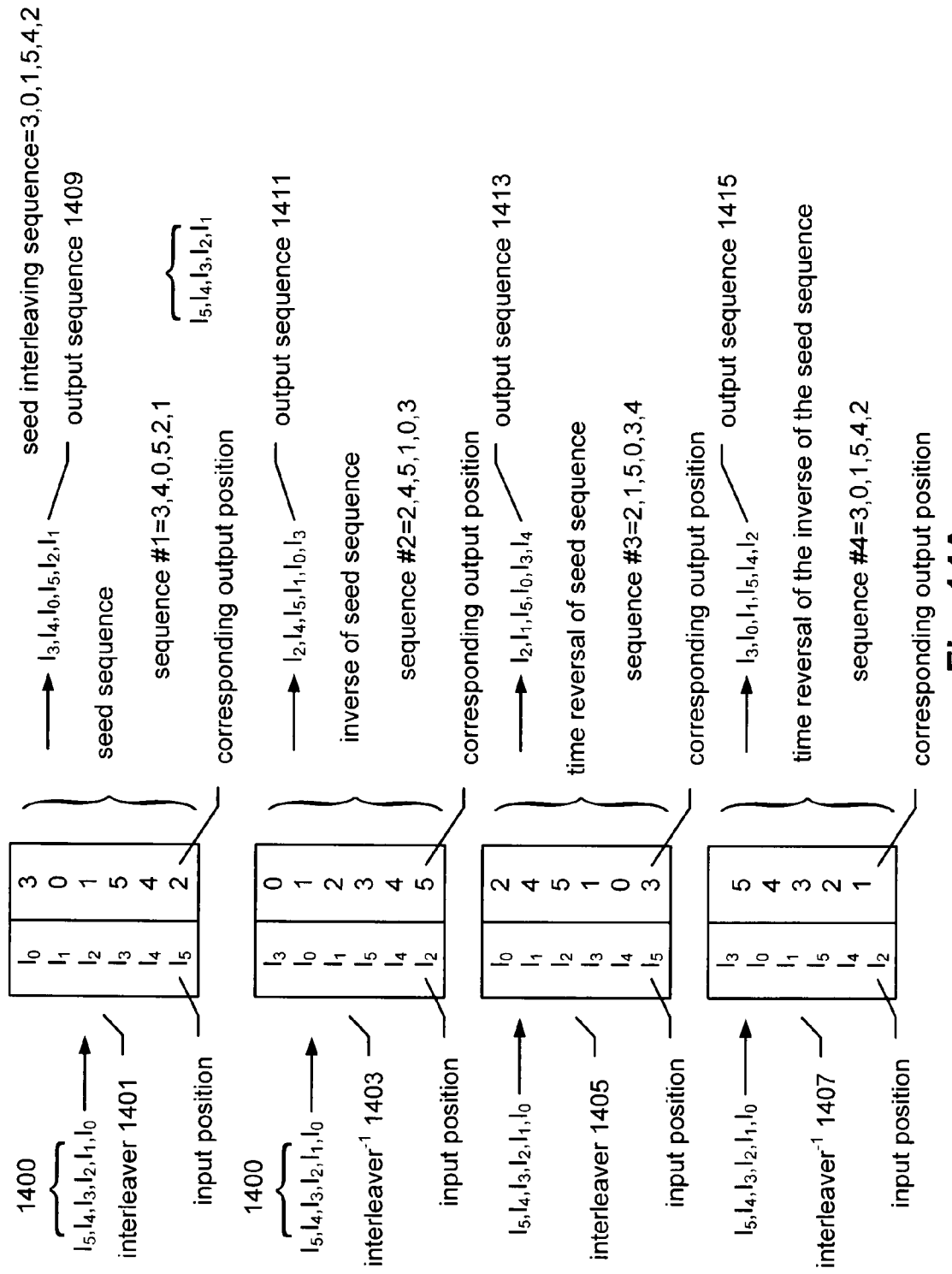
FIG. 14A is a graphical illustration of the generation of interleaver sequences from a seed interleaving sequence.

FIG. 14A is a graphical illustration of a method for generating an interleaving sequence from a seed interleaving sequence. Interleavers may be implemented in random access memory (RAM). In order to interleave an input sequence, an interleaving sequence may be used. Because interleavers can be quite large, it may be desirable that an interleaving sequence occupy as little storage space within a system as feasible. Therefore, it can be advantageous to generate larger interleaving sequences from smaller, i.e. seed interleaving sequences. FIG. 14A is a portion of a graphical illustration in which a seed interleaving sequence is used to generate four interleaving sequences each the size of the initial seed interleaving sequence. In order to illustrate the generation of sequences from the seed interleaving sequence, an interleaving matrix such as that 1401 may be employed. The interleaving matrix 1401 matches input positions with corresponding output positions. In the interleaving matrix 1401 the input positions $I_0$ through $I_5$ are listed sequentially. $I_0$ is the first interleaving element to enter the interleaving matrix 1401. $I_1$ is the second element, etc. As will be appreciated by those skilled in the art, the input elements $I_0$ through $I_5$ may be considered to be individual bits or tuples. The input positions in the interleaving matrix 1401 are then matched with the seed sequence. By reading through the interleaving matrix 1401 an input position is matched with a corresponding output position. In the illustrative example, of the interleaving matrix 1401, input $I_0$ is matched with the number 3 of the seed sequence. This means that the $I_0$ or first element into the interleaving matrix 1401 occupies position 3 in the resulting first sequence. Similarly, $I_1$ will be matched with a 0 position in sequence 1 and so forth. In other words, the input sequence $I_0, I_1, I_2, I_3, I_4, I_5$ is reordered according to the seed sequence so that the resulting sequence output from the interleaving matrix 1401 is $I_1, I_2, I_5, I_0, I_4, I_3$ where the output sequence is obtained by listing the sequence of the output in the usual ascending order $I_0, I_1, I_2, I_3, I_4, I_5$, where the leftmost position is the earliest. Put another way, the resulting sequence number 1 is {3, 4, 0, 5, 2, 1}, which corresponds to the subscript of the output sequence 1409. Similarly, in interleaving matrix 1403 also called the inverse interleaving matrix or $INTLV^{-1}$ the input sequence 1400 is accepted by the interleaving matrix 1403 but instead of being written into this interleaving matrix sequentially, as in the case with interleaving matrix 1401, the elements are written into the interleaving matrix according to the seed sequence. The interleaving matrix 1403 is known as the inverse of interleaving matrix 1401 because by applying interleaving matrix 1401 and then successively applying inverse interleaving matrix 1403 to any input sequence, the original sequence is recreated. In other words, the two columns of the interleaving matrix 1401 are swapped in order to get interleaving matrix 1403. Resulting output sequence 1411 is $I_3, I_0, I_1, I_5, I_4, I_2$. Therefore, sequence number 2 is equal to 2, 4, 5, 1, 0, 3.

The seed interleaving sequence can also be used to create an additional two sequences. The interleaving matrix 1405 is similar to interleaving matrix 1401 except that the time reversal of the seed sequence is used to map the corresponding output position. The output then of interleaver reverse (INTLVR 1405) is then $I_4, I_3, I_0, I_5, I_1, I_2$. Therefore, sequence 3 is equal to 2, 1, 5, 0, 3, 4.

Next an interleaving matrix 1407 which is similar to interleaving matrix 1403 is used. Interleaving matrix 1407 has the same input position elements as interleaving matrix 1403, however, except that the time reversal of the inverse of the seed sequence is used for the corresponding output position within interleaving matrix 1407. In such a manner, the input sequence 1400 is reordered to $I_2, I_4, I_5, I_1, I_0, I_3$. Therefore, sequence number 4 is equal to 3, 0, 1, 5, 4, 2, which are, as previously, the subscripts of the outputs produced. Sequences 1 through 4 have been generated from the seed interleaving sequence. In one embodiment of the invention the seed interleaving sequence is an S random sequence as described by S. Dolinar and D. Divsalar in their paper "Weight Distributions for Turbo Codes Using Random and Non-Random Permeations," TDA progress report 42-121, JPL, August 1995.

Figure 14B:
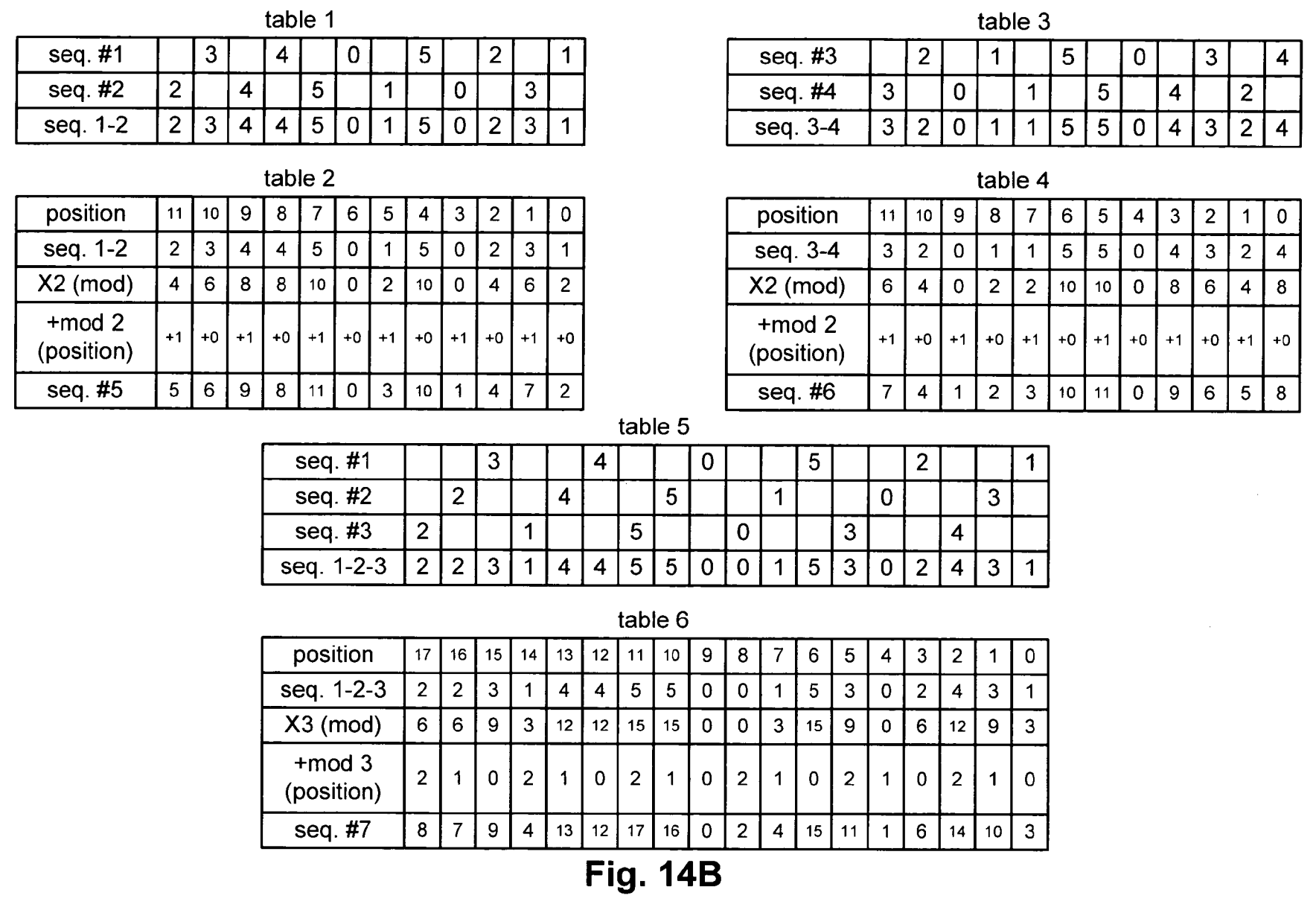

FIG. 14B is a series of tables illustrating the construction of various modulo interleaving sequences from sequence 1 through 4 (as illustrated in FIG. 14A). Table 1 illustrates the first step in creating an interleaving sequence of modulo-2, that is an even/odd interleaving sequence, from sequence I and 2 as illustrated in FIG. 14A. Sequence 1 is illustrated in row 1 of table 1. Sequence 2 is illustrated in row 2 of table 1. Sequence 1 and sequence 2 are then combined in row 3 of table 1 and are labeled sequence 1-2. In sequence 1-2 elements are selected alternatively, i.e. sequentially from sequence 1 and 2 in order to create sequence 1-2. That is element 1, which is a 1, is selected from sequence 1 and placed as element 1 in sequence 1-2. The first element in sequence 2, which is a 3, is next selected and placed as the second element in sequence 1-2. The next element of sequence 1-2 is selected from sequence 1, the next element is selected from sequence 2, etc. Once sequence 1-2 has been generated, the position of each element in sequence 1-2 is labeled. The position of elements in sequence 1-2 is labeled in row 1 of table 2. The next step in generating the interleaving sequence, which will be sequence 5 is to multiply each of the elements in sequence 1-2 by the modulo of the sequence being created. In this case, we are creating a modulo-2 sequence and therefore, each of the elements in sequence 1-2 will be multiplied by 2. If a modulo-3 sequence had been created in the multiplication step, the elements would be multiplied by 3 as will be seen later. The multiplication step is a step in which the combined sequences are multiplied by the modulo of the interleaving sequence desired to be created.

This methodology can be extended to any modulo desired. Once the sequence 1-2 elements have been multiplied times 2, the values are placed in row 3 of table 2. The next step is to add to each element, now multiplied by modulo-N (here N equals 2) the modulo-N of the position of the element within the multiplied sequence i.e. the modulo sequence designation. Therefore, in a modulo-2 sequence (such as displayed in table 2) in the 0th position the modulo-2 value of 0 (i.e. a value of 0) is added. To position 1 the modulo-2 value of 1 (i.e. a value of 1) is added, to position 2 the modulo-2 value of 2 (i.e. a value of 0) is added. To position 3 the modulo-2 value of 3 is (i.e. a value of 1) is added. This process continues for every element in the sequence being created. Modulo position number as illustrated in row 4 of table 2 is then added to the modulo multiplied number as illustrated in row 3 of table 2. The result is sequence 5 as illustrated in row five of table 2. Similarly, in table 3, sequence 3 and sequence 4 are interspersed in order to create sequence 3-4. In row 1 of table 4, the position of each element in sequence 3-4 is listed. In row 3 of table 4 each element in the sequence is multiplied by the modulo (in this case 2) of the sequence to be created. Then a modulo of the position number is added to each multiplied element. The result is sequence 6 which is illustrated in row 5 of table 4.

It should be noted that each component sequence in the creation of any modulo interleaver will contain all the same elements as any other component sequence in the creation of a modulo interleaver. Sequence 1 and 2 have the same elements as sequence 3 and 4. Only the order of the elements in the sequence are changed. The order of elements in the component sequence may be changed in any number of a variety of ways. Four sequences have been illustrated as being created through the use of interleaving matrix and a seed sequence, through the use of the inverse interleaving of a seed sequence, through the use of a timed reversed interleaving of a seed sequence and through the use of an inverse of a time interleaved reverse of a seed sequence. The creation of component sequences are not limited to merely the methods illustrated. Multiple other methods of creating randomized and S randomized component sequences are known in the art. As long as the component sequences have the same elements (which are translated into addresses of the interleaving sequence) modulo interleavers can be created from them. The method here described is a method for creating modulo interleavers and not for evaluating the effectiveness of the modulo interleavers. Effectiveness of the modulo interleavers may be dependent on a variety of factors which may be measured in a variety of ways. The subject of the effectiveness of interleavers is one currently of much discussion in the art.

Table 5 is an illustration of the use of sequence 1, 2, and 3 in order to create a modulo-3 interleaving sequence. In row 1 of table 5 sequence 1 is listed. In row 2 of table 5 sequence 2 is listed and in row 3 sequence 3 is listed. The elements of each of the three sequences are then interspersed in row 4 of table 5 to create sequence 1-2-3.

In table 6 the positions of the elements in sequence 1-2-3 are labeled from 0 to 17. Each value in sequence 1-2-3 is then multiplied by 3, which is the modulo of the interleaving sequence to be created, and the result is placed in row 3 of table 6. In row 4 of table 6 a modulo-3 of each position is listed. The modulo-3 of each position listed will then be added to the sequence in row 3 of table 3, which is the elements of sequence 1-2-3 multiplied by the desired modulo, i.e. 3. Sequence 7 is then the result of adding the sequence 1-2-3 multiplied by 3 and adding the modulo-3 of the position of each element in sequence 1-2-3. The resulting sequence 7 is illustrated in table 7 at row 5. As can be seen, sequence 7 is a sequence of elements in which the element in the 0 position mod 3 is 0. The element in position 1 mod 3 is 1. The element in position 2 mod 3 is 2. The element in position 3 mod 3 is 0 and so forth. This confirms the fact that sequence 7 is a modulo-3 interleaving sequence. Similarly, sequence 5 and 6 can be confirmed as modulo-2 interleaving sequences by noting the fact that each element in sequence 5 and sequence 6 is an alternating even and odd (i.e. modulo-2 equals 0 or modulo-2 equals 1) element.

FIG. 14C is a graphical illustration of creating a modulo-4 sequence from four component sequences. In table 7 sequences 1, 2, 3 and 4 from FIG. 14A are listed. The elements of sequence 1, 2, 3 and 4 are then interspersed to form sequence 1-2-3-4.

In table 8 row 1 the positions of each element in sequence 1-2-3-4 are listed. In row 3 of table 8 each element of sequence 1-2-3-4 is multiplied by a 4 as it is desired to create a modulo-4 interleaving sequence. Once the elements of sequence 1-2-3-4 have been multiplied by 4 as illustrated in row 3 of table 8, each element has added to it a modulo-4 of the position number, i.e. the modulo sequence designation of that element within the 1-2-3-4 sequence. The multiplied value of sequence 1-2-3-4 is then added to the modulo-4 of the position in sequence 8 results. Sequence 8 is listed in row 5 of table 8. To verify that the sequence 8 generated is a modulo-4 interleaving sequence each number in the sequence can be divided mod 4. When each element in sequence 6 is divided modulo-4 sequence of 0, 1, 2, 3, 0, 1, 2, 3, 0, 1, 2, 3 etc. results. Thus, it is confirmed that sequence 8 is a modulo-4 interleaving sequence, which can be used to take an input sequence of tuples and create a modulo interleaved sequence of tuples.

Figure 15:
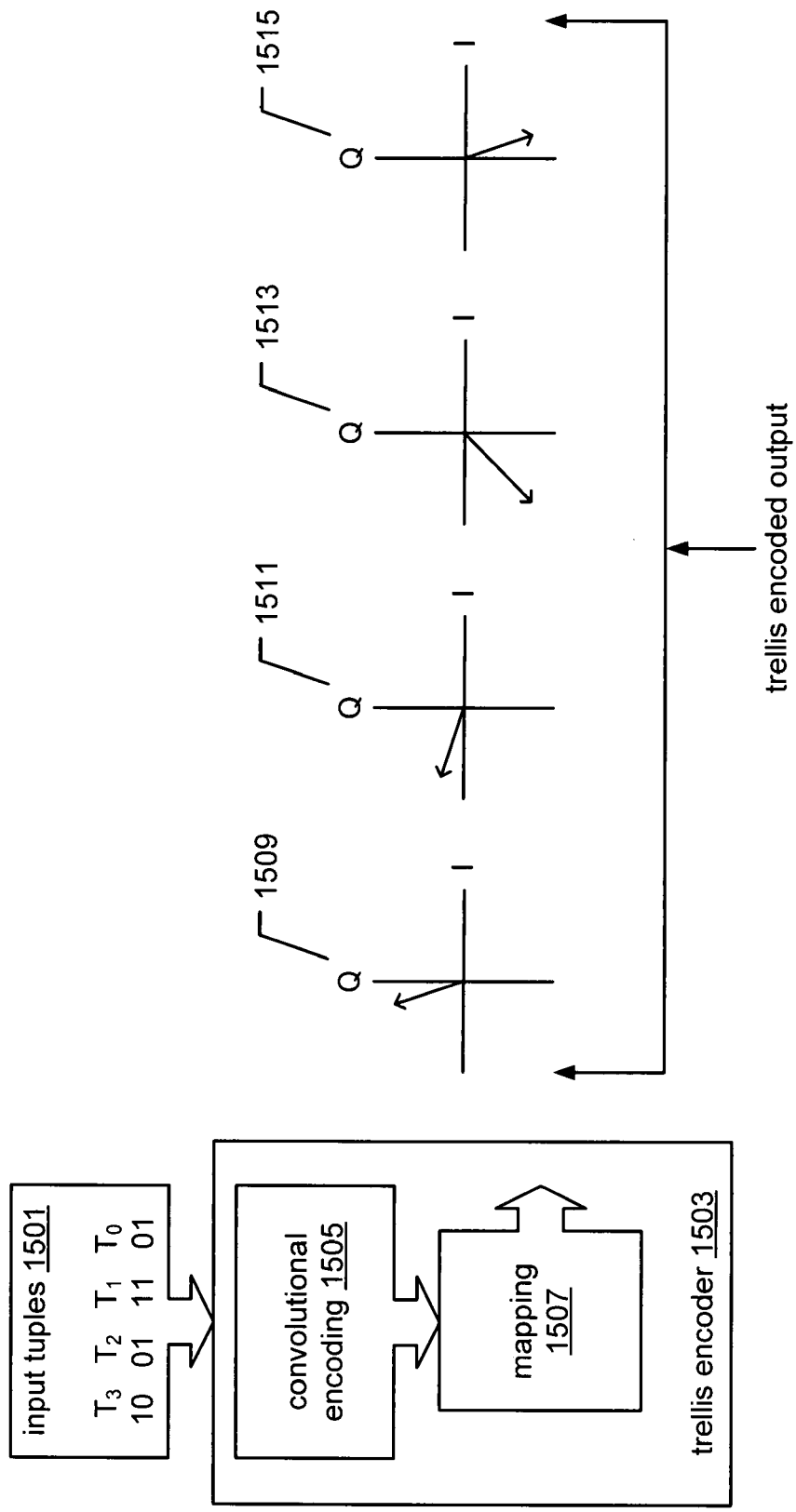
FIG. 15 is a graphical illustration of trellis encoding.

FIG. 15 is a general graphical illustration of trellis-coded modulation (TCM). In FIG. 15, input tuples designated 1501 are coupled into a trellis encoder 1503. Input tuples, for illustration purposes are designated $T_0$, $T_1$, $T_2$ and $T_3$. Within the trellis encoder 1503 the input tuples 1501 are accepted by a convolutional encoder 1505. The input tuples that have been convolutionally encoded are mapped in a mapper 1507. The TCM process yields a signal constellation represented as a set of amplitude phase points (or vectors) on an In phase Quadrature (I-Q) plane. An example of such vectors illustrated at 1509, 1511, 1513, and 1515. The vector represented in the I-Q (In phase and Quadrature) illustration is well known in the art. The process of convolutionally encoding and mapping when taken together is generally referred to as trellis-coded modulation. A similar process called turbo trellis-coded modulation (TTCM) is illustrated in FIG. 16.

Figure 16:
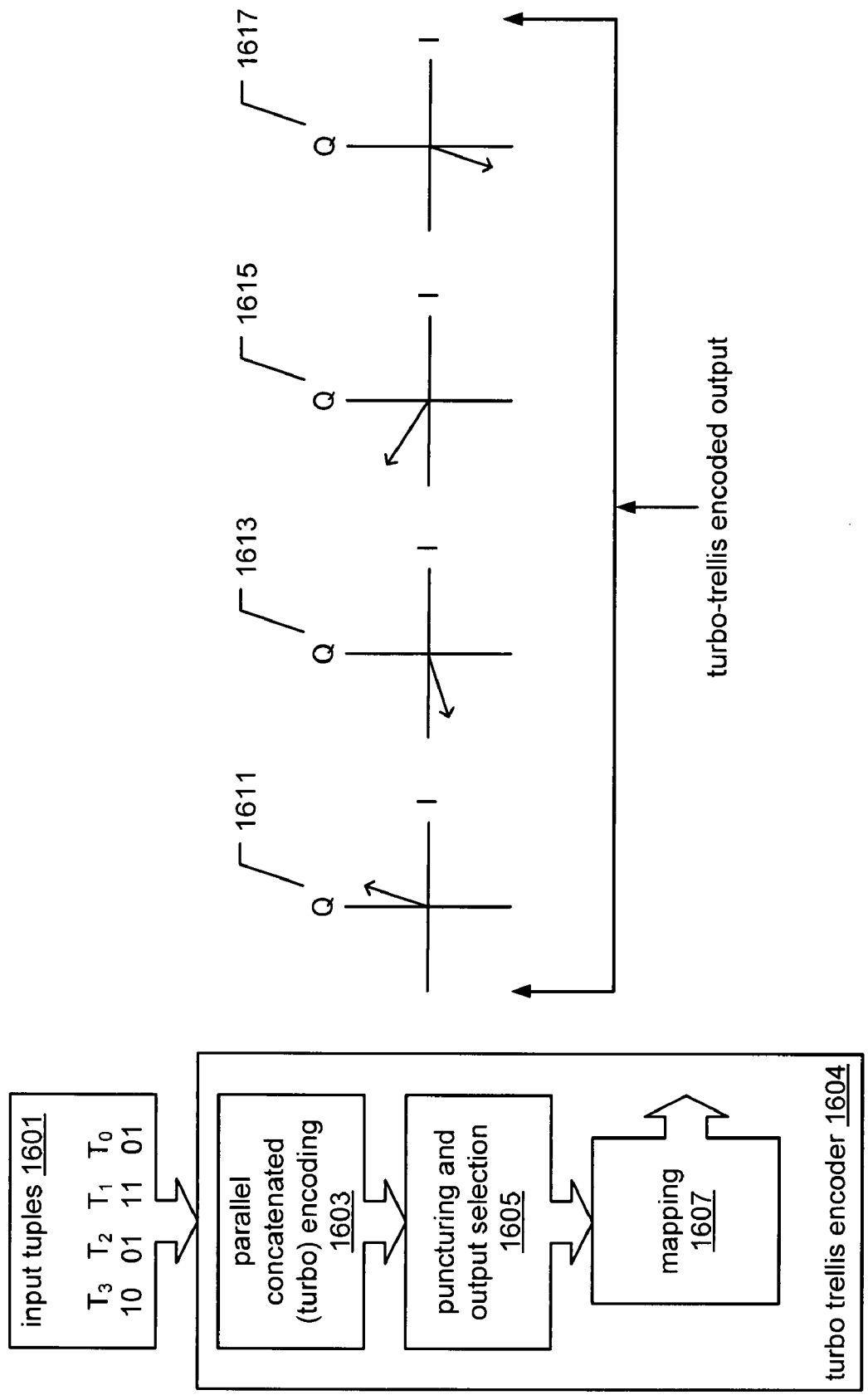
FIG. 16 is a graphical illustration of Turbo Trellis Coded Modulation (TTCM) encoding.

FIG. 16 is a graphical illustration of TTCM (Turbo Trellis Coded Modulation) encoding. In FIG. 16 input tuples 1601 are provided to a parallel concatenated (turbo) encoding module 1603. The parallel concatenated turbo encoding module 1603 may comprise a number of encoders and intereavers. Alternatively, the parallel concatenated encoder 1603 may comprise a minimum of two encoders and one interleaver. The output of the turbo encoder is then provided to an output selection and puncturing module. In module 1605 outputs are selected from the constituent encoders of the module 1603. The selection of outputs of the different encoders is sometimes termed puncturing by various sources in the art, because some of the code bits (or parity bits) may be eliminated). Selection of outputs of the constituent encoders within the present disclosure will be referred to herein as selecting. The term selecting is used because, in embodiments of the present invention, encoded tuples area selected from different encoders, but encoded tuples corresponding to each of the input tuples are represented. For example, there may be an encoder designated the odd encoder from which tuples corresponding to encoded versions of odd input tuples are selected. The other encoder may be termed an even encoder in which the coded versions of the even tuples are selected. This process is termed selecting because even though alternating encoded tuples are selected from different encoders a coded version of each input is represented. That is, in the selection process though some encoded symbols are discarded from one encoder and some encoded symbols are discarded from other constituent encoder(s) the selection and modulo interleaving process is such that encoded versions of all input elements are represented. By modulo encoding and selecting sequentially from all encoders, encoded versions of all input bits are represented. The term puncturing as used herein will be used to describe discarding parts or all of encoded tuples which have already been selected. The selected tuples are provided to a mapping 1607. In embodiments of the present invention the mapping may be dependent on the source of the tuple being mapped. That is, the mapping may be changed for example depending on whether the tuple being mapped has been encoded or not. For example, a tuple from one of the encoders may be mapped in a first mapping. An uncoded tuple which has bypassed the encoder however may be mapped in a second mapping. Combination tuples in which part of the tuple is encoded and part of it is uncoded may also have different mappings. A combination of 3 blocks—block 1603, parallel concatenated encoding, block 1605, output selection and puncturing, and block 1607 mapping comprise what is known as the turbo trellis-coded modulation (TTCM) encoder 1604. The output of the TTCM encoder is a series of constellation vectors as illustrated by examples at 1611, 1613, 1615 and 1617.

Figure 17:
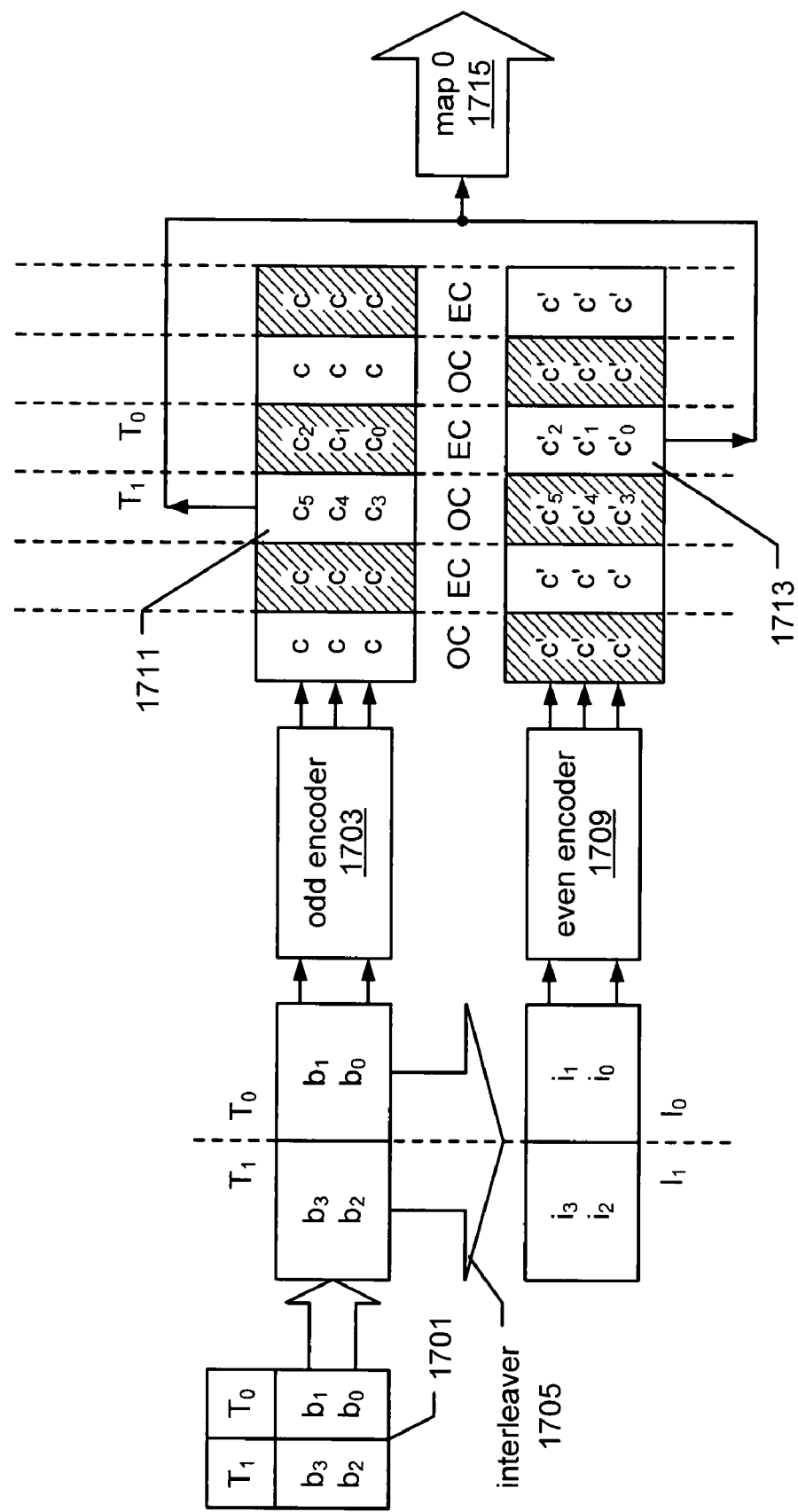
FIG. 17 is a graphical illustration of a rate 2/3 TTCM encoder according to an embodiment of the invention.

FIG. 17 is a graphical illustration of a rate 2/3 encoder according to an embodiment of the invention. In FIG. 17, input tuples $T_0$ and $T_1$ represented at 1701 are provided to odd encoder 1703. Tuple $T_0$ comprises bits, $b_0$ and $b_1$ tuple $T_1$ comprises bits $b_2$ and $b_3$. The input tuples $T_0$ and $T_1$ are also provided to an interleaver 1705. Interleaver 1705 accepts input tuples (such as $T_0$ and $T_1$) and after interleaving, provides the interleaved tuples to the even encoder 1709. When odd encoder 1703 is accepting tuple $T_0$, comprising bits $b_0$ and $b_1$, even encoder 1709 is accepting an interleaved tuple comprising bits $i_0$, and $i_1$. Similarly, when odd encoder 1703 is accepting tuple $T_1$ comprising bits $b_2$ and $b_3$ even encoder 1709 is accepting an interleaved tuple comprising bits $i_2$ and $i_3$. At each encoder clock (EC) both encoders accept an input tuple. The interleaver 1705 is a modulo-2 (even/odd) ST interleaver. Each encoder accepts every input tuple. The even/odd designation refers to which encoded tuple is selected to be accepted by the mapper 1715. By maintaining an even/odd interleaving sequence and by selecting encoded tuples alternatively from one then the other encoder, it can be assured that an encoded version of every input tuple is selected and passed on to the mapper 1715. For example, the encoded tuple 1711, comprising bits $c_3$ and $c_4$, and $c_5$ and corresponding to tuple $T_1$ is selected and passed onto mapper 1715, which maps both even and odd selections according to map 0.

The encoded tuple $c_0$, $c_1$ and $c_2$, corresponding to input tuple $T_0$ is not selected from the odd encoder 1703. Instead, the tuple comprising bits $c'_0$, $c'_1$, and $c'_2$, which corresponds to the interleaved input $i_0$ and $i_1$ is selected and passed on to mapper 1715, where it is mapped using map 0.

Accordingly, all the components of each tuple are encoded in the odd encoder and all components of each tuple are also encoded in the even encoder. However, only encoded tuples corresponding to input tuples having an odd modulo sequence designation are selected from odd encoder 1703 and passed to the mapper 1715. Similarly only encoded tuples corresponding to input tuples having an even modulo sequence designation are selected from even encoder 1709 and passed to mapper 1715. Therefore, the odd and even designation of the encoders designate which tuples are selected from that encoder for the purposes of being mapped.

Both encoder 1703 and 1709 in the present example of FIG. 17 are convolutional, nonsystematic, recursive encoders according to FIG. 5. Although only encoded versions of odd tuples are selected from encoder 1703, and only encoded versions of even tuples are selected from encoder 1709, because both encoders have memory, each encoded output tuple not only contains information from the tuple encoded, but also from previous tuples.

The even/odd encoder of FIG. 17 could be modified by including modulo-N interleaving, modulo-N interleaving could be accomplished by adding the appropriate number of both interleavers and encoders, to form a modulo-N TTCM encoder. Additionally, other configurations may be possible. For example, interleaver 1705 may be a ST interleaver. As an alternate another interleaver may be added prior to odd encoder 1703. For example, if a bit interleaver, to separate the input tuple bits were added prior to encoder 1703, and interleaver 1705 were an IT interleaver, the overall effect would be similar to specifying interleaver 1705 to be an ST interleaver.

Both encoders 1703 and 1709 are rate 2/3 encoders. They are both nonsystematic convolutional recursive encoders but are not be limited to such.

The overall TTCM encoder is a 2/3 encoder because both the odd encoder 1703 and the even encoder 1709 accept an input tuple comprising 2 bits and output an encoded output tuple comprising 3 bits. So even though the output to mapper 0 switches between even and odd encoders, both encoders are rate 2/3 and the overall rate of the TTCM encoder of FIG. 17 remains at 2/3.

Figure 18A:
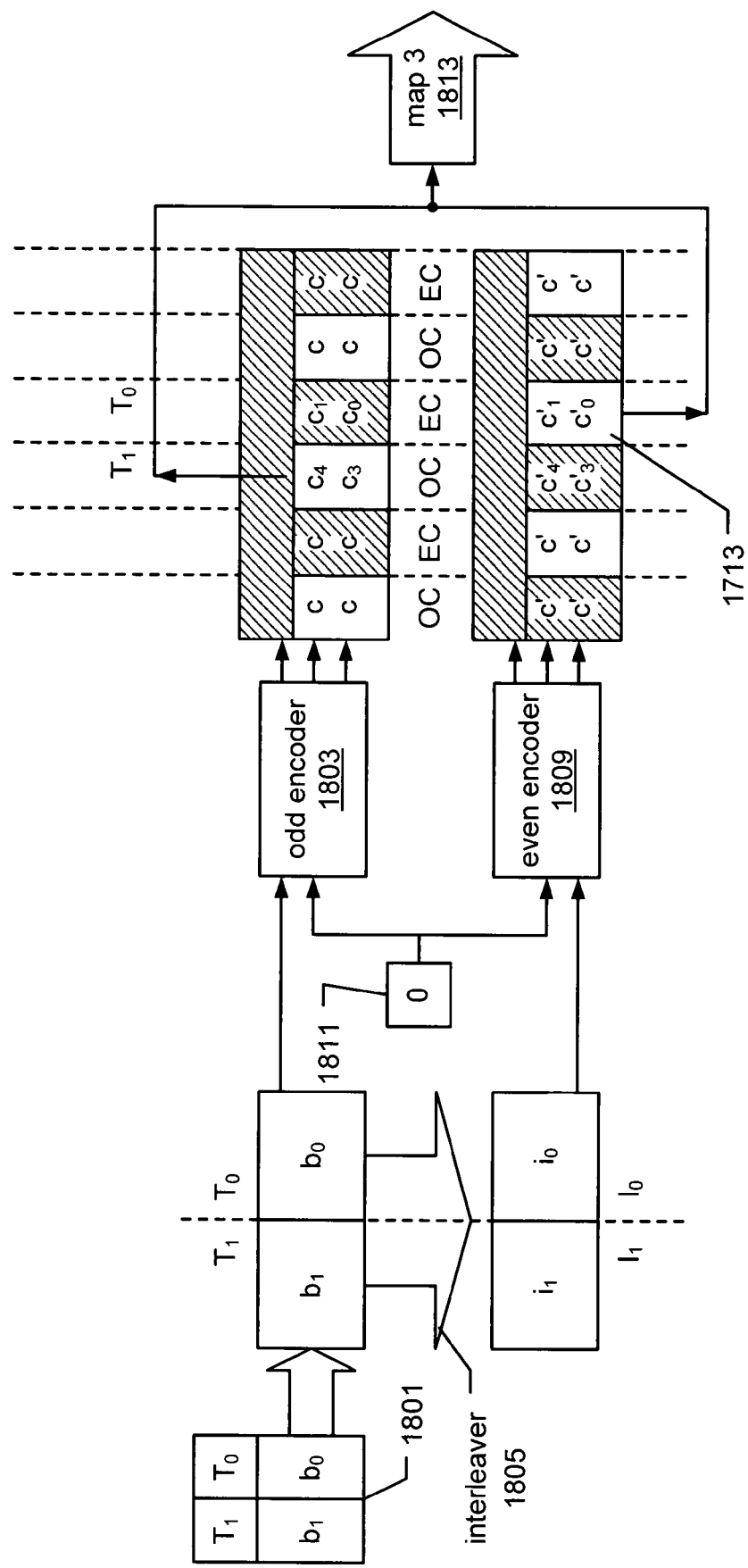
FIG. 18A is a graphical illustration of a rate 1/2 TTCM encoder, with constituent 2/3 rate encoders, according to an embodiment of the invention.
Figure 18C:
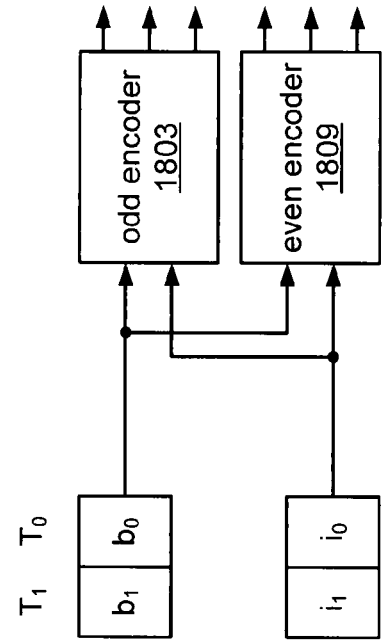
FIG. 18C is a graphical illustration of alternate configurations of the rate 1/2 TTCM encoder illustrated in FIG. 18A.
Figure 18E:
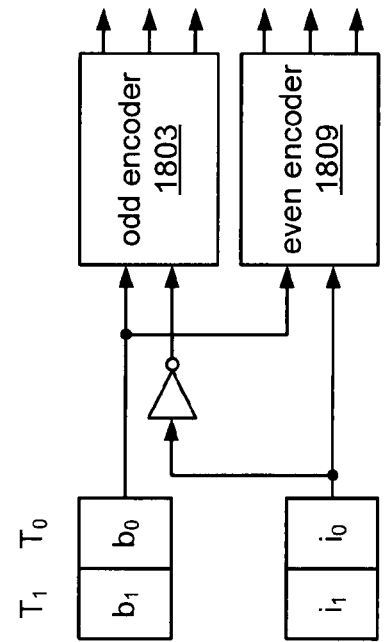
FIG. 18E is a graphical illustration of alternate configurations of the rate 1/2 TTCM encoder illustrated in FIG. 18A.
Figure 18B:
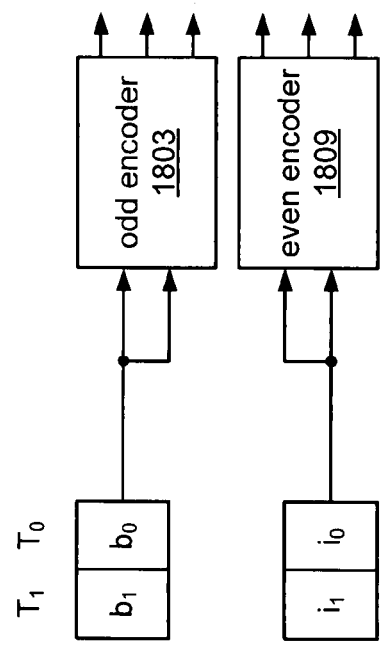
FIG. 18B is a graphical illustration of alternate configurations of the rate 1/2 TTCM encoder illustrated in FIG. 18A.
Figure 18D:
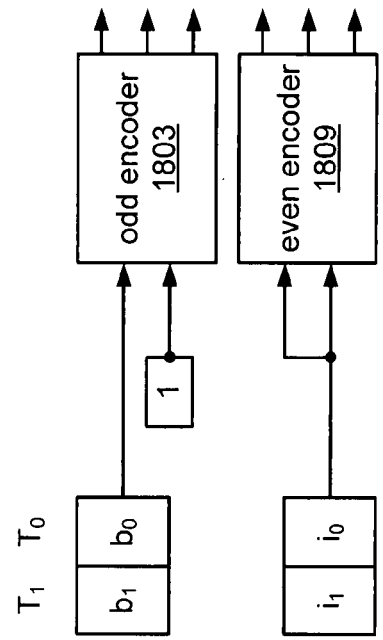
FIG. 18D is a graphical illustration of alternate configurations of the rate 1/2 TTCM encoder illustrated in FIG. 18A.

FIG. 18A is a graphical illustration of a rate 1/2 TTCM encoder implemented using the constituent rate 2/3 base encoders, according to an embodiment of the invention. In FIG. 18A, exemplary input tuples $T_0$ and $T_1$ are provided to the TTCM encoder 1800. The $T_0$ tuple comprises a single bit $b_0$ and the $T_1$ tuple comprises a single bit $b_1$. $b_0$ and $b_1$ corresponding to tuples $T_0$ and $T_1$ are provided to odd encoder 1803. Both $b_0$ and $b_1$ are also provided to interleaver 1805. At the time when odd encoder 1803 is accepting $b_0$ even encoder is accepting $i_0$. $i_0$ is an output of the interleaver 1805. Similarly, $i_1$ is a output of interleaver 1805 that is provided to even encoder 1809 at the same time that bit $b_1$ is provided to odd encoder 1803. The interleaver 1805 is an odd/even interleaver (modulo-2). In such a manner when an odd tuple is being provided to odd encoder 1803, an interleaver odd tuple is being provided to even encoder 1809. When an even tuple is being provided to odd 1803, an even interleaved tuple is being provided to even encoder 1809. In order to achieve a rate 1/2 code from rate 2/3 constituent encoders, in addition to an input comprising a single input bit, a constant bit value provided to 1811 is a second input of each of the constituent rate 2/3 encoders 1803 and 1809. In FIG. 18A the input bit is shown as being a 0 but could just as easily be set to a constant value of 1. Additionally, each encoder input bit might be inputted twice to the odd encoder 1803 and the even encoder 1809 as illustrated in FIG. 18B. Multiple other configurations are possible. For example both encoders might receive both input tuples as illustrated in FIG. 18C, or one of the inputs might be inverted as in FIG. 18E. Additionally hybrid combinations, such as illustrated in FIG. 18D are possible.

Figure 24:
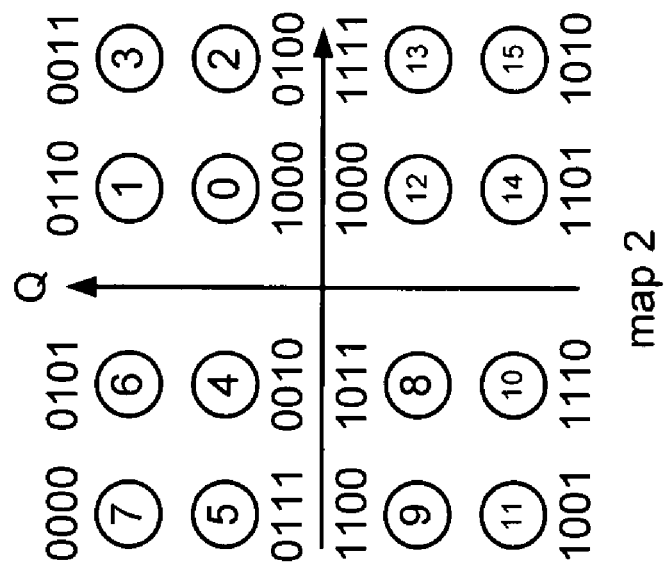
FIG. 24 is a graphical illustration of map 2 according to an embodiment of the invention.
Figure 25:
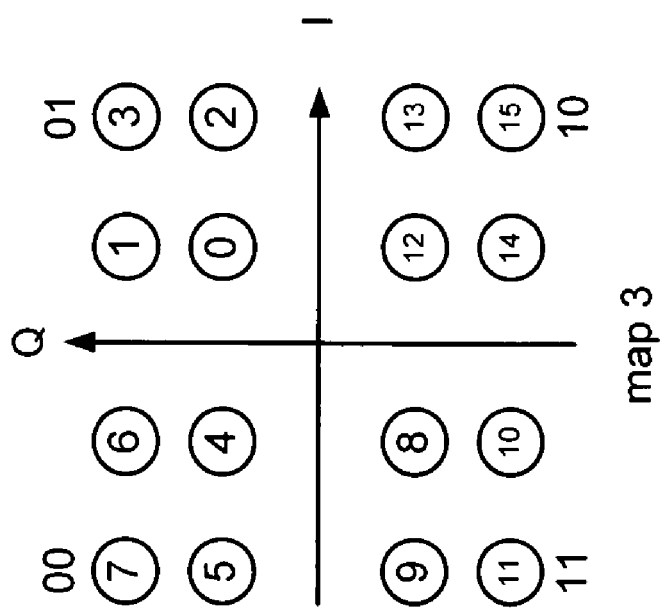
FIG. 25 is a graphical illustration of map 3 according to an embodiment of the invention.

The output of odd encoder 1803, which corresponds to input tuple $T_0$, comprises bits $c_0$, $c_1$, $c_2$. The output tuple of odd encoder 1803 corresponding to tuple $T_1$ comprises bits $c_3$, $c_4$, and $c_5$. At encoder clock $EC_0$ the even encoder 1809 has produced an encoded output tuple having bits $c'_0$, $c'_1$ and $c'_2$. One of the three encoded bits, in the present illustration $c'_2$, is punctured i.e. dropped and the remaining 2 bits are then passed through to mapper 1813. During the odd encoder clock $OC_1$ two of three of the encoded bits provided by odd encoder 1803 are selected and passed to mapper 1813. Output bit $c_4$ is illustrated as punctured, that is being dropped and not being passed through the output mapper 1813. Mapper 1813 employs map number 3 illustrated further in FIG. 24. For each encoder clock a single input tuple comprising 1 bit is accepted into the TTCM encoder 1800. For each clock a 2-bit encoded quantity is accepted by mapper 1813. Because for each one bit provided to the encoder, 2 bits are outputted, therefore the encoder is a rate 1/2 encoder. The odd and even encoders in the present embodiment are nonsystematic, convolutional, recursive encoders, but are not limited to such. The encoders may be any combination, for example such as systematic, block encoders. Interleaver 1805 is an odd/even interleaver and so odd output tuples are accepted by the mapper 1813 from odd encoder 1803 and even encoded tuples are accepted by the mapper 1813 from even encoder 1809. In such a manner, all input tuples are represented in the output accepted by mapper 1813, even though some of the redundancy is punctured. Mapper 1813 utilizes map 3 as illustrated in FIG. 25 for use by rate 1/2 TTCM encoder 1800.

Figure 19:
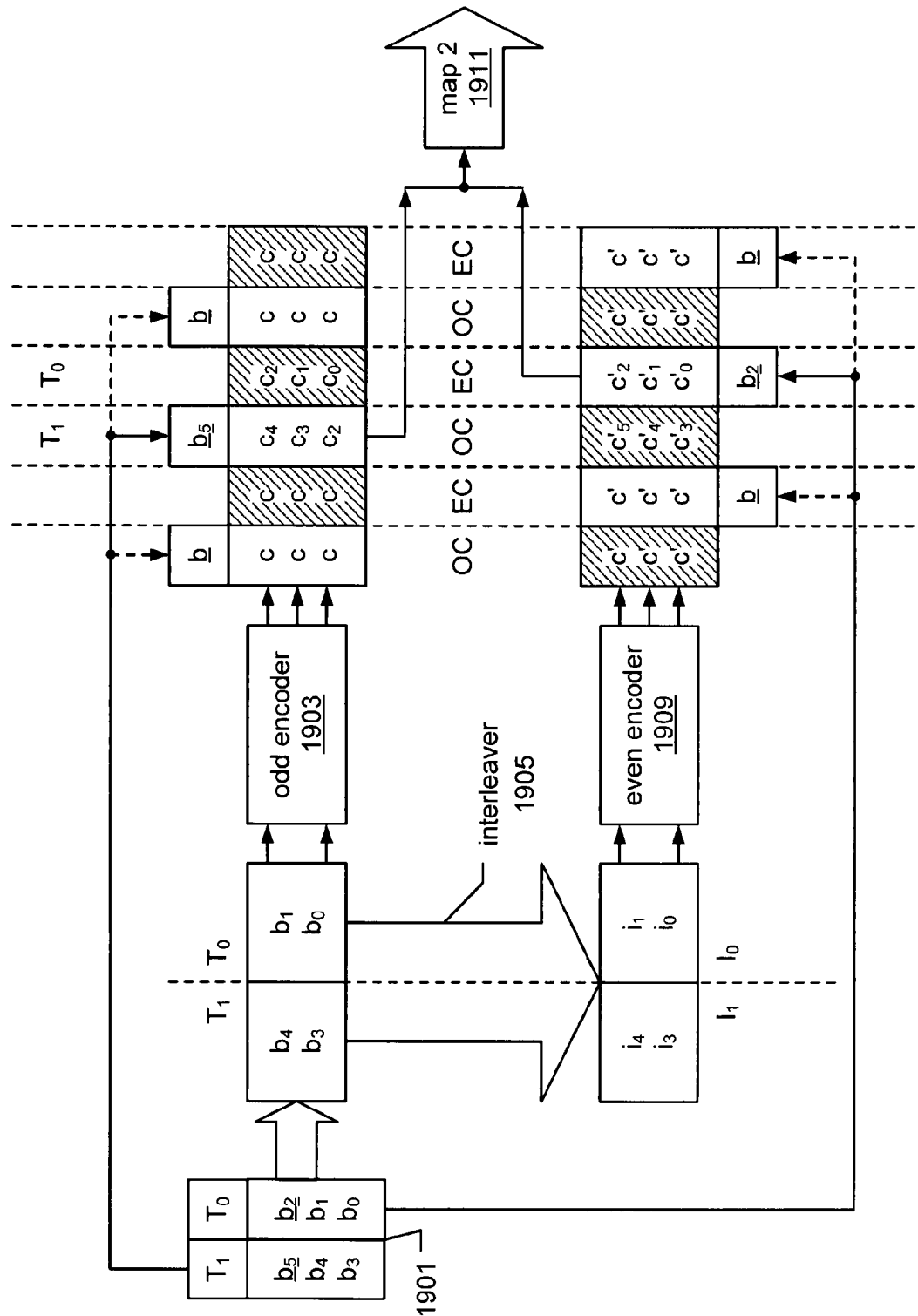
FIG. 19 is a graphical illustration of a rate 3/4 TTCM encoder, with constituent 2/3 rate encoders, according to an embodiment of the invention.

FIG. 19 is a graphical illustration of a rate 3/4 TTCM encoder, having constituent 2/3 rate encoders, according to an embodiment of the invention. In FIG. 19 the input tuples $T_0$ and $T_1$, illustrated at 1901, comprise 3 bit input tuples. Input tuple $T_0$ comprises bits $b_0$, $b_1$ and $b_2$. Input tuple $T_1$ comprises bits $b_3$, $b_4$ and $b_5$. Bit $\underline{b_2}$ of input tuple $T_0$ is underlined as is $\underline{b_5}$ of input tuple $T_1$. Bits $\underline{b_2}$ and $\underline{b_5}$ are underlined because neither of these bits will pass through either encoder. Instead, these bits will be concatenated to the output of the even or odd encoder and the resulting in a 4 bit tuple provided to mapper 1911. $b_0$ and $b_1$ of input tuple $T_0$ are provided to odd encoder 1903. At the same time that $b_0$ and $b_1$ are being accepted by the odd encoder 1903, interleaved bits $i_0$ and $i_1$ are being accepted by even encoder 1909. Interleaver 1905 is an odd/even (module-2) type interleaver. The encoders illustrated at 1903 and 1909 are the encoders illustrated in FIG. 5. Encoders 1903 and 1909 are the same as the encoders illustrated at 1803 and 1809 in FIG. 18, 1703 and 1709 in FIG. 17 and as will be illustrated at 2003 and 2009 in FIG. 20A and 2103 and 2109 in FIG. 21A In other words, the odd encoder and even encoder are rate 2/3, nonsystematic, convolutional recursive encoders. Other types of encoders may however be used, and types may be mixed and matched as desired.

FIG. 17 through 21 are encoding arrangements that utilize the same basic encoder as illustrated in FIG. 5. In FIG. 19, encoders 1903 and 1909 are illustrated as separate encoders for conceptual purposes. Those skilled in the art will realize that a single encoder may be used and may be time-shared. FIG. 17 through FIG. 21 are conceptual type FIGURES and are FIGURES that represent general concepts. They depict the general concept accurately regardless of the particular implementation of circuitry chosen. In the rate 3/4 encoder of FIG. 19, the input tuples $T_0$, $T_1$ (and all other input tuples to the encoder of FIG. 19) comprise 3 bits. Since encoders 1903 and 1909 are rate 2/3 encoders with 2 input bits, then only 2 bits can be accommodated at a particular time. Accordingly, bit $\underline{b_2}$ of tuple $T_0$ and bit $\underline{b_5}$ of tuples $T_1$ bypass the encoders completely. $\underline{b_5}$ is concatenated to the output of odd encoder 1903, i.e. $c_3$, $c_4$ and $c_5$ the combination of encoder tuple $c_3$, $c_4$, $c_5$ and $\underline{b_5}$ are then provided to mapper 1911 which maps the output according to map 2. Map 2 is illustrated in FIG. 24. Similarly, the output of even encoder 1909, comprising encoded bits $c'_0$, $c'_1$, and $c'_2$, is combined with bit $\underline{b_2}$ of input tuple $T_0$ and then the combination of $\underline{b_2}$, $c'_0$, $c'_1$, $c'_2$ is provided to mapper 1911. In such a way the three bits of encoded tuples are converted into four bits for mapping in mapper 1911. The four bits mapped comprise the three encoded bits from either the odd or even encoder plus a bit from the input tuple which has by passed both encoders.

Figure 20A:
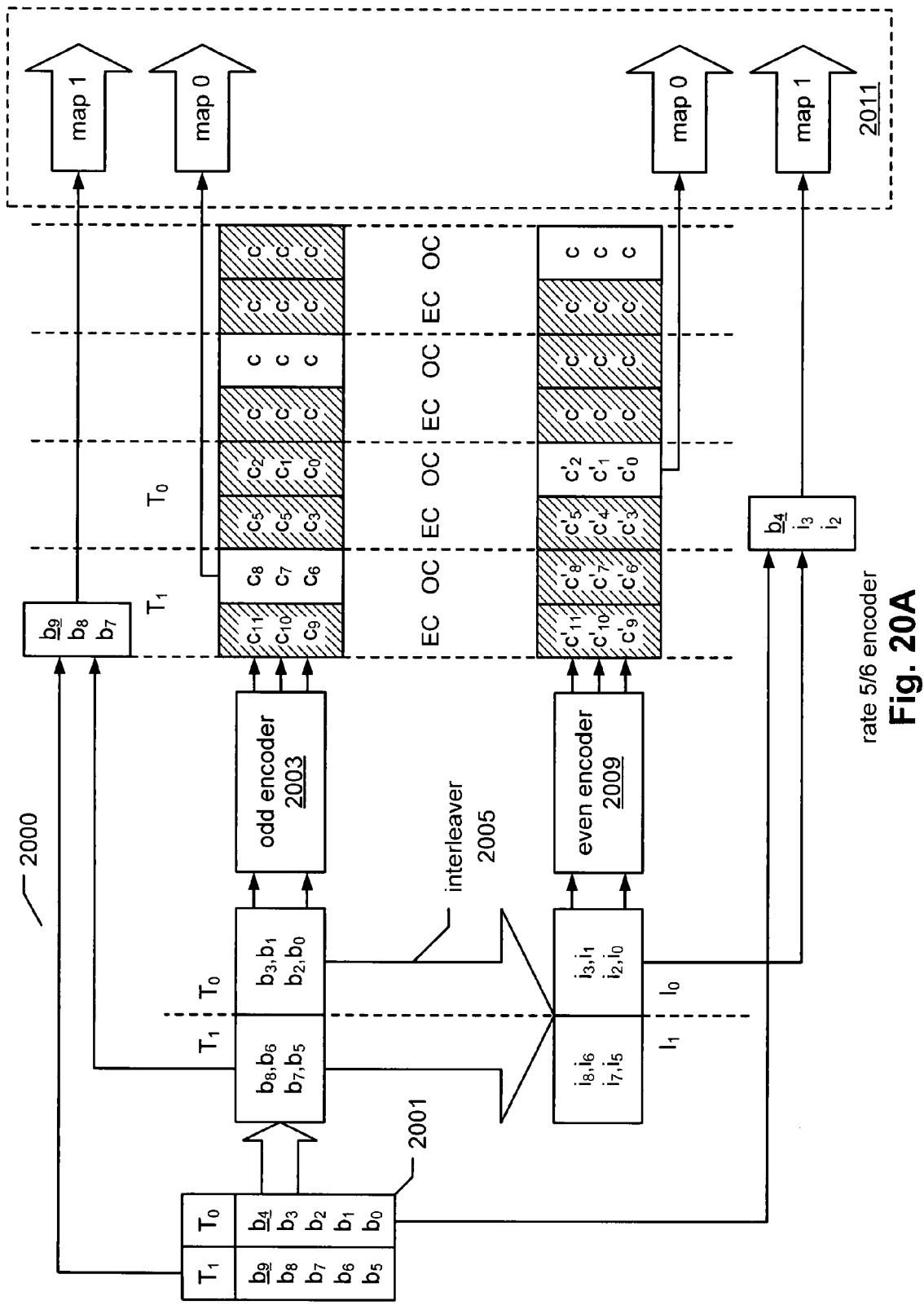
FIG. 20A is a graphical illustration of a rate 5/6 TTCM encoder, with constituent 2/3 rate encoders, according to an embodiment of the invention.

FIG. 20A is a graphical illustration of a rate 5/6 TTCM encoder, having constituent 2/3 rate basic encoders, according to an embodiment of the invention. In FIG. 20A the input tuples $T_0$ and $T_1$ are illustrated at 2001. Input tuple $T_0$ comprises five bits, $b_0$ through $b_4$. Input tuple $T_1$ also comprises five bits, $b_5$ through $b_9$. $\underline{b_4}$ of tuple $T_0$ and $\underline{b_9}$ of tuple $T_1$ are underlined to illustrate that they do not pass through either encoder. The odd encoder 2003 accepts $b_0$ and $b_1$ during a first encoder clock time during which even encoder 2009 is accepting interleaved bits $i_0$ and $i_1$. Bits $i_0$ and $i_1$ are the outputs of the interleaver 2005 that correspond to the same time during which inputs $b_0$ and $b_1$ are accepted from the odd encoder. Similarly, the odd encoder 2003 is accepting bits $b_2$ and $b_3$ at a time when the even encoder 2009 is accepting bits $i_2$ and $i_3$. Similarly, input tuple $T_1$, is separated into 2 bit encoder input tuples because the constituent encoders are rate 2/3 encoders which accept 2 bits input and produce three encoded bits out. Because each input tuple 2001 is five bits and because each encoder allows only a 2 bit input, input tuple $T_0$ is separated into encoder tuple $b_0$ and $b_1$ and encoder tuple $b_2$ and $b_3$. The encoder therefore, must process two encoder input tuples for each input tuple 2001. Therefore, a single input tuple 2001 will require two encoder clocks for processing. The even encoder 2009 encodes tuple $i_0$ and $i_1$ and produces corresponding output code bits $c'_0$, $c'_1$ and $c'_2$ After processing $i_0$ and $i_1$ the even encoder 2009 processes $i_2$ and $i_3$. The output of even encoder 2009, which corresponds to input bits $i_2$ and $i_3$ is $c'_3$, $c'_4$ and $c'_5$. The odd encoder 2003 processes a first tuple $b_0$ and $b_1$, and then processes a second tuple $b_2$ and $b_3$. Tuple $b_0$ and $b_1$ are accepted by encoder 2003 which produces a corresponding encoded 3 bit tuple $c_0$, $c_1$ and $c_2$. After accepting $b_0$ and $b_1$, the odd encoder 2003 accepts second tuple $b_2$ and $b_3$ and produces a corresponding output $c_3$, $c_4$, and $c_5$. Encoder output $c'_0$, $c'_1$ and $c'_2$ corresponding to encoder tuple $i_1$ and $i_0$ are provided to mapper 2011. Mapper 2011 uses map 0 to map $c'_0$, $c'_1$ and $c'_2$. Subsequently to producing $c'_0$, $c'_1$ and $c'_2$ even encoder 2009 accepts $i_2$ and $i_3$ and produces output $c_3$, $c_4$, and $c_5$. Instead of selecting $c_3$, $c_4$, $c_5$ to be mapped, uncoded bit $\underline{b_4}$ is combined with interleaved bits $i_2$ and $i_3$ and selected. $i_2$, $i_3$ and $\underline{b_4}$ are then accepted by mapper 2011, which employs map 1 to map bits $i_2$, $i_3$ and $\underline{b_4}$. Therefore, with respect to the overall input tuple $T_0$ five bits are input into the TTCM encoder 2000 and six bits are passed to mapper 2011. In other words, a coding rate of 5/6 is generated. Similarly, odd encoder 2003 encodes bits $b_5$ and $b_6$ and produces coded bits $c_6$, $c_7$ and $c_8$. Subsequently odd encoder 2003 encodes bits $b_7$ and $b_8$ and produces coded bits $c_9$, $c_{10}$ and $c_{11}$. $c_6$, $c_7$ and $c_8$ are passed to the encoder 2001 as is where they are mapped using map 0. Encoded bit $c_9$, $c_{10}$ and $c_{11}$, however, are punctured, i.e. they are dropped and instead bits $b_7$, $b_8$ and $\underline{b_9}$ are substituted. $b_7$, $b_8$ and $\underline{b_9}$ are passed to encoder 2011 which uses map 1 to map $b_7$, $b_8$, and $\underline{b_9}$. A graphical illustration of map 0 can be found in FIG. 22 and a graphical illustration of Map 1 can be found in FIG. 23. In the manner just described, a rate 5/6 TTCM encoder is realized from two component rate 2/3 encoders. Interleaver 2005 is similar to interleaver 1705, 1805, 1905, 2005 and 2105 which also are even/odd or modulo-2 type interleavers. Other modulo interleavers, just as with all other embodiments illustrated in FIG. 17 through FIG. 21, can be realized by adding additional interleavers and encoders and by selecting outputs and uncoded bits in a straight format manner similar to that illustrated in FIG. 20A.

FIG. 20B represents an alternate encoding that will yield the same coding rate as FIG. 20A.

FIG. 21A is a graphical illustration of a rate 8/9 TTCM encoder realized using constituent rate 2/3 encoder, according to an embodiment of the invention. To illustrate the functioning of TTCM rate 8/9 encoder 2100 two sequential input tuples $T_0$ and $T_1$, illustrated at 2101, will be considered. Since the constituent encoders are rate 2/3 having two bits as input and three bits as output, the input tuples will have to be subdivided into encoder tuples. In other words, the input tuples will be divided into tuple pairs which can be accepted by odd encoder 2103 and even encoder 2109. Odd encoder 2103 accepts tuple pair $b_0$ and $b_1$, pair $b_2$ and $b_3$, pair $b_4$ and $b_5$, pair $b_8$ and $b_9$, pair $b_{10}$ and $b_{11}$, and pair $b_{12}$ and $b_{13}$ sequentially, since the basic 2/3 rate encoder can only accept one pair of input bits at a time. Even encoder correspondingly accepts input pairs $i_0$ and $i_1$, input pair $i_2$ and $i_3$, input pair $i_4$ and $i_5$, input pair $i_8$ and $i_9$, input pair $i_{10}$ and $i_{11}$, and input pair $i_{12}$ and $i_{13}$ sequentially. The pairs accepted by the even encoder correspond to tuple pairs having the same numbering accepted by the odd encoder at the same time. That is $i_0$ and $i_1$ are accepted by the even encoder 2109 during the same time period as input pair $b_0$ and $b_1$ is accepted by the odd encoder 2103. Odd and even encoders then produce encoded outputs from the input pairs accepted. Even encoder 2909 produces a first encoded output triplet $c'_0$, $c'_1$ and $c'_2$ followed by a second output triplet $c'_3$, $c'_4$ and $c'_5$ followed by a third output triplet $C'_6$, $c'_7$ and $c'_8$ (a triplet is a 3 bit tuple). The first output triplet $c'_0$, $c'_1$ and $c'_2$ is accepted by the mapper 2111. The mapper 2111 utilizes map 0 to map encoded output $c'_0$, $c'_1$ and $c'_2$. Encoded output bits $c'_3$, $c'_4$ and $c'_5$ however are punctured, that is not sent to the mapper. Instead of sending $c'_3$, $c'_4$ and $c'_5$ to the mapper 2111 the triplet of bits comprising $i_2$, $i_3$ and $\underline{b}_6$ are sent to the mapper 2111. The mapper 2111 utilizes map 1 as the mapping for the triplet $i_2$, $i_3$, $\underline{b}_6$. Encoded triplet $c'_6$, $c'_7$ and $c'_8$ is also punctured. That is, it is not sent to the mapper 2111. Instead, $i_4$, $i_5$ and $\underline{b}_7$ is sent to the mapper 2111 which uses map 1 to map input triplet $i_4$, $i_5$ and $\underline{b}_7$. Because eight bits corresponding to tuple $T_0$ are accepted by the even encoder 2109 and nine bits are output into the mapper 2111 the overall encoder 2100 is a rate 8/9 encoder. Similarly, input tuple $T_1$ is encoded by the odd encoder 2103. The output triplet from the odd encoder $c_9$, $c_{10}$ and $c_{11}$ corresponds to input tuple $b_8$ and $b_9$. Next, odd encoder 2103 produces an encoded output triplet $c_{12}$, $c_{13}$ and $c_{14}$, which is an output triplet corresponding to input pair $b_{10}$ and $b_{11}$. Subsequently odd encoder 2103 produces output triplet $c_{15}$, $c_{16}$ and $c_{17}$. Output triplet $c_{15}$, $c_{16}$ and $c_{17}$ corresponds to input pair $b_{12}$ and $b_{13}$. Output triplet $c_9$, $c_{10}$ and $c_{11}$ are sent to the mapper 2111 which uses map 0 to map output triplet $c_9$, $c_{10}$ and $c_{11}$. Output triplet $c_{12}$, $c_{13}$ and $c_{14}$ however is punctured and in its place $b_{10}$, $b_{11}$ and $\underline{b}_{14}$ is sent to mapper 2111 where map 1 is employed to map the input triplet $b_{10}$, $b_{11}$ and $\underline{b}_{14}$. The encoder triplet $c_{15}$, $c_{16}$ and $c_{17}$ is also punctured and a triplet comprising $b_{12}$, $b_{13}$ and $\underline{b}_{15}$ is provided to mapper 2111. Map 1 is used to map the input triplet $b_{12}$, $b_{13}$ and $\underline{b}_{15}$. In the manner just described an 8/9 encoder is fabricated from two constituent rate 2/3 encoder.

From the foregoing TTCM encoder examples of FIG. 17 through FIG. 21 it is seen that the basic rate 2/3 encoders can be used in a variety of configurations to produce a variety of coding rates.

The basic constituent encoders illustrated in FIG. 17 through FIG. 21 are rate 2/3, nonsystematic, convolutional recursive encoders. These illustrations represent a few examples. Different types of encoders and even different rates of encoders may yield many other similar examples. Additionally, encoder types can be mixed and matched; for example, a recursive nonsystematic convolution encoder may be used with a nonrecursive systematic block encoder.

Additionally, the interleavers illustrated in FIG. 17 through FIG. 21 are modulo-2 (even/odd) ST interleavers. Those skilled in the art will realize that IT type interleavers may be used alternatively in the embodiments of the invention illustrated in FIG. 17 through FIG. 21.

Additionally the TTCM encoders illustrated in FIG. 17 through FIG. 21 may employ modulo-N encoding systems instead of the modulo-2 (even/odd) encoding systems illustrated. For example, each of the constituent encoder—modulo-2 interleaver subsystems may be replaced by modulo-N subsystems such as illustrated in FIG. 8A. By maintaining the same type puncturing and selecting with each encoder as displayed with the even/odd encoders of FIG. 17 through FIG. 21 and extending it to modulo-N systems, such as illustrated in FIG. 8A, the same coding rates can be maintained in a modulo-N system for any desired value N.

Figure 21B:
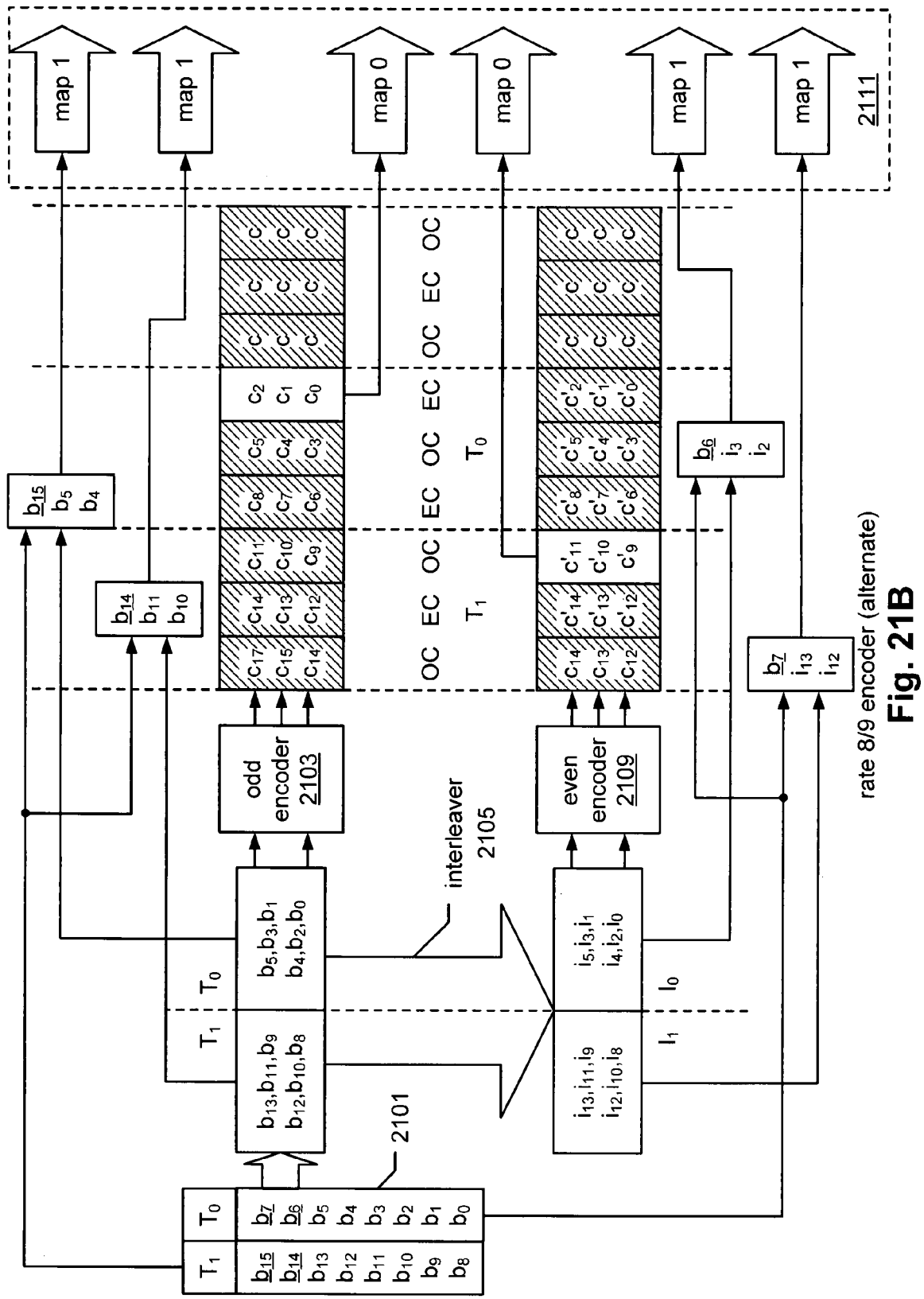
FIG. 21B is a graphical illustration which represents an alternate encoding that will yield the same coding rate as FIG. 21A.

FIG. 21B represents an alternate encoding that will yield the same coding rate as FIG. 21A.

Figure 22:
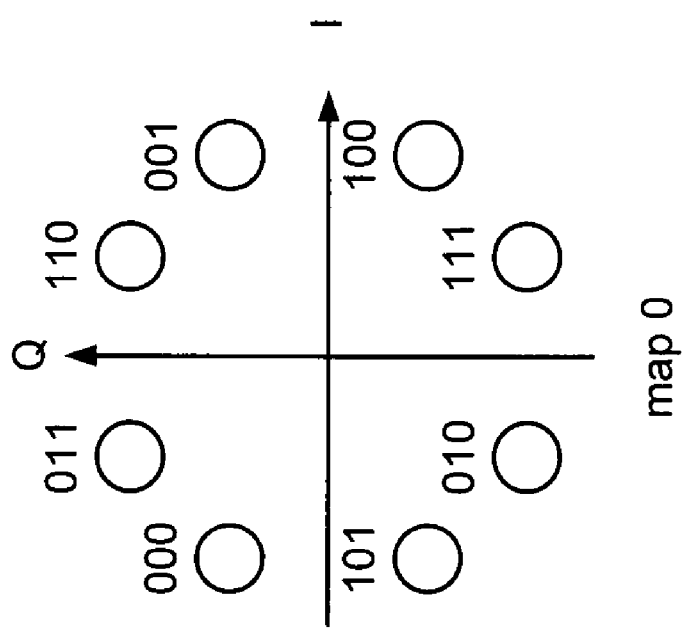
FIG. 22 is a graphical illustration of map 0 according to an embodiment of the invention.

FIG. 22 is a graphical illustration of map 0 according to an embodiment of the invention. Map 0 is used in the implementation of the rate 2/3 encoder as illustrated in FIG. 17. Map 0 is also utilized in rate 5/6 encoder illustrating in FIG. 20A and rate 8/9 encoder illustrated in FIG. 21A.

Figure 23:
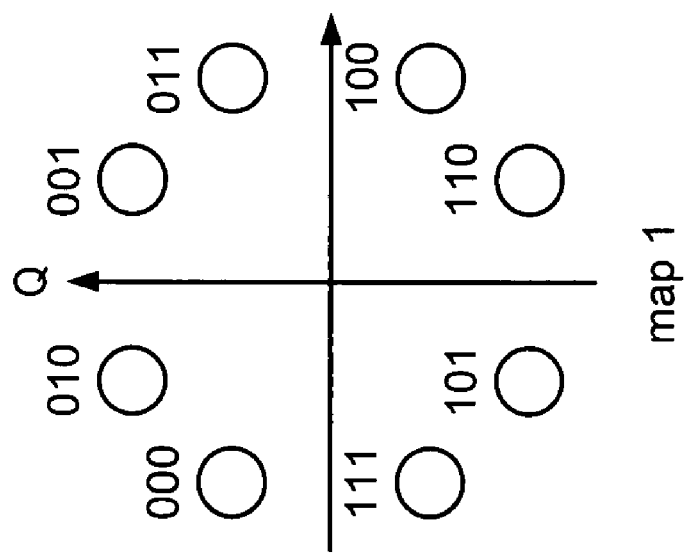
FIG. 23 is a graphical illustration of map 1 according to an embodiment of the invention.

FIG. 23 is a graphical illustration of map 1 according to an embodiment of the invention. Map 1 is used by the mapper in the rate 5/6 encoder in FIG. 20A, and in the mapper in the rate 8/9 encoder in FIG. 21A.

FIG. 24 is a graphical illustration of map 2 according to an embodiment of the invention. Map 2 is utilized in the fabrication of the rate 3/4 encoder as illustrated in FIG. 19.

FIG. 25 is a graphical illustration of map 3 according to an embodiment of the invention. Map 3 is used in the rate 1/2 encoder as depicted in FIG. 18.

Maps 0 through 3 are chosen through a process different from the traditional approach of performing an Ungerboeck mapping (as given in the classic work "Channel Coding with Multilevel/Phase Signals" by Gottfried Ungerboeck, IEEE Transactions on Information Theory Vol. 28 No. 1 January 1982). In contrast in embodiments of the present invention, the approach used to develop the mappings was to select non Ungerboeck mappings, then to measure the distance between the code words of the mapping. Mappings with the greatest average effective distance are selected. Finally the mappings with the greatest average effective distance are simulated and those with the best performance are selected. Average effective distance is as described by S. Dolinar and D. Divsalar in their paper "Weight Distributions for Turbo Codes Using Random and Non-Random Permeations," TDA progress report 42-121, JPL, August 1995.

Figure 26:
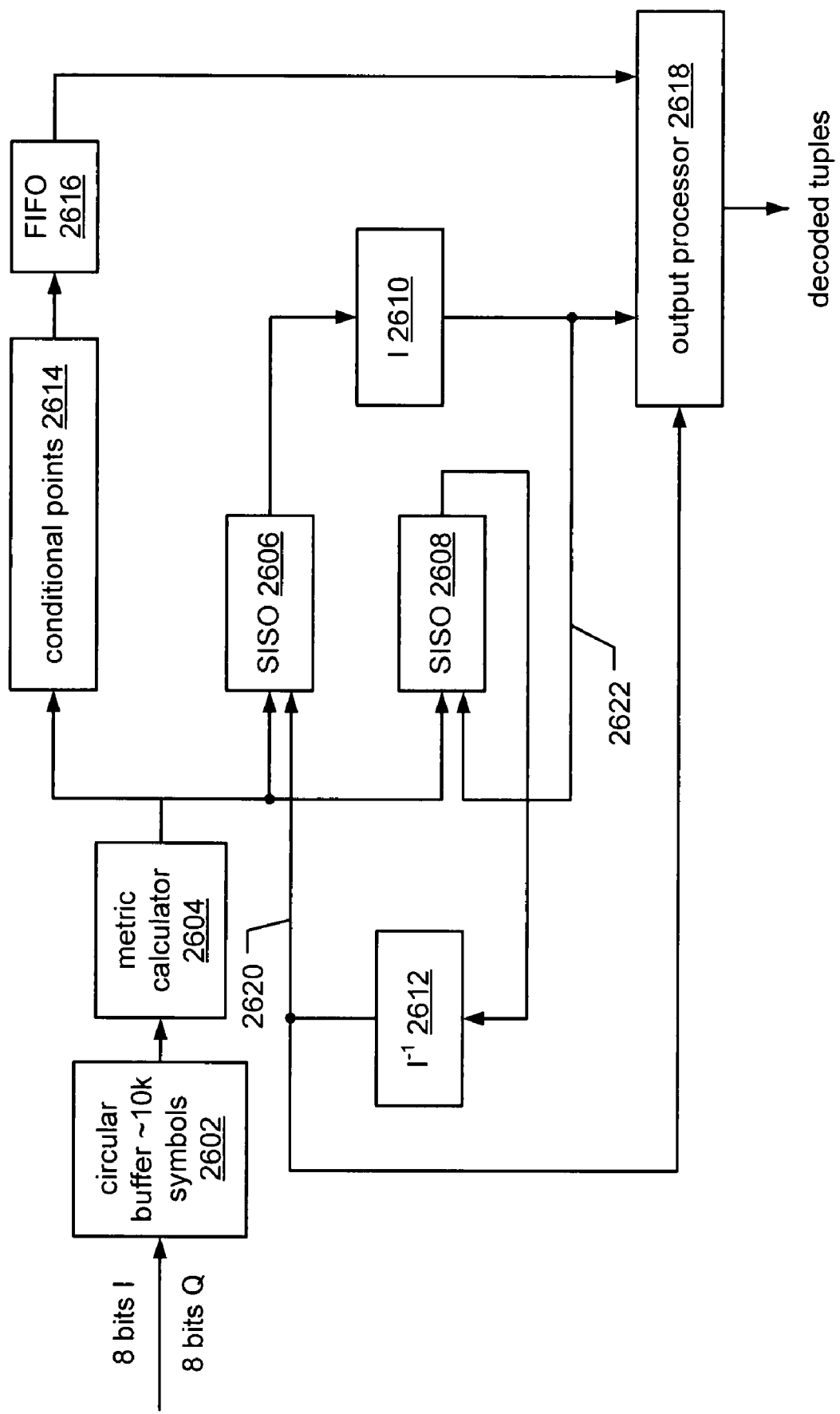
FIG. 26 is a block diagram of a modulo-2 (even/odd) TTCM decoder according to an embodiment of the invention.

FIG. 26 is a TTCM decoder according to an embodiment of the invention. FIG. 26 illustrates a block diagram of the TTCM decoder corresponding to the TTCM encoder described above. The TTCM decoder includes a circular buffer 2602, a metric calculator module 2604, two soft-in soft-out (SISO) modules 2606, 2608, two interleavers 2610, 2612, a conditional points processing module 2614, a first-in first-out (FIFO) register 2616, and an output processor 2618.

The TTCM decoder of FIG. 26 implements a MAP (Maximum A Posteriori) probability decoding algorithm.

The MAP Algorithm is used to determine the likelihood of the possible particular information bits transmitted at a particular bit time.

Turbo decoders, in general, may employ a SOVA (Soft Output Viterbi Algorithm) for decoding. SOVA is derived from the classical Viterbi Decoding Algorithm (VDA). The classical VDA takes soft inputs and produces hard outputs a sequence of ones and zeros. The hard outputs are estimates of values, of a sequence of information bits. In general, the SOVA Algorithm takes the hard outputs of the classical VDA and produces weightings that represent the reliability of the hard outputs.

The MAP Algorithm, implemented in the TTCM decoder of FIG. 26, does not produce an intermediate hard output representing the estimated values of a sequence of transmitted information bits. The MAP Algorithm receives soft inputs and produces soft outputs directly.

The input to the circular buffer i.e. input queue 2602 is a sequence of received tuples. In the embodiments of the invention illustrated in FIG. 26, each of the tuples is in the form of 8-bit in-phase (I) and 8-bit quadrature (Q) signal sample where each sample represents a received signal point or vector in the I-Q plane. The circular buffer 2602 outputs one tuple at a time to the metric calculator 2604.

The metric calculator 2604 receives I and Q (In-phase, Quadrature) values from the circular buffer 2602 and computes corresponding metrics representing distances form each of the 8 members of the signal constellation (using a designated MAP) to the received signal sample. The metric calculator 2604 then provides all eight distance metrics (soft inputs) to the SISO modules 2606 and 2608. The distance metric of a received sample point from each of the constellation points represents the log likelihood probability that the received sample corresponds to a particular constellation point. For rate 2/3, there are 8 metrics corresponding to the points in the constellation of whatever map is used to encode the data. In this case, the 8 metrics are equivalent to the Euclidean square distances between the value received and each of the constellation whatever map is used to encode the data.

SISO modules 2606 and 2608 are MAP type decoders that receive metrics from the metric calculator 2604. The SISOs then perform computations on the metrics and pass the resulting A Posteriori Probability (APOP) values or functions thereof (soft values) to the output processor 2618.

The decoding process is done in iterations. The SISO module 2606 decodes the soft values which are metrics of the received values of the first constituent code corresponding to the constituent encoder for example 1703 (FIG. 17). The SISO module 2608 decodes the soft values which are the APoP metrics of the received values of the second constituent code corresponding to the constituent encoder for example 1709 (FIG. 17). The SISO modules simultaneously process both codes in parallel. Each of the SISO modules computes the metrics corresponding to the input bits for every bit position of the in the block of 10K tuples (representing a exemplary block of date), and for each of the trellis states that the corresponding encoder could have been in.

One feature of the TTCM decoder is that, during each iteration, the two SISO modules 2606, 2608 are operating in parallel. At the conclusion of each iteration, output from each SISO module is passed through a corresponding interleaver and the output of the interleaver is provided as updated or refined A Priori Probability (APrP) information to the input of other cross coupled SISO modules for the next iteration.

After the first iteration, the SISO modules 2706, 2708 produce soft outputs to the interleaver 2610 and inverse interleaver 2612, respectively. The interleaver 2610 (respectively, inverse interleaver 2612) interleaves the output from the SISO module 2606 (respectively, 2608) and provides the resulting value to the SISO module 2608 (respectively, 2606) as a priori information for the next iteration. Each of the SISO modules use both the metrics from the metric calculator 2604 and the updated APrP metric information from the other cross coupled SISO to produce a further SISO Iteration. In the present embodiment of the invention, the TTCM decoder uses 8 iterations in its decoding cycle. The number of iterations can be adjusted in firmware or can be changed depending on the decoding process.

Because the component decoders SISO 2606 and 2608 operate in parallel, and because the SISO decoders are cross coupled, no additional decoders need to be used regardless of the number of iterations made. The parallel cross coupled decoders can perform any number of decoding cycles using the same parallel cross coupled SISO units (e.g. 2606 and 2608).

At the end of the 8 iterations the iteratively processed APoP metrics are passed to the output processor 2618. For code rate 2/3, the output processor 2618 uses the APoP metrics output from the interleaver 2610 and the inverse interleaver 2612 to determine the 2 information bits of the transmitted tuple. For code rate 5/6 or 8/9, the output from the FIFO 2616, which is the delayed output of the conditional points processing module 2614, is additionally needed by the output processor 2618 to determine the uncoded bit, if one is present.

For rate 2/3, the conditional points processing module 2614 is not needed because there is no uncoded bit. For rate 5/6 or 8/9, the conditional points processing module 2614 determines which points of the received constellation represent the uncoded bits. The output processor 2618 uses the output of the SISOs and the output of the conditional points processor 2614 to determine the value of the uncoded bit(s) that was sent by the turbo-trellis encoder. Such methodology of determining the value of an uncoded bit(s) is well known in the art as applied to trellis coding.

Figure 27:
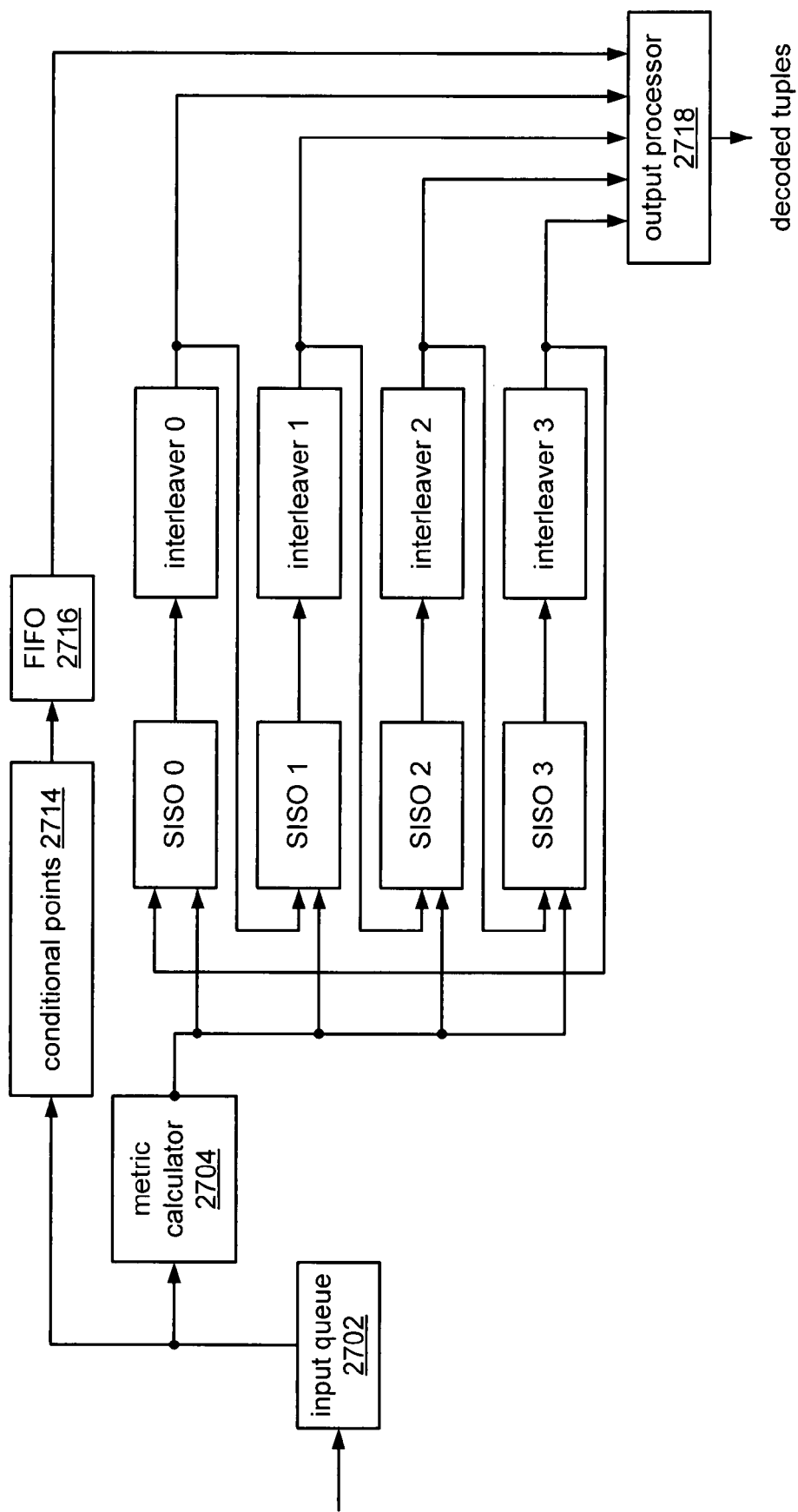
FIG. 27 is a TTCM modulo-4 decoder according to an embodiment of the invention.

FIG. 27 is a TTCM modulo-4 decoder according to an embodiment of the invention. The modulo four decoder of FIG. 27 is similar to the modulo-2 decoder illustration in FIG. 26. The functions of the input queue 2802, metric calculator 2804, conditional points processor 2814, and first in first out (FIFO) 2816 are similar to their counterparts in FIG. 26. The signals that will be decoded by the TTCM modulo-4 decoder FIG. 27 is one that has been coded in a modulo-4 interleaving system. Therefore, instead of having merely even and odd SISOs and interleavers, SISO 0, 1, 2 and 3 are used as are interleaver 0, 1, 2 and 3. Because the data has been encoded using a modulo-4 interleaving system, SISOs 0, 1, 2 and 3 can operate in parallel using interleaver 0, 1, 2 and 3. Once the SISOs 0 through 3 have processed through the points corresponding to the metrics of the points received in the input queue, the points can then be passed on to output process 2818. Output process 2818 will then provide decoded tuples.

Figure 28:
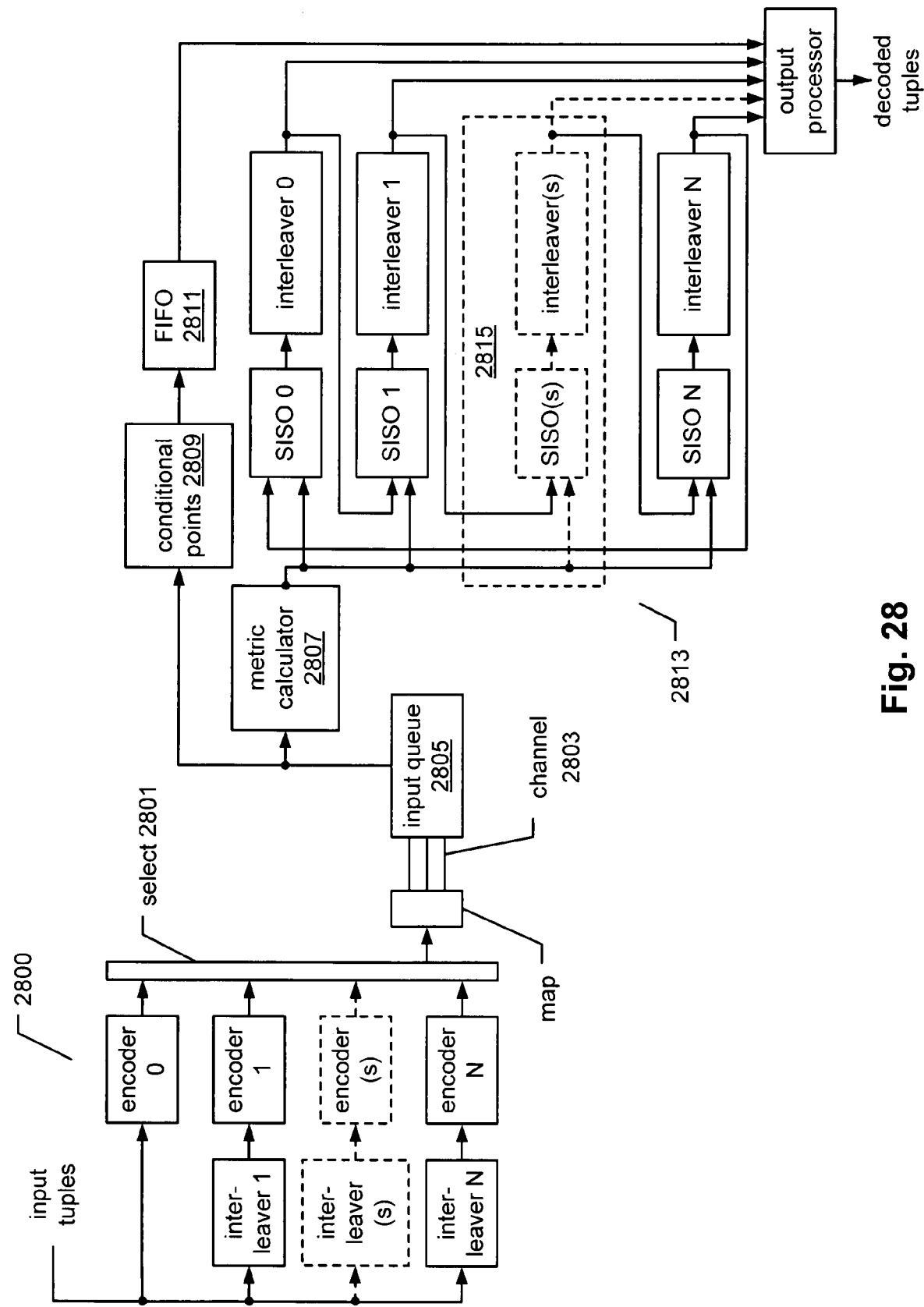
FIG. 28 is a graphical illustration of a modulo-N encoder/decoder system according to an embodiment of the invention.

FIG. 28 is a graphical illustration of a modulo-N and encoding and decoding system according to an embodiment of the invention. In FIG. 28, the encoder 2800 is a modulo-N encoder. The modulo-N encoder illustrated has N encoders and N−1 interleavers. The selector, 2801 selects encoded tuples sequentially from the output of encoders 0 through N. Selector 2801 then passes the selection onto the mapper which applies the appropriate mapping. The appropriately mapped data is then communicated over a channel 2803 to an input queue 2805. The functions of input 2805, metric calculator 2807, conditional points processor 2809 and FIFO 2811 are similar to those illustrated in FIG. 26 and 2478. The decoder 2813 has N SISOs corresponding to the N encoders. Any desired amount of parallelism can be selected for the encoder decoder system with the one caveat that the modulo-N decoding must match the modulo-N encoding. By increasing the modulo of the system, more points which have been produced by the metric calculator 2807 can be processed at the same time.

SISOs 0 through N process the points provided by the metric calculator in parallel. The output of one SISO provides A Priori values for the next SISO. For example SISO 0 will provide an A Priori value for SISO 1, SISO 1 will provide an A Priori value for SISO 2, etc. This is made possible because SISO 0 implements a Map decoding algorithm and processes points that have a modulo sequence position of 0 within the block of data being processed, SISO 1 implements a Map decoding algorithm and processes points that have a modulo sequence position of 1 within the block of data being processed, and so forth. By matching the modulo of the encoding system to the modulo of the decoding system the decoding of the data transmitted can be done in parallel. The amount of parallel processing available is limited only by the size of the data block being processed and the modulo of the encoding and decoding system that can be implemented.

Figure 29:
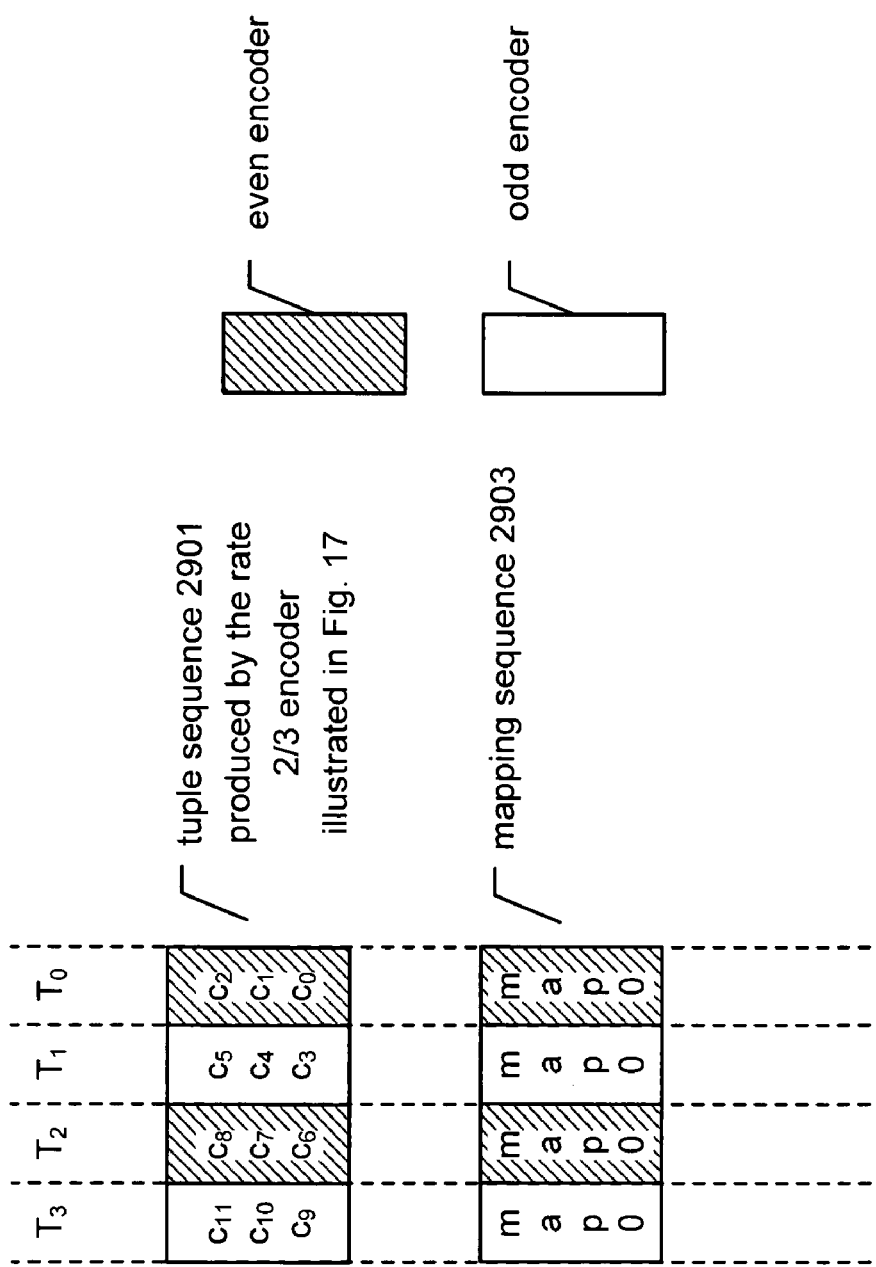
FIG. 29 is a graphical illustration of the output of the TTCM encoder illustrated in FIG. 17.

FIG. 29 is a graphical illustration of the output of the TTCM encoder illustrated in FIG. 17. FIG. 29 retains the same convention that C stands for a coded bit. The output of the TTCM encoder of FIG. 17 is represented by the sequences 2901 and 2903. The tuple sequence 2901 represents the actual output of rate 2/3rds encoder illustrated in FIG. 17. During a first time period $T_0$, bits $C_0$, $C_1$ are output from the encoder. The source of bits $C_0$, $C_1$ and $C_2$ represent 3 bits encoded by the even encoder 1709. These first 3 bits are mapped according to mapping sequence 2903. According to mapping sequence 2903 bits $C_0$, $C_1$ and $C_2$ are mapped using map 0 as illustrated in FIG. 22. Together the tuple sequence and mapping identify the type of output of the rate 2/3rds encoder illustrated in FIG. 17.

The tuple $C_3$, $C_4$ and $C_5$ is provided by the encoder of FIG. 17 immediately after the tuple comprising $C_0$, $C_1$ and $C_2$. The tuple $C_3$, $C_4$ and $C_5$ is been encoded in the odd encoder. The tuple sequence 2901 corresponding to time $T_1$ is the result of an encoding performed in the odd encoder 1703.

Figure 33:
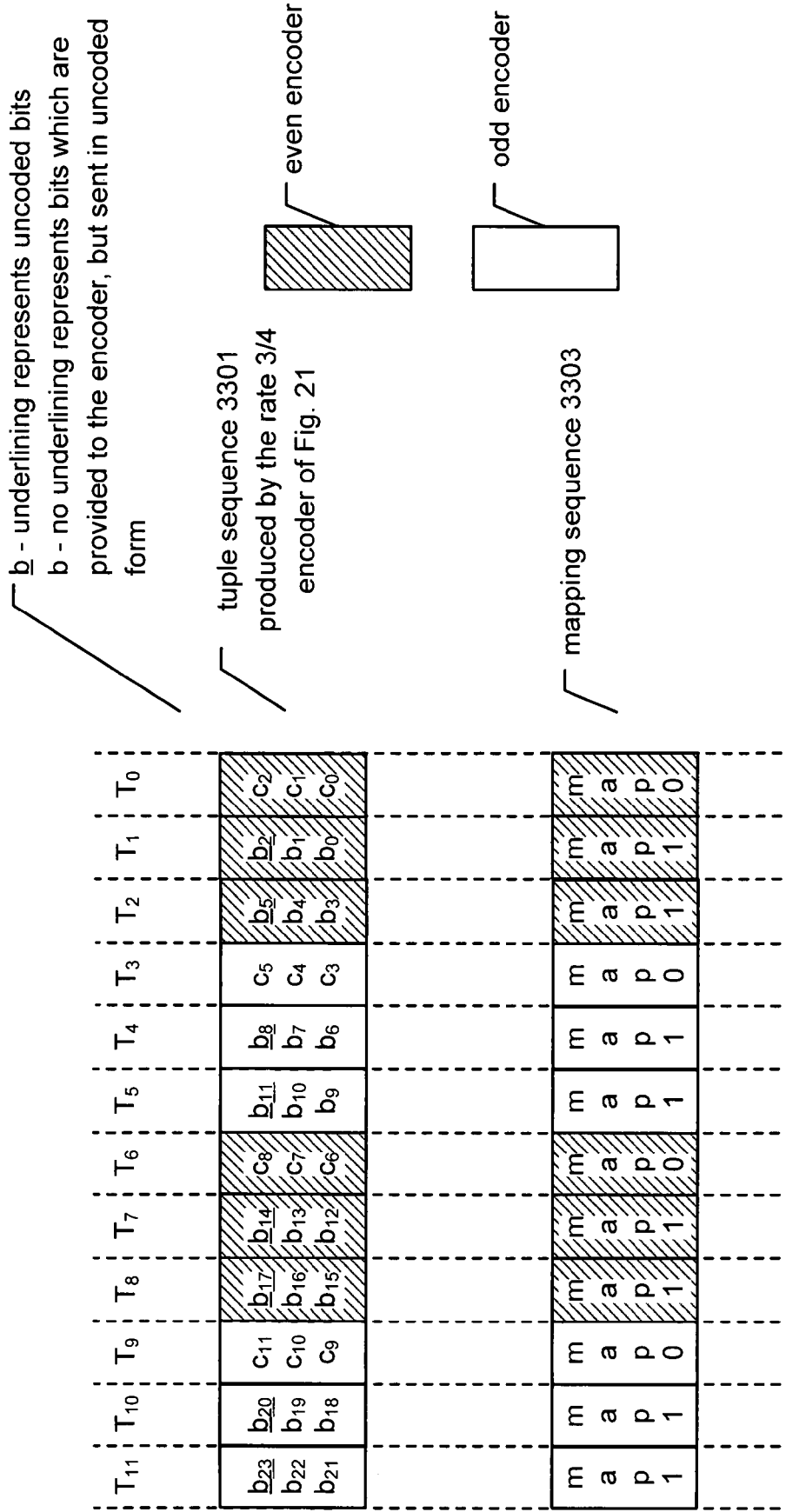
FIG. 33 is a chart defining the types of outputs produced by the 8/9th encoder illustrated in FIG. 21A.

In FIG. 29 through and including FIG. 33 the following conventions are adopted. Even encoder outputs will be shaded a light gray. The odd encoder outputs have no shading. In such a way the tuple sequence which comprises the output of the corresponding TTCM encoder can be identified. The gray shading denotes that the tuple was encoded in the even constituent encoder, and the lack of shading indicates that the tuple was encoded in the odd convolutional constituent encoder. Additionally uncoded bits that are associated with the even encoder data stream are shaded.

A letter C will represent a coded bit which is sent and an underlined letter $\underline{B}$ will represent unencoded (or simply "uncoded") bits which have not passed through either constituent encoder and a B without the underline will represent a bit which is encoded, but transmitted in unencoded form.

In time sequence $T_2$ the TTCM output is taken from the even encoder, accordingly the bit $C_6$, $C_7$ and $C_8$ appear as a gray shaded tuple sequence indicating that they were encoded by the even encoder. At time T3 output tuple sequence 2901 comprises $C_9$, $C_{10}$ and $C_{11}$ which had been encoded by the odd encoder. All members of the tuple sequence for the rate 2/3rds encoder illustrated in FIG. 17 are mapped using map 0 as shown at mapping sequence 2903. The characterization of TTCM encoders output tuples using tuple sequence and mapping sequence will be used later when considering the decoding. For the present it is only necessary to realize that the combination of the tuple sequence and mapping sequence correspond to its type. The tuple type completely specifies the output of the TTCM encoder for the purposes of decoding.

Figure 30:
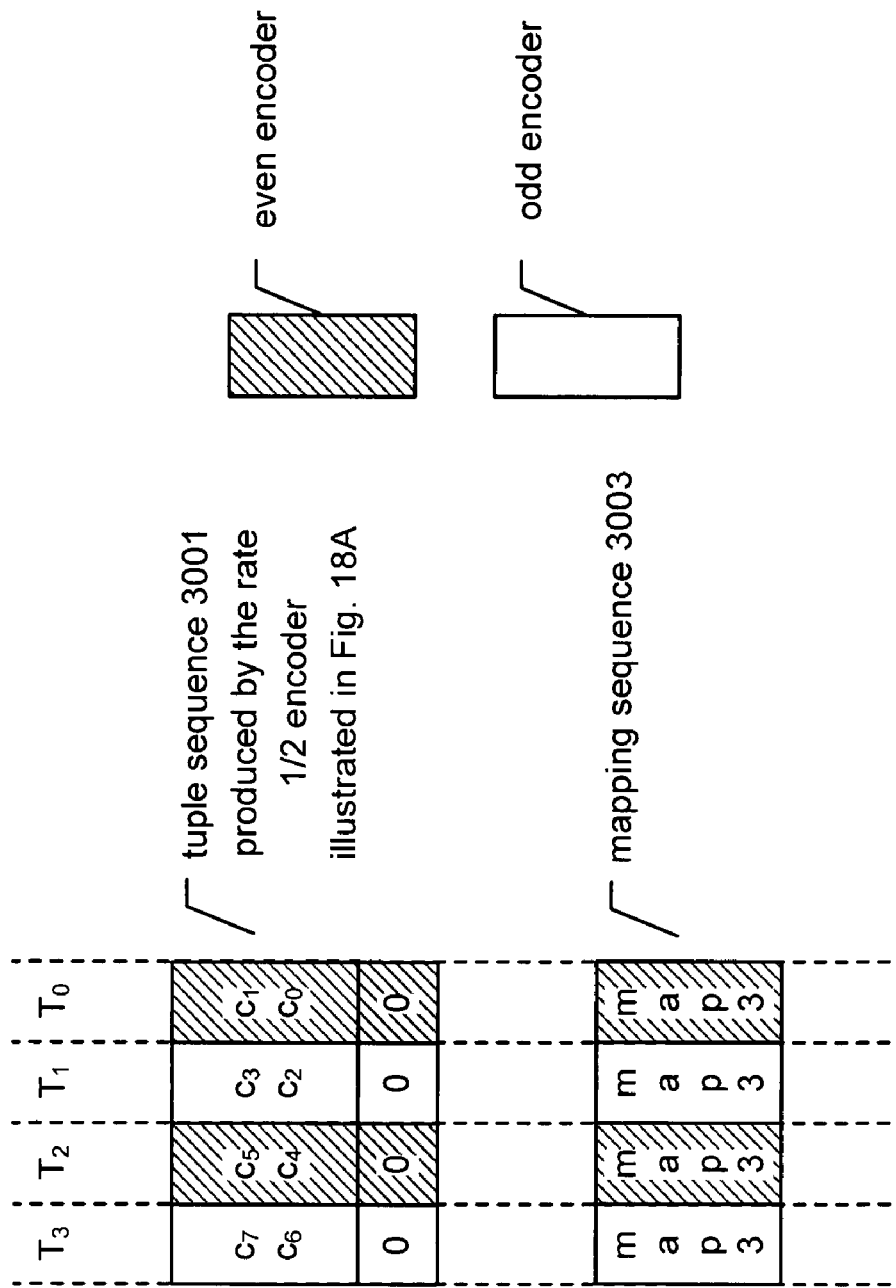
FIG. 30 is a graphical illustration of the tuple types produced by the TTCM encoder illustrated in FIG.18A.

FIG. 30 is a graphical illustration of the tuple types produced by the TTCM encoder illustrated in FIG. 18A. The TTCM encoder illustrated in FIG. 18A is a rate 1/2 encoder. The rate 1/2 encoder illustrated in FIG. 18A produces output tuples comprising 2 bits. The first tuple pair $C_0$ and $C_1$, corresponding to output time $T_0$, is produced by the even encoder 1809 as indicated by the shading of the tuple. The next tuple corresponding to output time $T_1$ comprises coded bits $C_2$ and $C_3$ which have been encoded by the odd encoder 1809. Similarly, the tuple corresponding to time $T_2$ is produced by the even encoder and the tuple corresponding to time $T_3$ is produced by the odd encoder. All tuple sequences 3001 are mapped using to map 0 as shown by the mapping sequence 3003. The combination of tuple sequence 3001 and mapping sequence 3003 comprise the type of the tuple produced by the rate 1/2 TTCM encoder of FIG. 18A. The type of tuples produced by the TTCM encoder of FIG. 18A will be useful for the purposes of decoding the output tuples.

Figure 31:
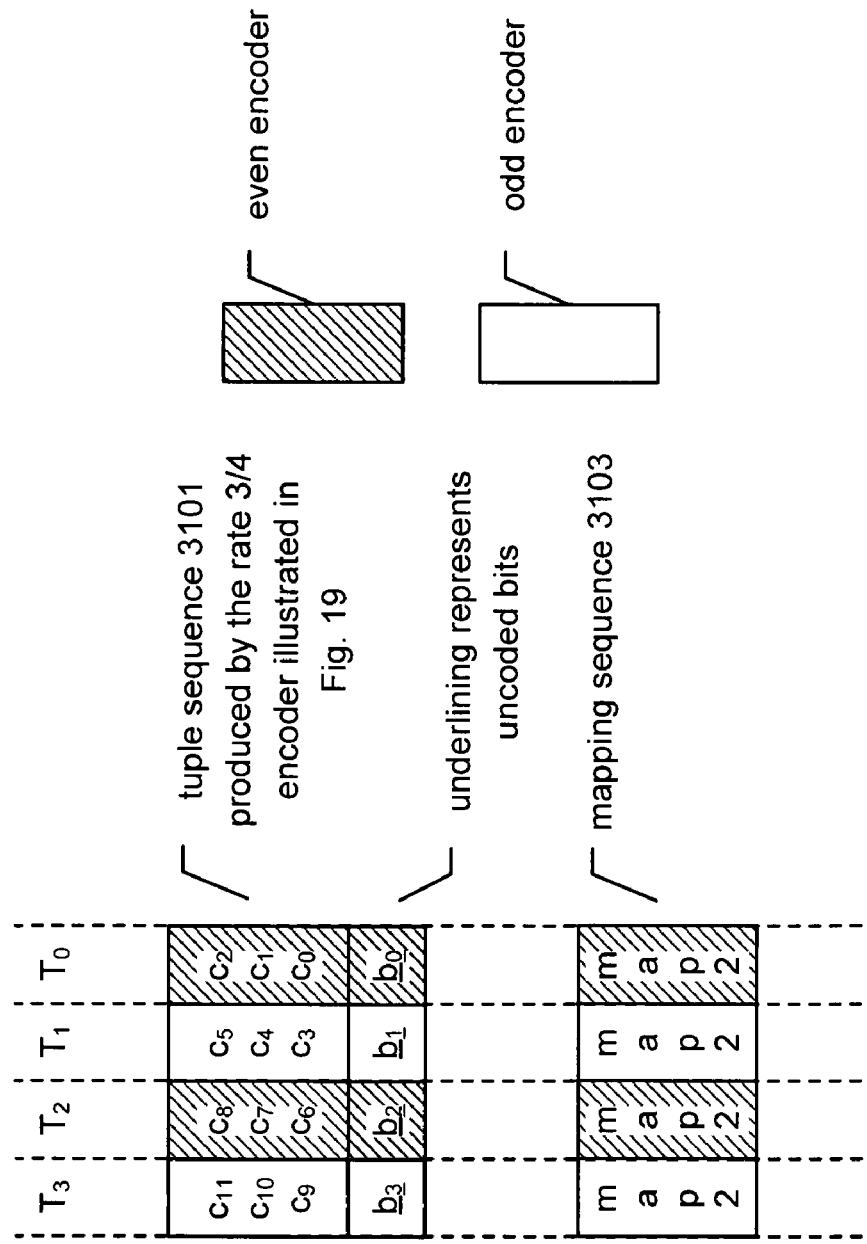
FIG. 31 is a graphical illustration illustrating the tuple types produced by the rate 3/4 encoders of FIG. 19.

FIG. 31 is a graphical illustration illustrating the tuple types produced by the rate 3/4 encoder of FIG. 19. The tuple sequence 3101, representing the output of the TTCM encoder of FIG. 19 is a sequence of 4 bit tuples. The output tuple corresponding to time $T_0$ is 4 bits. $C_0$, $C_1$, $C_2$ and unencoded bit $B_0$. Tuple sequence corresponding to time $T_0$ is mapped by map 2 as shown by mapping sequence 3103. Additionally, the tuple sequence 3101 during time $T_0$ is mapped by the even encoder, as illustrated by the shading. In other words, the uncoded bit $\underline{B}_0$ does not pass through either the even or odd encoder. It is however shown shaded as the tuple sequence, to which it is paired, is produced by the even encoder 1909.

Similarly, the tuple sequence corresponding to $T_2$ has been produced by the even encoder. The tuple sequence corresponding to time $T_2$, i.e. $C_6$, $C_7$ and $C_8$, are produced by even encoder 1909 and paired with unencoded bit $\underline{B}_2$. $C_6$, $C_7$ and $C_8$ are produced by the even encoder. Combination $C_6$, $C_7$, $C_8$ and $\underline{B}_2$ are mapped according to map 2 as illustrated in FIG. 24.

Similarly, the tuple sequences produced by the TTCM encoder of FIG. 19 during times $T_1$ and $T_3$ are produced by the odd encoder and combined with an uncoded bit. During time $T_1$ the odd encoder encodes $C_3$, $C_4$ and $C_5$. $C_3$, $C_4$ and $C_5$ along with $B_1$, are mapped in map 2. The tuple sequence produced during time $T_3$ is also a combination of the odd encoder and an encoded bit. As illustrated in FIG. 31 all tuple sequences are mapped using map 2.

Figure 32:
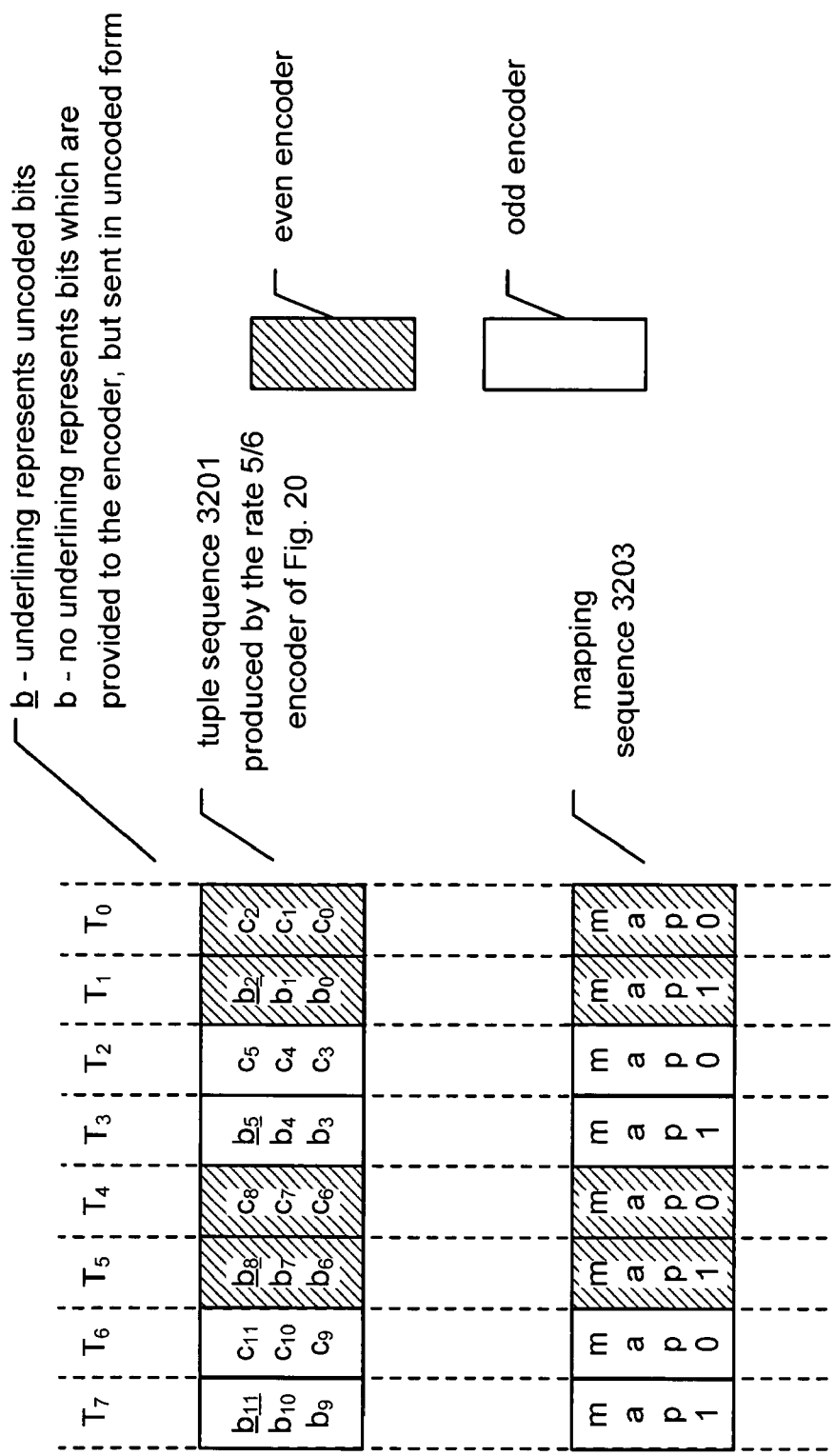
FIG. 32 is a graphical illustration of the tuple types produced by the rate 5/6 encoder illustrated in FIG. 20A.

FIG. 32 is a graphical illustration of the tuple types produced by the rate 5/6 encoder illustrated in FIG. 20A. The first tuple corresponding to time $T_0$ comprises coded bits $C_0$, $C_1$ and $C_2$. The coded bits $C_0$, $C_1$ and $C_2$ are mapped according to map 0. During time $T_1$, bits $B_0$, $B_1$ and $\underline{B}_2$ are produced by the encoder of FIG. 20A. $B_0$, $B_1$ and $\underline{B}_2$ represent data that is sent uncoded they are however shown as being grayed out because bits $B_1$ and $B_0$ pass through the even encoder even though they are sent in uncoded form. The uncoded bits $B_0$, $B_1$ and $\underline{B}_2$ are mapped using map 1. Similarly, the output of the encoder at time $T_4$ comprises coded bits $C_6$, $C_7$ and $C_8$ which are mapped using map 0. During time period $T_5$ uncoded bits $B_6$, $B_7$ and $\underline{B}_8$ form the output of the encoder. $B_6$, $B_7$ and $\underline{B}_8$ are mapped using map 1.

During time period $T_2$, bits $C_3$, $C_4$ and $C_5$ are selected from the odd encoder as the output of the overall 5/6 encoder illustrated in FIG. 20A. Bits $C_3$, $C_4$ and $C_5$ are mapped in mapper 0 and form the turbo trellis coded modulated output. Similarly, during time $T_6$, bit $C_9$, $C_{10}$ and $C_{11}$ are selected from the odd encoder and mapped according to map 0. During time period $T_7$, uncoded bits $B_9$, $B_{10}$ and $B_{11}$ are selected as the output of the rate 5/6 encoder and are mapped according to map 1. The chart of FIG. 32 defines the types of output produced by the rate 5/6 encoder of FIG. 20A.

FIG. 33 is a chart defining the types of outputs produced by the 8/9th encoder illustrated in FIG. 21A. All uncoded outputs are mapped according to map 1. All coded outputs are mapped according to map 0. During times $T_0$ and $T_6$ coded outputs from the even encoder are selected. During times $T_3$ and $T_9$ coded output from the odd encoder are selected. Accordingly, the tuple types produced by the rate 8/9ths encoder of FIG. 21 are completely described by the illustration of FIG. 33.

Figure 34:
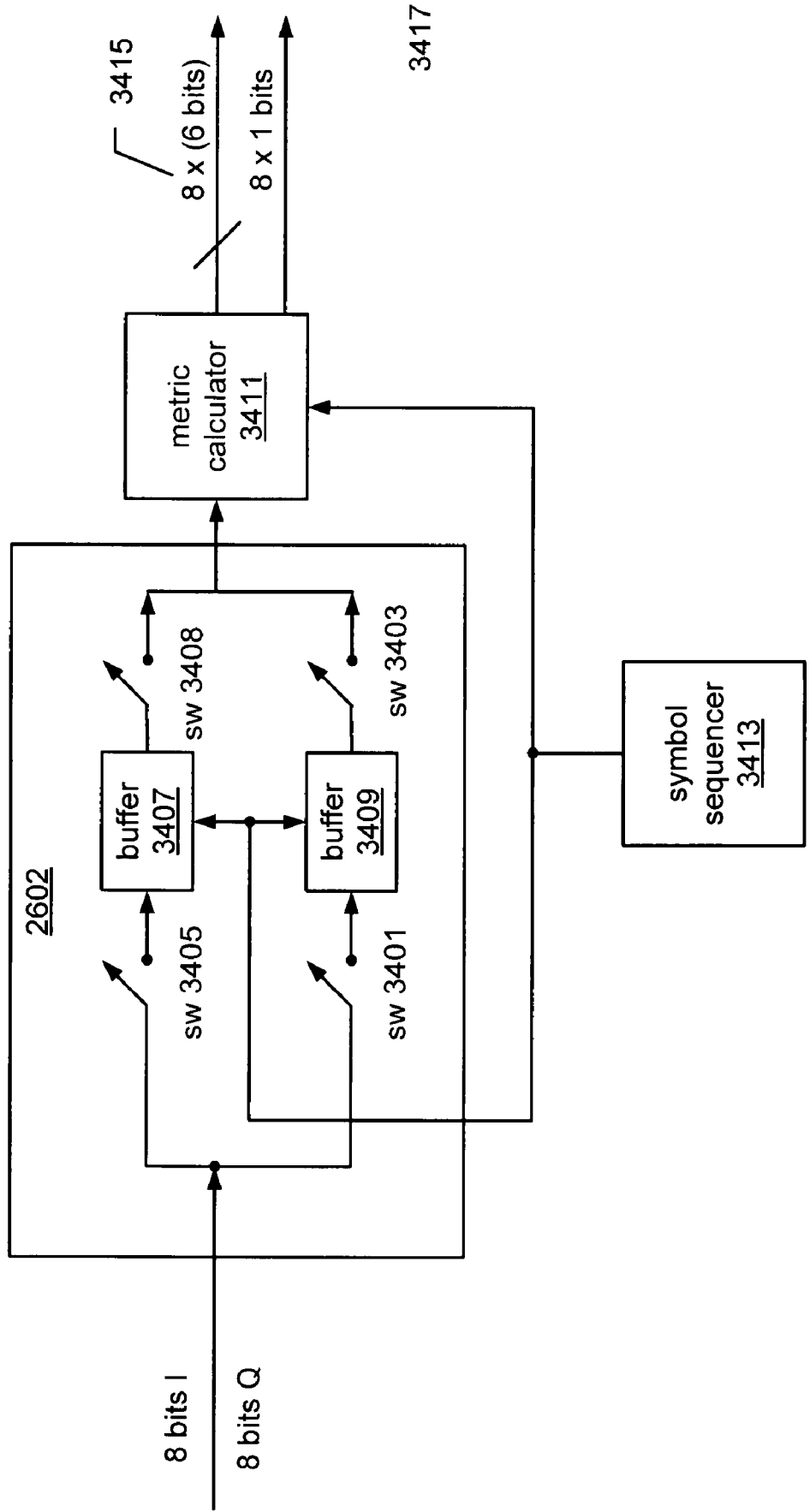
FIG. 34 is a further graphical illustration of a portion of the decoder illustrated in FIG. 26.

FIG. 34 is a further graphical illustration of a portion of the decoder illustrated in FIG. 26. In FIG. 34 the circular buffer 2602 is further illustrated as being a pair of buffers 3407 and 3409. Switches 3401, 3403, 3405 and 3408 operate in such a fashion as to enable the metric calculator 3411 to receive data from one buffer while the other buffer is accepting data. In such a fashion one buffer can be used for processing input data by providing it to the metric calculator and the second buffer can be used for receiving data. The metric calculator 3411 receives data, as required, from either buffer 3407 or buffer 3409 and calculates the distance between the received point and designated points of the data constellation produced by the source encoder. The symbol sequencer 3413 provides data to the metric calculator 3411 specifying the type of tuple, i.e. the constellation and bit encoding of the tuple, which is being decoded. The symbol sequencer also provides information to either buffer 3407 and 3409 regarding which data bits are to be provided to the metric calculator 3411. The symbol sequencer is generally provided information, regarding the symbol types to be received, during the initialization of the system. Symbol typing has been discussed previously with respect to FIG. 29 through FIG. 33. The metric calculator 3411 calculates the metrics for each received point. The metrics for a particular receive point will typically comprise 8 Euclidean distance squared values for each point as indicated at the output of metric calculator 3411. The Euclidean distance of a point is illustrated in FIG. 35.

The metric calculator 3411 of FIG. 34 has two outputs 3415 and 3417. The output 3415 represents eight metrics each of six bits corresponding to the Euclidian distance squared in the I-Q plane between a received point and all eight possible points of the signal constellation which represent valid received data points. Output 3417 represents the mapping of an encoded bit, if any is present. The output 3417 is an indicator of how to select the value of an uncoded bit. The value of the eight outputs at 3417 correspond to a 0 or 1 indicating whether the receive point is closer to an actual point in which the uncoded bit would assume a value of 0 or 1. The method of including uncoded bits within a constellation has been well known in the art and practiced in connection with trellis coded modulation. It is included here for the sake of completeness. The uncoded bit metrics will be stored in FIFO 2616 until the corresponding points are decoded in the output processor 2618. Once the corresponding points are decoded in the output processor 2618, they can be matched with the proper value for the uncoded bit as applied by FIFO 2616.

Figure 35:
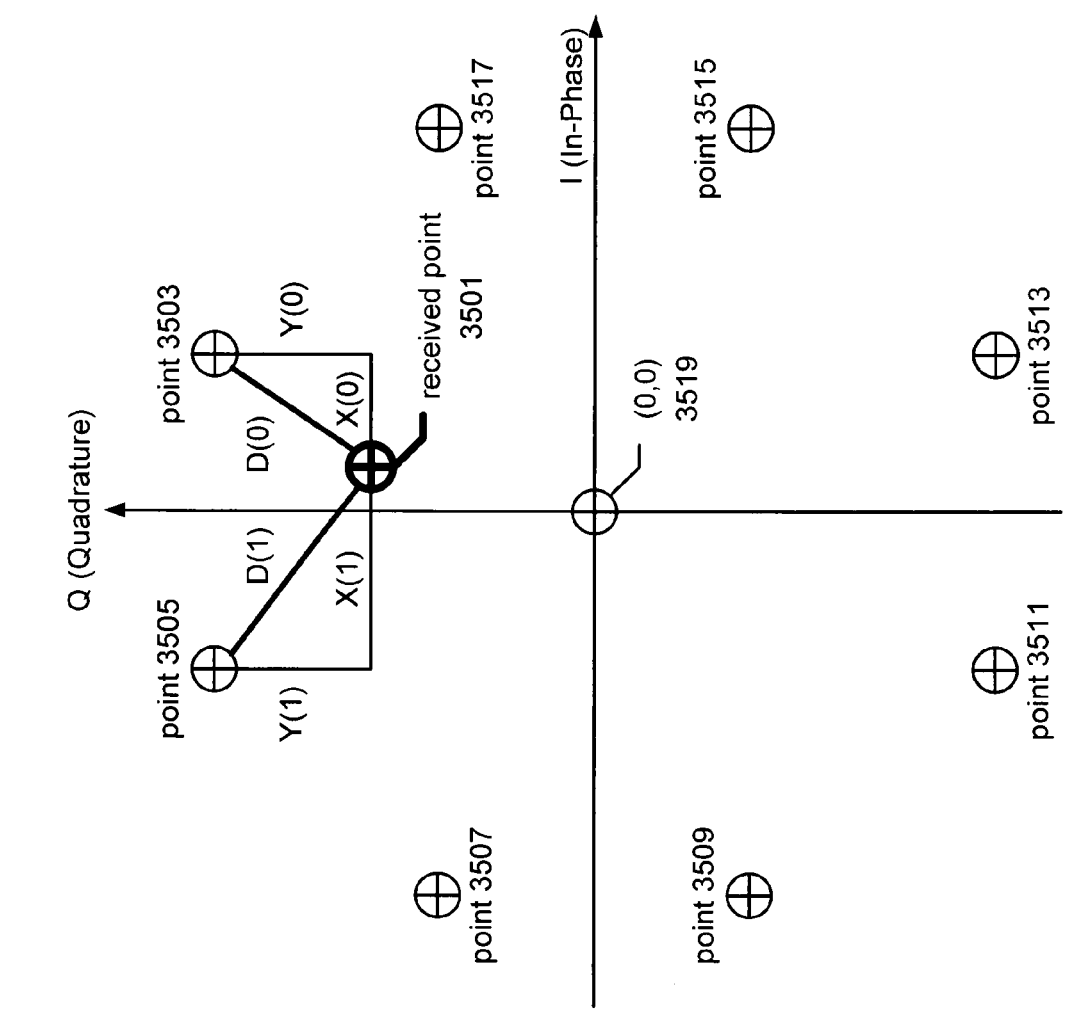
FIG. 35 is a graphical illustration of the process carried on within the metric calculator of the decoder.

FIG. 35 is a graphical illustration of the process carried on within the metric calculator of the decoder. In FIG. 35, a constellation of designated points is represented in the I-Q plain by points 3503, 3505, 3507, 3509, 3511, 3513, 3515 and 3517. The points just mentioned constitute an exemplary constellation of transmitted point values. In actual practice a received point may not match any of the designated transmission points of the transmitted constellation. Further a received point matching one of the points in the constellation illustrated may not coincide with the point that had actually been transmitted at the transmitter. A received point 3501 is illustrated for exemplary purposes in calculating Euclidean squared distances. Additionally, point 3519 is illustrated at the 00 point of the I-Q plain. Point 3519 is a point representing a received point having an equal probability of being any point in the transmitted constellation. In other words, point 3519 is a point having an equal likelihood of having been transmitted as any constellation point. Point 3519 will be used in order to provide a neutral value needed by the decoder for values not transmitted.

The metric calculator 3411 calculates the distance between a receive point, for example 3501, and all transmitted points in the constellation, for example, points 3503 and 3505. The metric calculator receives the coordinates for the receive points 3501 in terms of 8 bits I and 8 bits Q value from which it may calculate Euclidean distance squared between the receive point and any constellation point. For example, if receive point 3501 is accepted by the metric calculator 3411 it will calculate value X(0) and Y(0), which are the displacement in the X direction and Y direction of the receive point 3501 from the constellation pointer 3503. The values for X(0) and Y(0) can then be squared and summed and represent $D^2(0)$. The actual distance between a receive point 3501 and a point in the constellation, for example 3503 can then be computed from the value for $D^2(0)$. The metric calculator however, dispenses with the calculation of the actual value of D(0) and instead employs the value $D^2(0)$ in order to save the calculation time that would be necessary to compute D(0) from $D^2(0)$. In like manner the metric calculator then computes the distance between the receive point and each of the individual possible points in the constellation i.e. 3503 through 3517.

Figure 36:
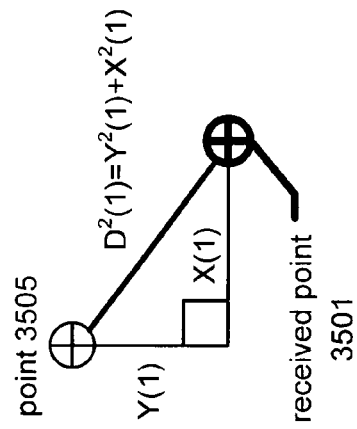
FIG. 36 is a graphical illustration of the calculation of a Euclidean squared distance metric.

FIG. 36 is a graphical illustration of the calculation of a Euclidean squared distance metric. Once the metric values representing the 8 metrics have been calculated, the metric calculator 2604 can then provide them to the SISOs 2606 and 2608.

SISOs 2606 and 2608 of FIG. 34 accept the values from the metric calculator 3411. SISO 2606 decodes points corresponding to the odd encoder an SISO 2608 decodes point corresponding to the even encoder. SISOs 2606 and 2608 operate according to a map decoding algorithm. Within each SISO is a trellis comprising a succession of states representing all of the states of the odd or even encoder. The values associated with each state represent that probability that the encoder was in that particular state during the time period associated with that particular state. Accordingly, SISO 2606 decodes the odd encoder trellis and SISO 2608 decodes the even encoder trellis. Because only the odd points are accepted for transmission from the odd encoder SISO 2606 may contain only points corresponding to odd sequence designations and SISO 2608 contains only points corresponding to even sequence designations. These are the only values supplied by the metric calculator because these are the only values selected for transmission. Accordingly, in constructing the encoder trellis for both the odd encoder within SISO 2606 and the even encoder within SISO 2608 every other value is absent. Because a trellis can only represent a sequence of values, every other point, which is not supplied to each SISO must be fabricated in some manner. Because every other point in each of the two SISOs is an unknown point, there is no reason to presume that one constellation point is more likely than any other constellation point.

Accordingly, the points not received by the SISOs from the metric calculator are accorded the value of the 0 point 3519. The 00 point 3519 is chosen because it is equidistant, i.e. equally likely, from all the possible points in the encoded constellation.

Figure 37:
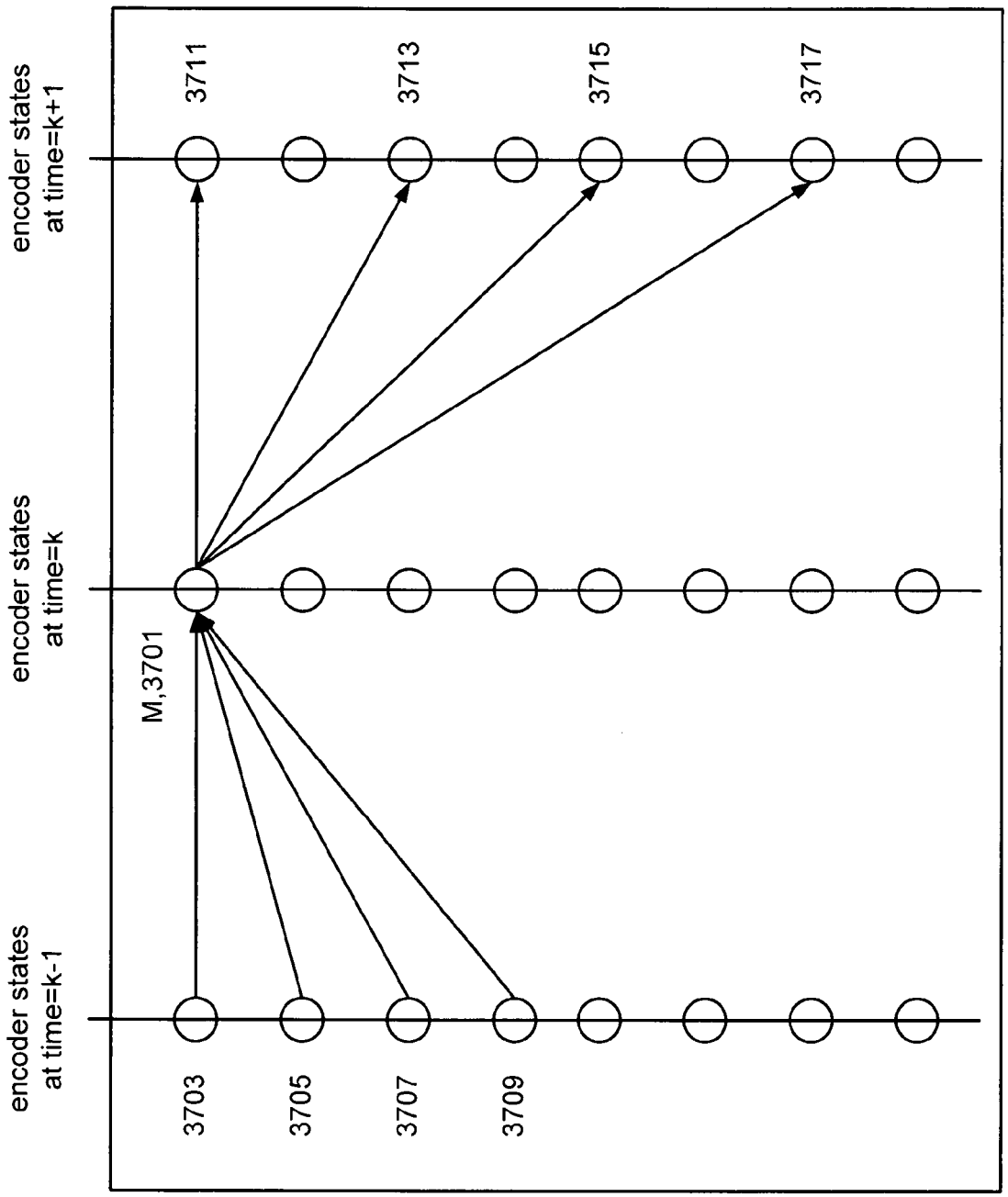
FIG. 37 is a representation of a portion of a trellis diagram as may be present in either SISO 2606 or SISO 2608.

FIG. 37 is a representation of a portion of a trellis diagram as may be present in either SISO 2606 or SISO 2608. The diagram illustrates a calculation of the likelihood of being in state M 3701. The likelihood of being in state M, 3701 is calculated in two different ways. The likelihood of being in state M 3701 at time k is proportional to the likelihood that a time K-1 that the encoder was in a state in which the next successive state could be state M (times the likelihood that the transmission was made into state M). In the trellis diagram state M may be entered from precursor states 3703, 3705, 3707 or 3709. Therefore, the likelihood of being in state M 3701 is equal to the likelihood of being in state 3701, which state 0 of the encoder, and is symbolized by $\alpha_k(0)$.

The likelihood of being in state M 3701 may be evaluated using previous and future states. For example, if state M 3701 is such that it may be entered only from states 3703, 3705, 3707 or 3709, then the likelihood of being in state M 3701 is equal to the summation of the likelihoods that it was in state 3703 and made a transition to state 3701, plus the likelihood that the decoder was in state 3705 and made the transition to state 3701, plus the likelihood that the decoder was in state 3707 and made the transition to state 3701, plus the likelihood that the decoder was in state 3709 and made the transition to state 3701.

The likelihood of being in state M 3701 at time k may also be analyzed from the viewpoint of time k+1. That is, if state M 3701 can transition to state 3711, state 3713, state 3715, or state 3717, then the likelihood that the decoder was in state M 3701 at time k is equal to a sum of likelihoods. That sum of likelihoods is equal to the likelihood that the decoder is in state 3711 at time k+1 and made the transition from state 3701, plus the likelihood that the decoder is in state 3713 at time k+1, times the likelihood that it made the transition from state M 3701, plus the likelihood that it is in state 3715 and made the transition from state 3701, plus the likelihood that it is in state 3717 and made the transition from state M 3701. In other words, the likelihood of being in a state M is equal to the sum of likelihoods that the decoder was in a state that could transition into state M, times the probability that it made the transition from the precursor state to state M, summed over all possible precursor states.

The likelihood of being in state M can also be evaluated from a post-cursor state. That is, looking backwards in time. T₀ look backwards in time, the likelihood that the decoder was in state M at time k is equal to the likelihood that it was in a post-cursor state at time k+1 times the transition probability that the decoder made the transition from state M to the post-cursor state, summed over all the possible post-cursor states. In this way, the likelihood of being in a decoder state is commonly evaluated both from a past and future state. Although it may seem counter-intuitive that a present state can be evaluated from a future state, the problem is really semantic only. The decoder decodes a block of data in which each state, with the exception of the first time period in the block of data and the last time period in the block of data, has a precursor state and a post-cursor state represented. That is, the SISO contains a block of data in which all possible encoder states are represented over TP time periods, where TP is generally the length of the decoder block. The ability to approach the probability of being in a particular state by proceeding in both directions within the block of data is commonly a characteristic of map decoding.

The exemplary trellis depicted in FIG. 37 is an eight state trellis representing the eight possible encoder states. Additionally, there are a maximum of four paths into or out of any state, because the constituent encoders which created the trellis in FIG. 37 had 2-bit inputs. Such a constituent encoder is illustrated in FIG. 5. In fact, FIG. 37 is merely an abbreviated version of the trellis of the right two-thirds constituent encoder illustrated in FIG. 6, with an additional time period added.

The state likelihoods, when evaluating likelihoods in the forward direction, are termed the "forward state metric" and are represented by the Greek letter alpha ($\alpha$). The state likelihoods, when evaluating the likelihood of being in a particular state when evaluated in the reverse direction, are given the designation of the Greek letter beta ($\beta$). In other words, forward state metric is generally referred to as $\alpha$, and the reverse state metric is generally referred to as $\beta$.

Figure 38:
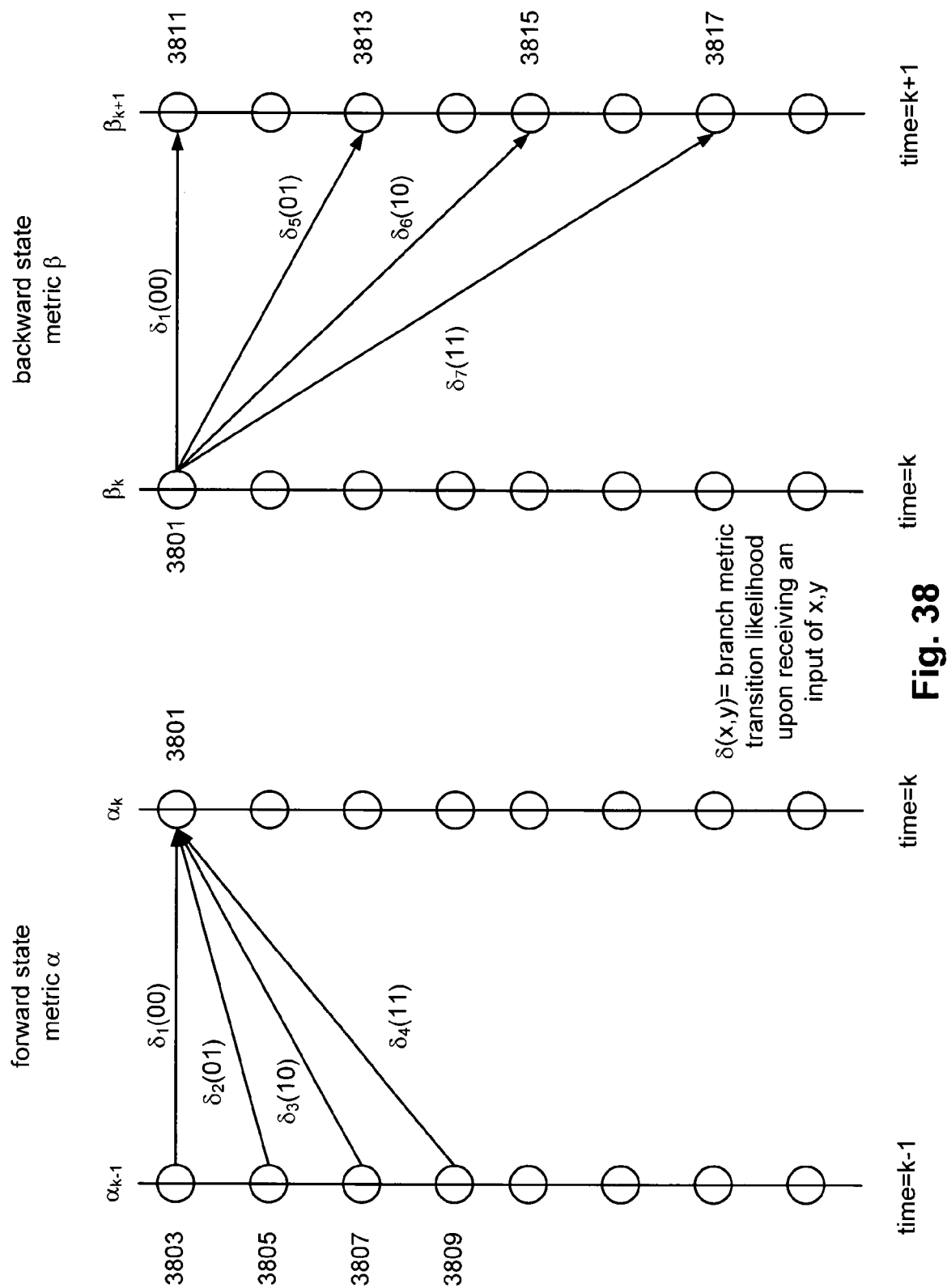
FIG. 38 is a generalized illustration of a forward state metric alpha and a reverse state metric beta.

FIG. 38 is a generalized illustration of a forward state metric alpha ($\alpha$) and a reverse state metric beta ($\beta$). The likelihood of being in state 3801 at time k is designated as $\alpha_k$. $\alpha_k$ designates the forward state metric alpha at time k for a given state. Therefore, $\alpha_k$ for state 3801 is the likelihood that the encoder was in a trellis state equivalent to state 3801 at time k. Similarly, at time k-1, the likelihood that the encoder was in a state equivalent to state 3803 at time $\alpha_{k-1}$ is designated as $\alpha_{k-1}$ (3803). The likelihood that the encoder was in state 3805 at time k-1 is equal to $\alpha_{k-1}$ (3805). Similarly, at time k-1, the likelihood that the encoder was in state 3807 at time k-1 is equal to $\alpha_{k-1}$ (3807). Similarly, the likelihood that the encoder was in a state equivalent to state 3809 at time k-1 is equal to $\alpha_{k-1}$ (3809). Therefore, to compute the likelihood that the encoder is in state 3801, the likelihood of being in a precursor state must be multiplied by the likelihood of making the transition from a precursor state into state 3801.

The input at the encoder that causes a transition from a state 3803 to 3801 is an input of 0,0. The likelihood of transition between state 3803 and state 3801 is designated as $\delta(0,0)$ (i.e. delta (0,0)). Similarly, the transition from state 3805 to 3801 represents an input of 0,1, the likelihood of transition between state 3805 and state 3801 is represented by $\delta(0,1)$. Similarly, the likelihood of transition between state 3807 and 3801 is represented by $\delta(1,0)$ as a 1,0 must be received by the encoder in state 3807 to make the transition to state 3801. Similarly, a transition from state 3809 to state 3801 can be accomplished upon the encoder receiving a 1,1, and therefore the transition between state 3809 and state 3801 is the likelihood of that transition, i.e. $\delta(1,1)$. Accordingly, the transition from state 3803 to 3801 is labeled $\delta_1(0,0)$ indicating that this is a first transition probability and it is the transition probability represented by an input of 0,0. Similarly, the transition likelihood between state 3805 and 3801 is represented by $\delta_2(0,1)$, the transition between state 3807 and state 3801 is represented by $\delta_3(1,0)$, and the likelihood of transition between state 3809 and 3801 is represented by $\delta_4(1,1)$.

The situation is similar in the case of the reverse state metric, beta ($\beta$). The likelihood of being in state 3811 at time k+1 is designated $\beta_{k+1}$ (3811). Similarly, the likelihood of being in reverse metric states 3813, 3815, and 3817 are equal to $\beta_{k+1}$ (3813), $\beta_{k+1}$ (3815), and $\beta_k$ (3817). Likewise, the probability of transition between state 3811 and 3801 is equal to $\delta_1(0,0)$, the likelihood of transition between state 3813 and 3801 is equal to $\delta_5$ (0,1). The likelihood of transition from state 3815 to 3801 is equal to $\delta_6(1,0)$, and the likelihood of transition between state 3815 and 3801 is equal to $\delta_7(1,1)$. In the exemplary illustration of FIG. 38, there are four ways of transitioning into or out of a state. The transitions are determined by the inputs to the encoder responsible for those transitions. In other words, the encoder must receive a minimum of two bits to decide between four different possible transitions. By evaluating transitions between states in terms of 2-bit inputs to the encoder at a given time, somewhat better performance can be realized than by evaluating the decoding in terms of a single bit at a time. This result may seem counter-intuitive, as it might be thought that evaluating a trellis in terms of a single bit, or in terms of multiple bits, would be equivalent. However, by evaluating the transitions in terms of how the input is provided at a given time, a somewhat better performance is obtained because the decoding inherently makes use of the noise correlation which exists between two, or more, simultaneous input bits.

Accordingly, the likelihood of being in state 3803 may be represented by expression 1 (Expr. 1) as follows:

$$\alpha_k(3801) = \alpha_{k-1}(3803) \times \delta_1(00) \times \text{app}(00) + \alpha_{k-1}(3805) \times \delta_2(01) \times \text{app}(01) + \alpha_{k-1}(3807) \times \delta_3(10) \times \text{app}(10) + \alpha_{k-1}(3809) \times \delta_4(11) \times \text{app}(11). \quad \text{(Expr. 1)}$$

Similarly, $\beta_k$ can be represented by expression 2 (Expr. 2) as follows:

$$\beta_k(3801) = \beta_1(00) \times \beta_{k+1}(3811) \times \text{app}(00) + \delta_5(01) \times \beta_{k+1}(3813) \times \text{app}(01) + \delta_6(10) \times \beta_{k+1}(3815) \times \text{app}(10) + \delta_7(11) \times \beta_{k+1}(3817) \times \text{app}(11). \quad \text{(Expr. 2)}$$

Figure 39A:
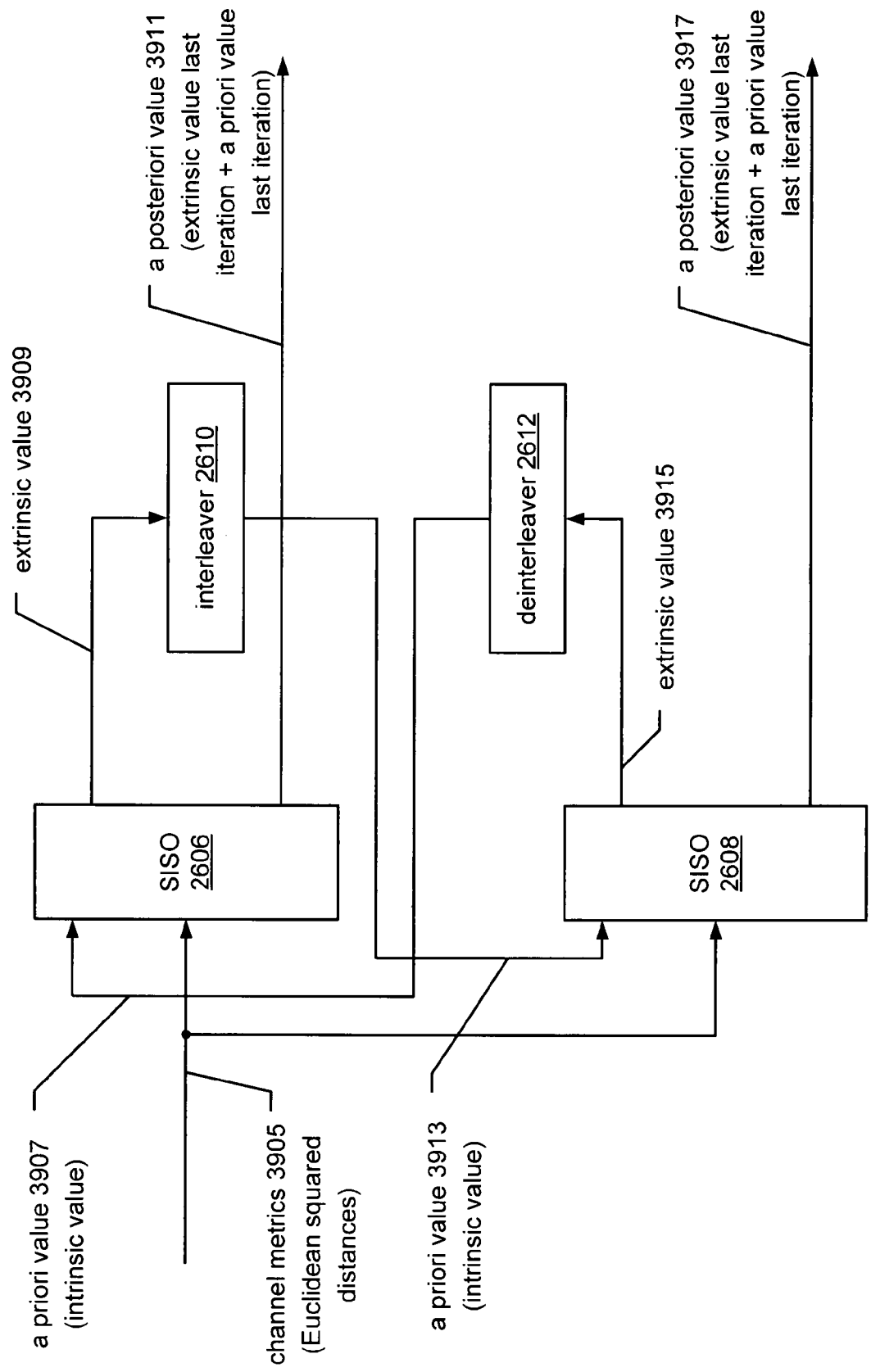
FIG. 39A is a block diagram folder illustrating the parallel SISO coupling illustrated in FIG. 26.

FIG. 39A is a block diagram further illustrating the parallel SISOs illustrated in FIG. 26. Both SISOs, 2606 and 2608, accept channel metrics 3905, which are provided by the metric calculator 2604. SISO 2606 decodes the trellis corresponding to the encoding of the odd encoder. SISO 2608 decodes the trellis corresponding to the even encoder. The even and odd encoders may be, for example, the even and odd encoders illustrated in FIG. 17 through FIG. 21. SISO 2606 will accept channel metrics corresponding to even encoded tuples and SISO 2608 will accept channel metrics corresponding to odd tuples. SISO 2606 assigns the zero point, i.e., the point with equally likely probability of being any of the transmitted points, as a metric for all the even points in its trellis. Similarly, SISO 2608 assigns the 0,0 point, a point equally likely to be any constellation point, to all odd points in its trellis. The extrinsic values 3909 computed by SISO 2606 become the A Priori values 3913 for SISO 2608. Similarly, the extrinsic values 3915, computed by SISO 2608, become the A Priori values 3907 for SISO 2606. After a final iteration, SISO 2606 will provide A Posteriori values 3911 to the output processor 2618. Similarly, SISO 2608 will provide A Posteriori values 3917 to the output processor 2618. The SISO pair of FIG. 39A comprise an even/odd, or modulo-2 decoder. As indicated earlier, neither the encoding nor the decoding systems disclosed herein, are limited to even and odd (modulo 2) implementations and may be extended to any size desired. To accommodate such modulo-N systems, additional SISOs may be added. Such systems may achieve even greater parallelism then can systems employing only 1 SISO.

Figure 39B:
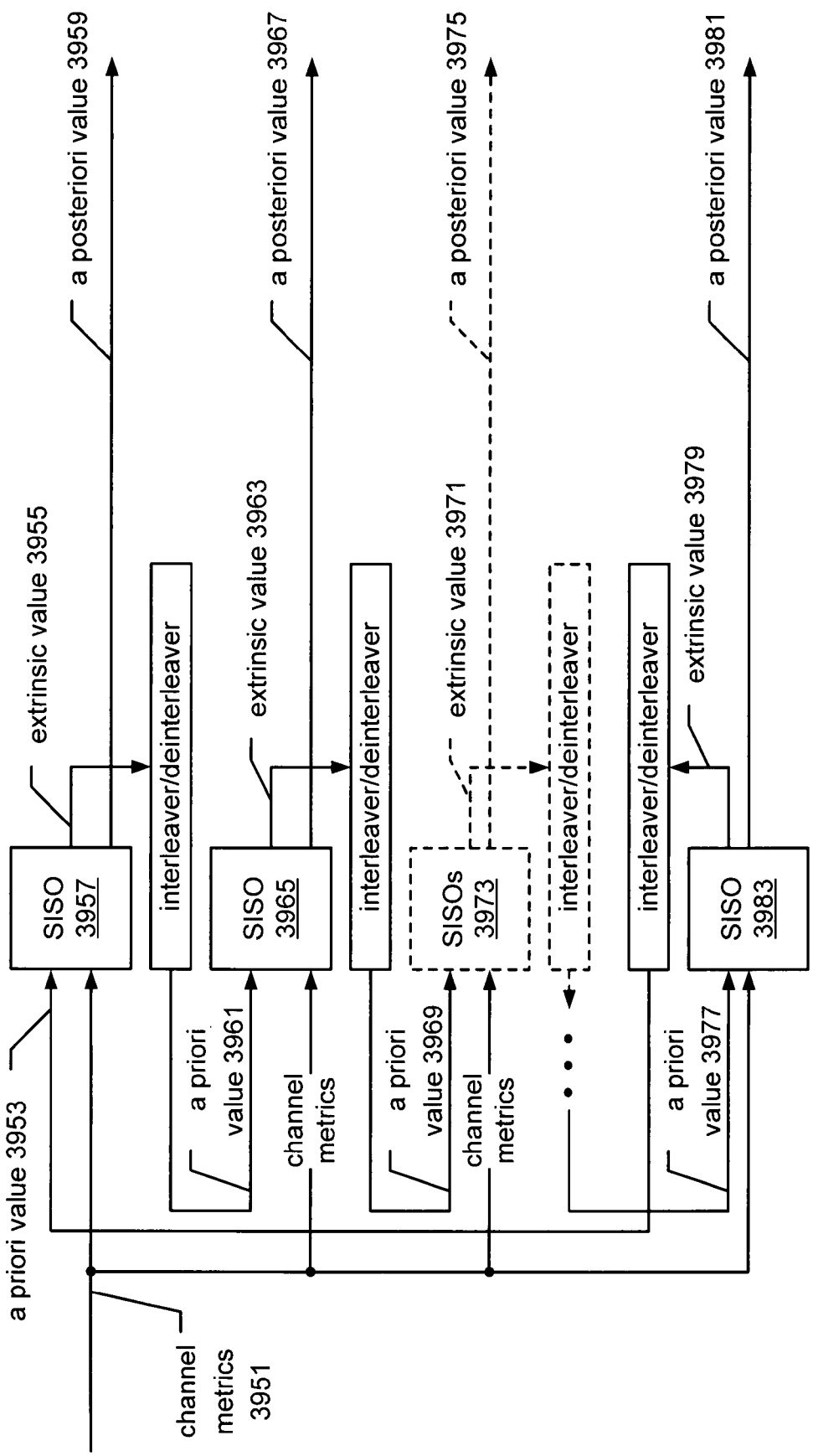
FIG. 39B is a block diagram of a modulo-N type decoder.

FIG. 39B is a block diagram of a modulo-N type decoder. A modulo-N decoder is one having N SISOs. A modulo-N decoder can provide parallel decoding for parallel encoded data streams, as previously discussed. Parallel decoding systems can provide more estimates of the points being decoded in the same amount of time as non-parallel type systems take. In FIG. 39B, channel metrics 3951 are provided to end SISOs 3957, 3965, 3973, and 3983. SISO 3973 may represent multiple SISOs. Such a modulo-N decoding system may have any number of SISOs desired. If a modulo-N encoding system is paired with a modulo-N decoding system, as disclosed herein, the decoding can take place in parallel, and may provide superior decoding for the same amount of time that a serial decoder would use. SISO 3957 computes an extrinsic value 3955, which becomes the A Priori value 3961 for SISO 3965. SISO 3965 computes an extrinsic value 3963, and then provides it as an A Priori value 3969 to SISO chain 3973. SISOs 3973 may comprise any number of SISOs configured similarly to SISO 3965. The final SISO in the SISO chain 3973 provides an extrinsic value 3971, which becomes an A Priori value 3977 for SISO 3983. The extrinsic value 3979, computed by SISO 3983, can provide an A Priori value 3953 for SISO 3957. Each SISO then can provide A Posteriori values, i.e., 3959, 3967, 3981, and the series of A Posteriori values 3975, to an output processor such as illustrated at 2718.

Figure 40:
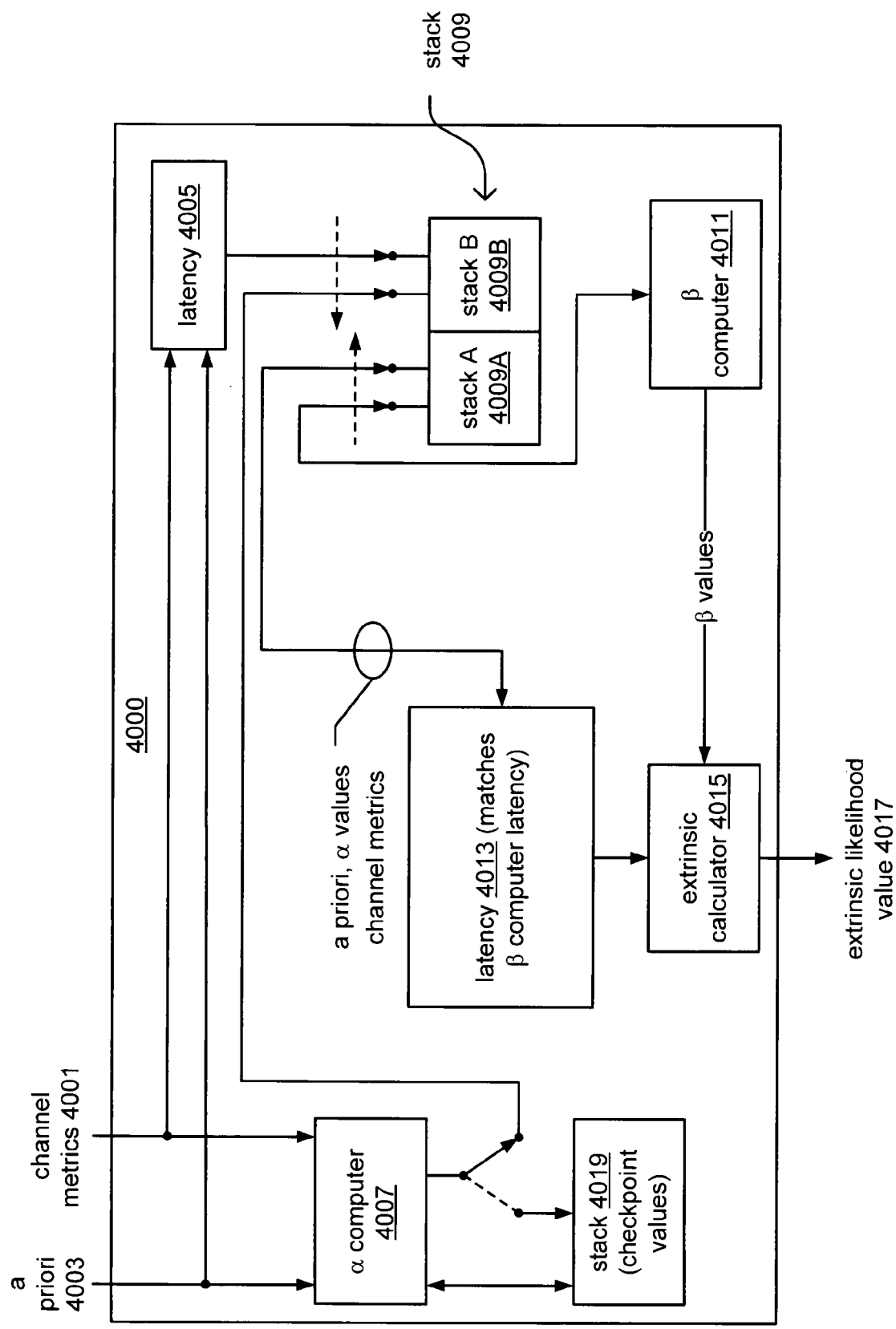
FIG. 40 is a block diagram illustrating the workings of a SISO such as that illustrated at 3901, 3957, 2606 or 2701.

FIG. 40 is a block diagram illustrating the workings of a SISO such as that illustrated at 2606, 3957, or 2608. The inputs to the SISO 4000 comprise the channel metrics 4001 and the A Priori values 4003. Both the A Priori value 4003 and the channel metrics 4001 are accepted by the alpha computer 4007. The A Priori values and channel metrics are also accepted by a latency block 4005, which provides the delays necessary for the proper internal synchronization of the SISO 4000. The alpha computer 4007 computes alpha values and pushes them on, and pops them from, a stack 4017. The output of the alpha computer also is provided to a dual stack 4009.

Latency block 4005 allows the SISO 4000 to match the latency through the alpha computer 4007. The dual stack 4009 serves to receive values from the latency block 4005 and the alpha computer 4007. While one of the dual stacks is receiving the values from the alpha computer and the latency block, the other of the dual stacks is providing values to the Ex. Beta values are computed in beta computer 4011, latency block 4013 matches the latency caused by the beta computer 4011, the alpha to beta values are then combined in metric calculator block 4015, which provides the extrinsic values 4017, to be used by other SISOs as A Priori values. In the last reiteration, the extrinsic values 4017 plus the A Priori values will provide the A Posteriori values for the output processor.

SISO 4000 may be used as a part of a system to decode various size data blocks. In one exemplary embodiment, a block of approximately 10,000 2-bit tuples is decoded. As can be readily seen, in order to compute a block of 10,000 2-bit tuples, a significant amount of memory may be used in storing the a values. Retention of such large amounts of data can make the cost of a system prohibitive. Accordingly, techniques for minimizing the amount of memory required by the SISOs computation can provide significant memory savings.

A first memory savings can be realized by retaining the I and Q values of the incoming constellation points within the circular buffer 2602. The metrics of those points are then calculated by the metric calculator 2604, as needed. If the metrics of the points retained in the circular buffer 2602 were all calculated beforehand, each point would comprise eight metrics, representing the Euclidian distance squared between the received point and all eight possible constellation points. That would mean that each point in circular buffer 2602 would translate into eight metric values, thereby requiring over 80,000 memory slots capable of holding Euclidian squared values of the metrics calculated. Such values might comprise six bits or more. If each metric value comprises six bits, then six bits times 10,000 symbols, times eight metrics per symbol, would result in nearly one-half megabit of RAM (Random Access Memory) being required to store the calculated metric values. By calculating metrics as needed, a considerable amount of memory can be saved. One difficulty with this approach, however, is that in a system of the type disclosed, that is, one capable of processing multiple types of encodings, the metric calculator must know the type of symbol being calculated in order to perform a correct calculation. This problem is solved by the symbol sequencer 3413 illustrated in FIG. 34.

The symbol sequencer 3413 provides to the metric calculator 3411, and to the input buffers 3407 and 3409, information regarding the type of encoded tuple received in order that the metric calculator and buffers 3407 and 3409 may cooperate and properly calculate the metrics of the incoming data. Such input tuple typing is illustrated in FIG. 29 through FIG. 33, and has been discussed previously.

Figure 41:
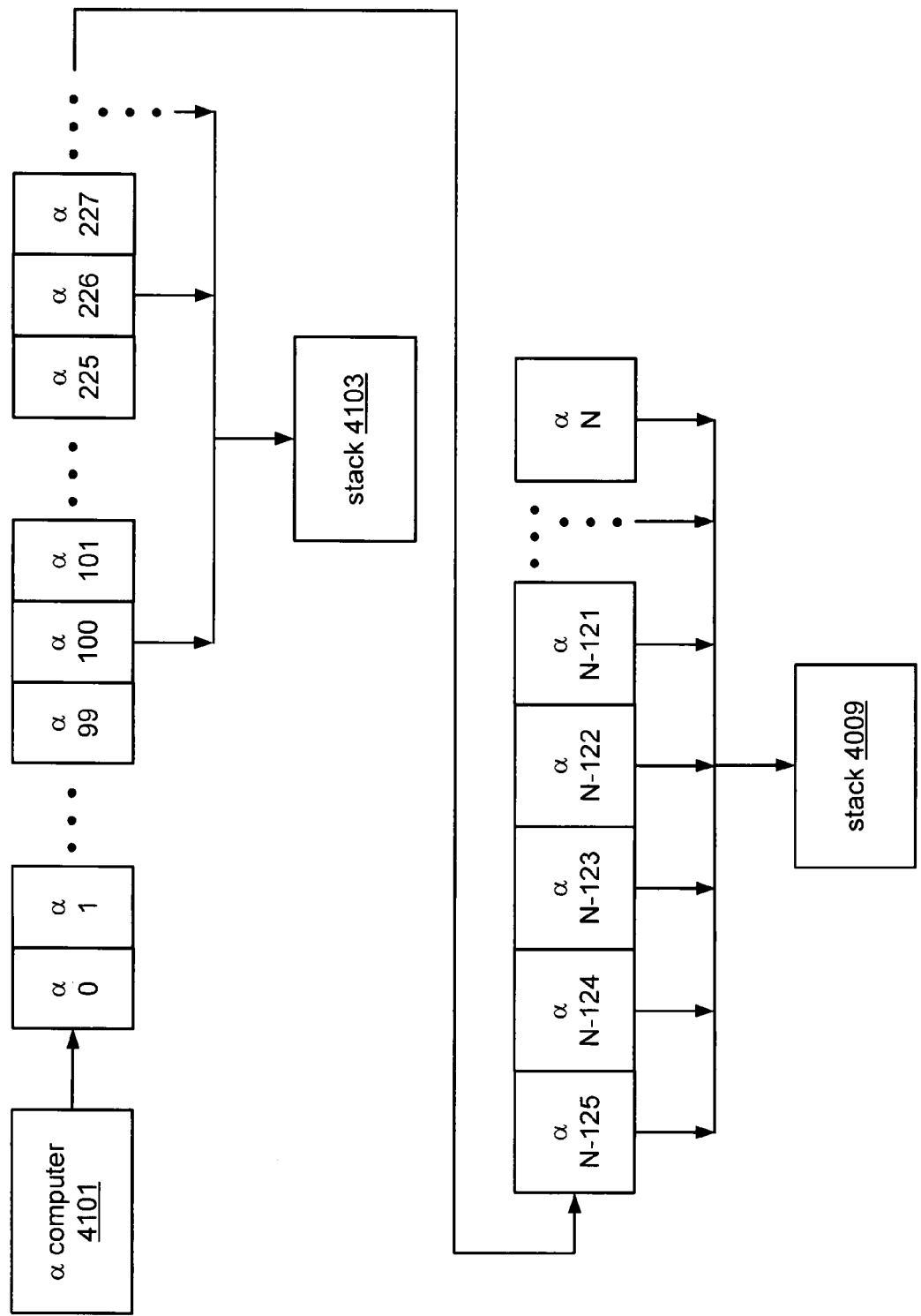
FIG. 41 is a graphical representation of the processing of alpha values within a SISO such as illustrated at 3901, 4000 or 2606.

FIG. 41 is a graphical representation of the processing of alpha values within a SISO such as illustrated at 2606, 4000 or 2608. One common method for processing alpha values is to compute all the alpha values in a block. Then the final alpha values can be used with the initial beta values in order to calculate the state metrics. If the block of data that is being processed is large, such as the exemplary 10,000 two-bit tuple block exemplarily calculated in SISO 4000, then a significant amount of memory must be allotted for storing the alpha values computed. An alternate method of processing alpha values is employed by the SISO unit 4000. In order to save memory, all the alpha values are not stored. The $\alpha$ value data matrix within the SISO is divided into a number of sub-blocks. Because the sub-block size may not divide equally into the data block size, the first sub-block may be smaller than all of the succeeding sub-blocks which are equally sized. In the example illustrated in FIG. 41, the sub-block size is 125 elements. The first sub-block numbered $\alpha$ 0 through $\alpha$ 100 is selected as having 101 elements in order that all the other sub-blocks may be of equal size, that is 125 elements. The alpha computer successively computes alpha values, $\alpha$ 0, $\alpha$ 1, etc. in succession. The alpha values are not all retained but are merely used to compute the successive alpha values. Periodically an $\alpha$ value is pushed on a stack 4103. So, for example, $\alpha$ value, $\alpha$ 100, is pushed on stack 4103 as a kind of a checkpoint. Thereafter, another 125 $\alpha$ values are computed and not retained. The next alpha value (alpha 225) is pushed on stack 4103. This process continues in succession with every $126^{th}$ value being pushed on stack 4103 until a point is reached in which the alpha computed is one sub-block size away from the end of the data block contained within the SISO. So, for example, in the present case illustrated in FIG. 42, the point is reached in a block of size N when $\alpha$ (N−125) is reached, i.e. 125 $\alpha$ values from the end of the block. When the beginning of this final sub-block within the SISO is encountered, all alpha values are pushed on a second stack 4009. The stack 4009 will then contain all alpha values of the last sub-block. This situation is illustrated further in FIG. 42.

Figure 42:
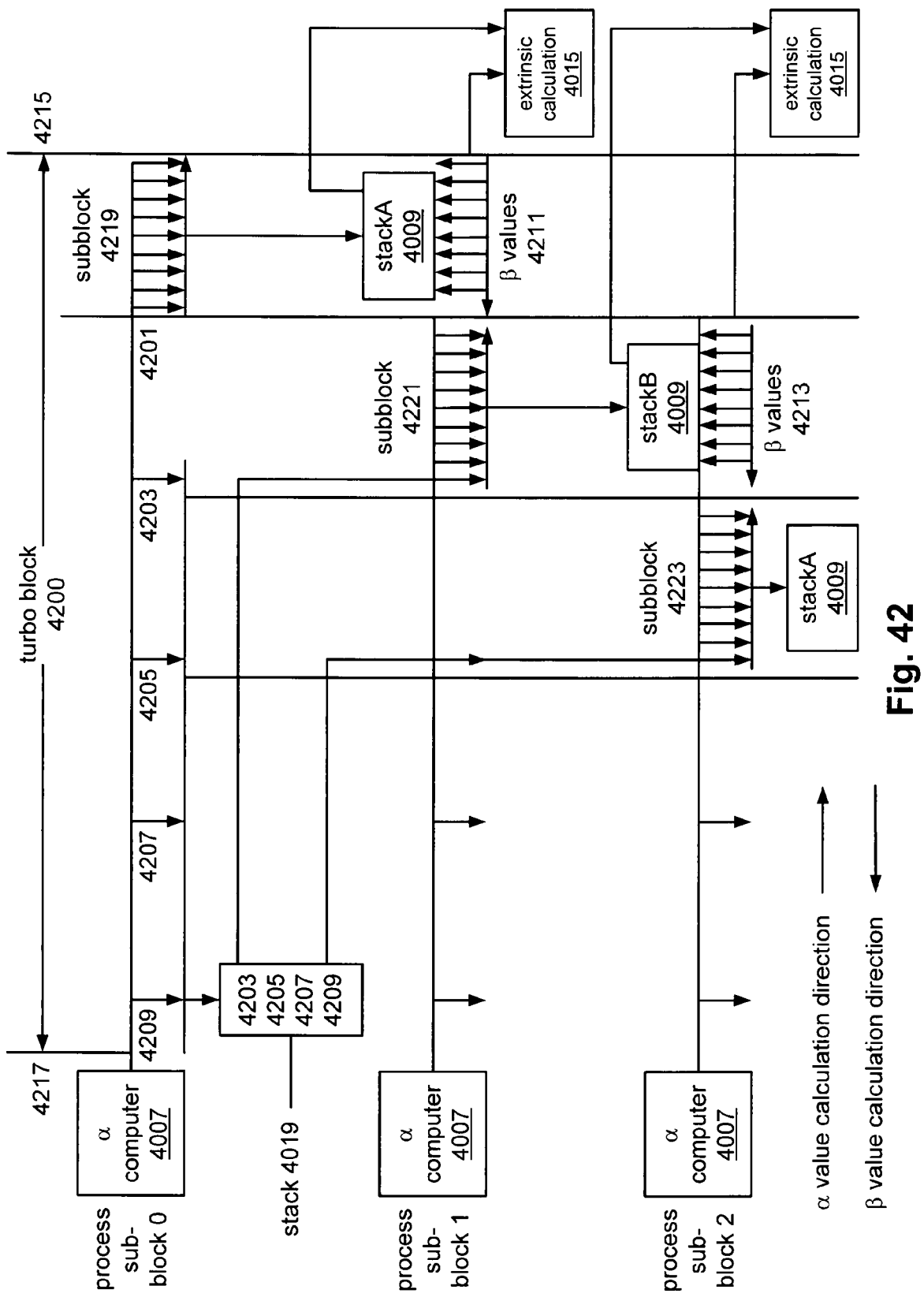
FIG. 42 is a graphical illustration of the alpha processing within the SISO 4000.

FIG. 42 is a graphical illustration of the alpha processing within the SISO 4000. The alpha values are processed in sub-blocks of data. For the purposes of illustration, a sub-block of data is taken to be 126 alpha values. A sub-block, however, may be of various sizes depending on the constraints of the particular implementation desired. The alpha block of data is illustrated at 4200 in FIG. 42. The first step in processing the alpha block 4200 is to begin at the end of block 4215 and divide the block 4200 into sub-blocks. Sub-blocks 4219, 4221 and 4223 are illustrated in FIG. 42. Once the block 4200 has been divided into sub-blocks marked by checkpoint values 4209, 4207, 4205, 4203 and 4201, the processing may begin. Alpha computer 4007 begins calculating alpha values at the beginning of the block, designated by 4217. Alpha values are computed successively and discarded until alpha value 4209, i.e., a checkpoint value, is computed. The checkpoint value 4209 is then pushed on stack 4019. Alpha computer 4007 then continues to compute alpha values until checkpoint value 4207 is reached. Once checkpoint value 4207 is reached, it is pushed on stack 4019. The distance between checkpoint value 4209 and checkpoint value 4207 is 125 values, i.e., one sub-block. Similarly, alpha values are computed from 4207 to 4205 and discarded. Checkpoint value 4205 is then pushed on stack 4019 and the process continues. The alpha computer then computes alpha values and continues to discard them until checkpoint value 4203 is reached. At which point, checkpoint value 4203 is pushed on the stack 4019. The alpha computer once again begins computing alpha values starting with alpha value 4203 until, 125 alpha values have been computed and the beginning of sub-block 4219 is reached. Sub-block 4219 is the final sub-block. The alpha computer 4007 computes alpha values for sub-block 4219 pushing every alpha value on stack A 4009. Because sub-block 4219 contains 125 elements, once the alpha computer has computed all of sub-block 4219, stack A will contain 125 alpha values. Once the alpha values for sub-block 4219 have been computed, the alpha computer will then pop value 4203 off stack 4019 and begin to compute each and every value for sub-block 4221. Values for sub-block 4221 are pushed on stack B 4009. While the values for sub-block 4221 are being pushed on stack B 4009, the previous values which had been pushed on stack A 4009 are being popped from the stack. Beta values 4211, which are computed in the opposite direction of the alpha values, are computed beginning with the end of block 4200 marked at 4215. The beta values 4211 are combined with the alpha values, as they are popped from stack A 4009, in the extrinsic calculator 4015. The beta values 4211 and the alpha values from stack A 4009 are combined until the last alpha element has been popped from stack A 4009. Once stack A 4009 has been emptied, it may once again begin receiving alpha values. Checkpoint alpha value 4205 is popped from stack 4019 and used as a starting value for the alpha computer 4007. The alpha computer may then compute the alpha values for sub-block 4223 are pushed onto the just emptied stack A 4009. While the alpha values are being computed and pushed on stack A 4009, the alpha values are being popped from stack B 4009 and combined with beta values 4213 in extrinsic calculator 4015.

In the manner just described, the SISO computes blocks of data one sub-block at a time. Computing blocks of data one sub-block at a time limits the amount of memory that must be used by the SISO. Instead of having to store an entire block of alpha values within the SISO for the computation, only the sub-block values and checkpoint values are stored. Additionally, by providing two stacks 4009 A and B, one sub-block can be processed while another sub-block is being computed.

Figure 43:
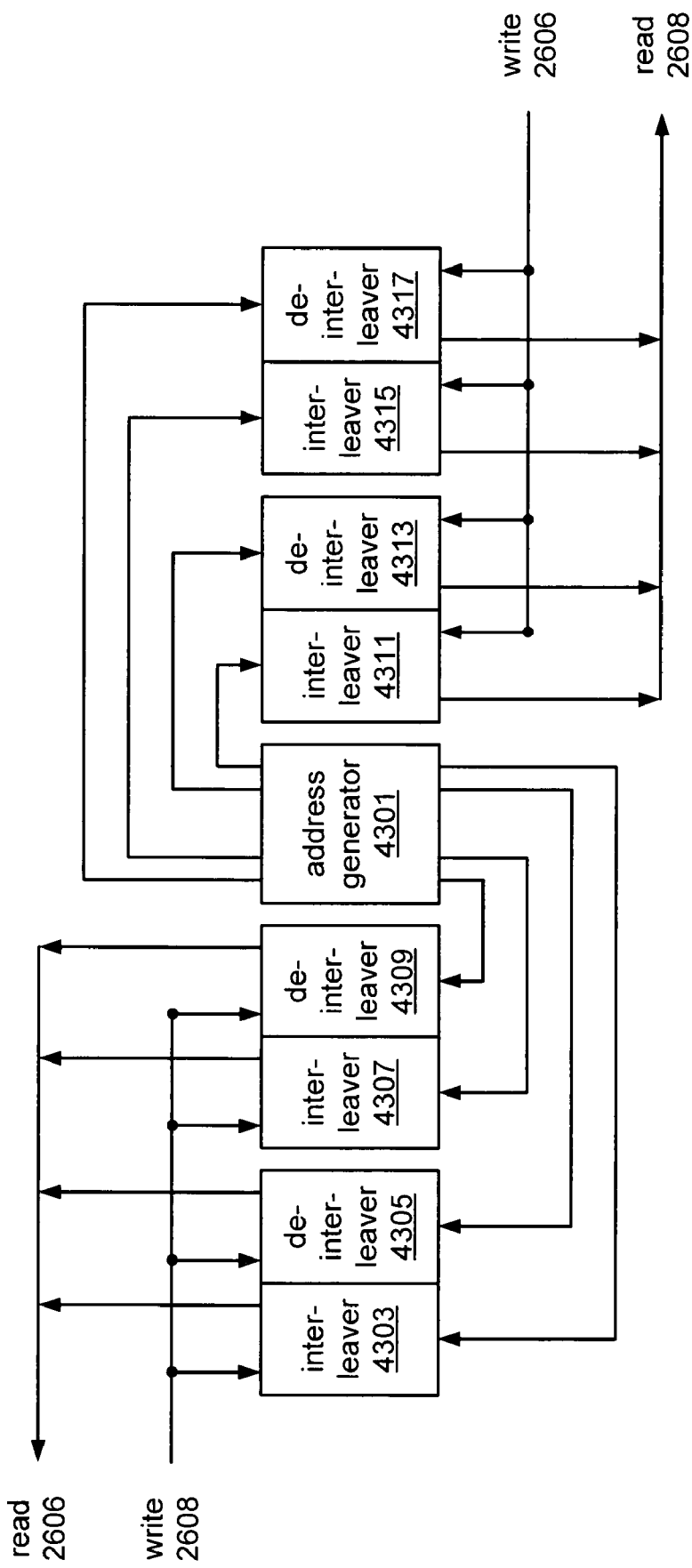
FIG. 43 is a block diagram further illustrating the read-write architecture of the decoder as illustrated in FIG. 2606.

FIG. 43 is a block diagram further illustrating the read-write architecture of the interleaver and deinterleaver of the decoder as illustrated in FIG. 26. The interleaver and deinterleaver are essentially combined utilizing eight RAM blocks 4303, 4305, 4307, 4309, 4311, 4313, 4315, and 4317. The addressing of the eight RAMs is controlled by a central address generator 4301. The address generator essentially produces eight streams of addresses, one for each RAM. Each interleaver and deinterleaver takes two sets of values and also produces two sets of values. There are eight RAM blocks because each input tuple data point, comprising two bits, has each bit interleaved and deinterleaved separately. As the alpha and beta computations are being performed in the SISOs, the a priori information is being read from an interleaver and deinterleaver. While the information is being read from an interleaver and deinterleaver, an iteration computation is proceeding and values are being written to the interleavers and deinterleavers. Therefore, at any time point, four separate RAMs may be in the process of being written to, and four separate RAMs may be in the process of being read. The generation of address sequences for the interleaver/deinterleavers of the SISO system is somewhat complex.

Figure 44:
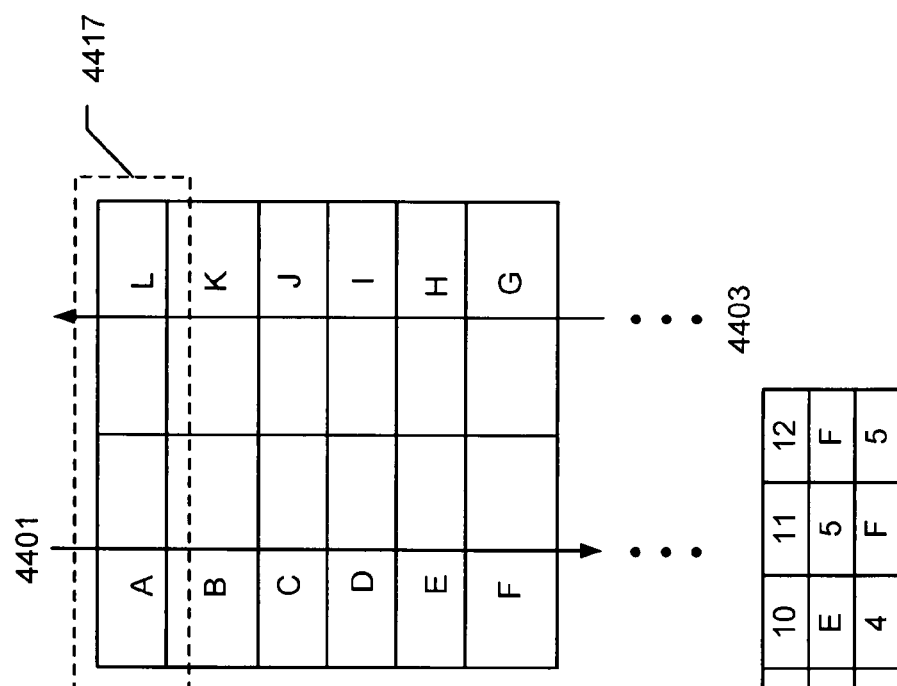
FIG. 44 is a graphical illustration illustrating the generation of decoder sequences.

FIG. 44 is a graphical illustration illustrating the generation of decoder sequences for the interleaver/deinterleaver addressing illustrated in FIG. 43. Since the decoder sequences are somewhat long, and may be greater than 10,000 addresses in length, short examples are used to illustrate the principles involved. A portion of the memory of address generator 4301 is illustrated at 4415. Within the memory 4415, an interleave sequence is stored. The interleave sequence is stored as illustrated by arrows 4401 and 4403. That is, the interleave sequence is stored in a first direction, then in a second direction. In such a manner, address 0, illustrated at 4417 stores the interleave position for the first and last words of the interleave sequence. The next memory location, after 4417 will store the interleave position for the second and the second to last words in the block, and so forth. The storage of sequences is done in this manner the interleave and deinterleave sequences for encoded bit 1 is the time reversal of the interleave sequence for encoded bit 0. In such a way, interleave sequences for the two information bits which are ST interleaved may be stored with no increased storage requirement over a sequence being stored for just one of the bits, i.e. a system in which the two information bits are IT interleaved. In such a manner, a sequence for a bit interleaver can be achieved using the same amount of data to store that sequence as would be the case for a two-bit IT interleaver. The interleaving/deinterleaving sequence for one of the two information bits is the time reversal of the interleaving/deinterleaving sequence for the other information bit. For the practical purposes of interleaving and deinterleaving, the sequences thus generated are effectively independent.

A second constraint that the interleave sequence has is that odd positions interleave to odd positions and even positions interleave to even positions in order to correspond to the encoding method described previously. The even and odd sequences are used by way of illustration. The method being described can be extended to a modulo N-type sequence where N is whatever integer value desired. It is also desirable to produce both the sequence and the inverse sequence without having the requirement of storing both. The basic method of generating both the sequence and the inverse sequence is to use a sequence in a first case to write in a permuted manner to RAM according to the sequence, and in the second case to read from RAM in a permuted manner according to the sequence. In other words, in one case the values are written sequentially and read in a permuted manner, and in the second case they are written in a permuted manner and read sequentially. This method is briefly illustrated in the following. For a more thorough discussion, refer to the previous encoder discussion. In other words, an address stream for the interleaving and deinterleaving sequence of FIG. 43 can be produced through the expedient of writing received data sequentially and then reading it according to a permuted sequence, as well as writing data according to a permuted sequence and then reading it sequentially. Additionally, even addresses must be written to even addresses and odd addresses must be written to odd addresses in the example decoder illustrated. Of course, as stated previously, this even odd, modulo 2, scheme may be extended to any modulo level.

As further illustration, consider the sequence of elements A, B, C, D, E, and F 4409. Sequence 4409 is merely a permutation of a sequence of addresses 0, 1, 2, 3, 4, and 5, and so forth, that is, sequence 4411. It has been previously shown that sequences may be generated wherein even positions interleave to even positions and odd positions interleave to odd positions. Furthermore, it has been shown that modulo interleaving sequences, where a modulo N position will always interleave to a position having the same modulo N, can be generated. Another way to generate such sequences is to treat the even sequence as a completely separate sequence from the odd sequence and to generate interleaving addresses for the odd and even sequences accordingly. By separating the sequences, it is assured that an even address is never mapped to an odd address or vice-versa. This methodology can be applied to modulo N sequences in which each sequence of the modulo N sequence is generated separately. By generating the sequences separately, no writing to or reading from incorrect addresses will be encountered.

In the present example, the odd interleaver sequence is the inverse permutation of the sequence used to interleave the even sequence. In other words, the interleave sequence for the even positions would be the deinterleave sequence for the odd positions and the deinterleave sequence for the odd positions will be the interleave sequence for the even positions. By doing so, the odd sequence and even sequence generate a code have the same distant properties. Furthermore, generating a good odd sequence automatically guarantees the generation of a good even sequence derived from the odd sequence. So, for example, examining the write address for one of the channels of the sequence as illustrated in 4405. The sequence 4405 is formed from sequences 4409 and 4411. Sequence 4409 is a permutation of sequence 4411, which is obviously a sequential sequence. Sequence 4405 would then represent the write addresses for a given bit lane (the bits are interleaved separately, thus resulting in two separate bit lanes). The inverse sequence 4407 would then represent the read addresses. The interleave sequence for the odd positions is the inverse of the interleave sequence for the odd positions. So while positions A, B, C, D, E and F are written to, positions 0, 1, 2, 3, 4, and 5 would be read from. Therefore, if it is not desired to write the even and odd sequence to separate RAMs, sequences 4405 and 4407 may each be multiplied by 2 and have a 1 added to every other position. This procedure of ensuring that the odd position addresses specify only odd position addresses and even position addresses interleave to only even position addresses is the same as discussed with respect to the encoder. The decoder may proceed on exactly the same basis as the encoder with respect to interleaving to odd and even positions. All comments regarding methodologies for creating sequences of interleaving apply to both the encoder and decoder. Both the encoder and decoder can use odd and even or modulo N interleaving, depending on the application desired. If the interleaver is according to table 4413 with the write addresses represented by sequence 4405 and the read addresses represented by 4407, then the deinterleaver would be the same table 4413 with the write addresses represented by sequence 4407 and the read addresses represented by sequence 4405. Further interleave and deinterleave sequences can be generated by time reversing sequences 4405 and 4407. This is shown in table 4419. That is, the second bit may have an interleaving sequence corresponding to a write address represented by sequence 4421 of table 4419 and a read address of 4422. The deinterleaver corresponding to a write sequence of 4421 and a read sequence of 4422 will be a read sequence of 4422 and a write sequence of 4421.

Figure 45:
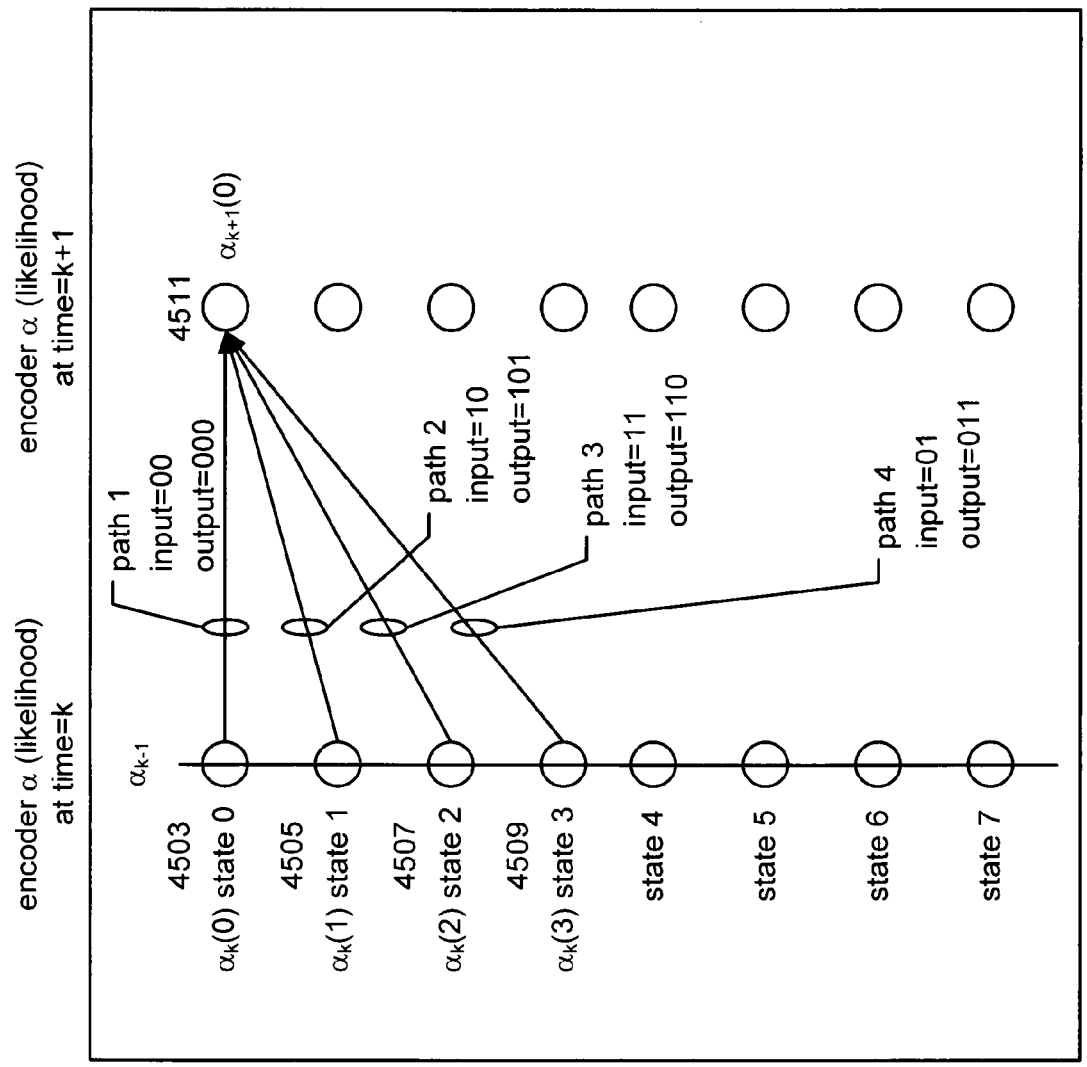
FIG. 45 is a graphical illustration of a decoder trellis according to an embodiment of the invention.

FIG. 45 is a graphical illustration of a decoder trellis according to an embodiment of the invention. A decoder trellis, in general, represents possible states of the encoder, the likelihood of being in individual states, and the transitions which may occur between states. In FIG. 45, the encoder represented is a turbo trellis coded modulation encoder having odd even interleaving and constituent encoders as illustrated in FIG. 5. In FIG. 45, a transition into state 0 at time equal to k+1 is illustrated. The likelihood that the encoder is in state 0 at time k+1 is proportional to $\alpha_{k+1}(0)$, i.e., state 4511. To end up in state 4511, at time k+1, the encoder had to be in state 0, state 1, state 2, or state 3 at time k. This is so because, as illustrated in FIG. 45, the precursor state for state 4511 is stated 4503, 4505, 4507 or 4509 only. These transitions are in accordance with the trellis diagram of FIG. 6. Accordingly, the enter state 4511 at time k+1, the encoder must be in state 4503 and transit along path number 1, or the encoder may be in state 4505 and transition along path 2 into state 4511, or the encoder may be in state 4507 and transit along path 3 to state 4511, or the encoder may be in state 4509 and transit into state 4511. If the encoder is in state 4503, that is, state 0, at time k and the encoder receives an input of 00, it will transition along path 1 and provide an output of 000 as indicated in FIG. 45. If the encoder is in state 1 at time k, that is, state 4505, and the encoder receives an input of 10, it will transition according to path 2 and output a value of 101. If the encoder is in state 2, corresponding to state 4507 at time k, and the encoder receives an input of 11, then the encoder will transition along path 3 into state 4511, outputting a 110. If the encoder is in state 3, corresponding to state 4509 at time k, and the encoder received an input of a 01, then the encoder will transition along path 4 into state 4511 and output a 011.

Therefore, to find the likelihood that the encoder is in state 0, i.e., 4511, at time k+1, it is necessary to consider the likelihood that the encoder was in a precursor state, that is, state 0-3, and made the transition into state 0 at time k+1.

Likelihoods within the decoder system are based upon the Euclidian distance mean squared between a receive point and a possible transmitted constellation point, as illustrated and discussed with reference to FIG. 35. The likelihood metrics used in the illustrative decoder (for example, as drawn in FIG. 26) are inversely proportional to the probability that a received point is equal to a constellation point. To illustrate the likelihood function, consider point 3501 of FIG. 35. Point 3501 represents a received signal value in the I-Q plane. Received point 3501 does not correspond to any point in the transmitted constellation, that is, point 3503 through point 3517. Received point 3501 may in have been transmitted as any of the points 3503 through 3517. The likelihood that the received point 3501 is actually point 3503 is equal to the Euclidian squared distance between received point 3501 and point 3503. Similarly, the likelihood that received point 3501 is any of the other points within FIG. 35 is equal to the distance between the received point 3501 and the candidate point squared. In other words, the metric representing the likelihood that received point 3501 is equal to a constellation point is proportional to the distance squared between the received point and any constellation point. Thus, the higher value for the metric, representing the distance between the received point and the constellation point, the less likely that the received point was transmitted as the constellation point. In other words, if the distance squared between the received point is 0, then it is highly likely that the received point and the constellation point are the same point.

NOTE: Even though the received point may coincide with one constellation point, it may have been in fact transmitted as another constellation point, and accordingly there is always a likelihood that the received point corresponds to each of the points within the constellation. In other words, no matter where received point 3501 is located in the I-Q plane, there is some finite likelihood that point 3503 was transmitted, there is some finite likelihood that point 3505 was transmitted, there is some finite likelihood that point 3507 was transmitted, and so forth. Because the map decoder illustrated in the present disclosure is a probabilistic decoder, all the points within a decoding trellis, such as those illustrated in FIG. 45, have some likelihood. An iterative decoder generally assigns likelihoods to each of the given points and only in the last iteration are the likelihood values, that is, soft values, turned into hard values of 1 or 0. Probabilistic decoders in general make successive estimates of the points received and iteratively refine the estimates. Although there are many different ways of representing the probability or likelihood of points, the decoder of the present embodiment uses the Euclidian distance squared in order that the Min* operation may be employed. The Min* operation is described and illustrated later in this disclosure.

Because the Euclidean distance squared is used as the likelihood metric in the present embodiment of the decoder the higher value for the likelihood metrics indicate a lower probability that the received point is the constellation point being computed. That is, if the metric of a received point is zero then the received point actually coincides with a constellation point and thus has a high probability of being the constellation point. If, on the other hand, the metric is a high value then the distance between the constellation point and the received point is larger and the likelihood that the constellation point is equal to the received point is lower. Thus, in the present disclosure the term "likelihood" is used in most cases. The term "likelihood" as used herein means that the lower value for the likelihood indicates that the point is more probably equal to a constellation point. Put simply within the present disclosure "likelihood" is inversely proportional to probability, although methods herein can be applied regardless if probability or likelihood is used.

In order to decide the likelihood that the encoder ended up in state 4511 (i.e. state 0) at time k+1, the likelihood of being in state 0-3 must be considered and must be multiplied by the likelihood of making the transition from the precursor state into state 4511 and multiplied by the a priori probability of the input bits. Although there is a finite likelihood that an encoder in state 0 came from state 0. There is also a finite likelihood that the encoder in state 0 had been in state 1 as a precursor state. There is also a finite likelihood that the encoder had been in state 2 as a precursor state to state 0. There is also a finite likelihood that the encoder had been in state 3 as a precursor state to state 0. Therefore, the likelihood of being in any given state is a product with a likelihood of a precursor state and the likelihood of a transition from that precursor state summed over all precursor states. In the present embodiment there are four events which may lead to state 4511. In order to more clearly convey the method of processing the four events which may lead to state 4511 (i.e. state 0) will be given the abbreviations A, B, C and D. Event A is the likelihood of being in state 4503 times the likelihood of making the transition from state 4503 to 4511. This event can be expressed as $\alpha_k(0) \times \delta_k(00) \times$ the a priori probability that the input is equal to 00. $\alpha_k(0)$ is equal to the likelihood of being in state 0 at time k. $\delta_k(00)$ is the likelihood, or metric, of receiving an input of 00 causing the transition from $\alpha_k(0)$ to $\alpha_{k+1}(0)$. In like manner Event B is the likelihood of being in state 4505 times the likelihood of making the transition from state 4505 to state 4511. In other words, $\alpha_k(1) \times \delta_k(10) \times$ the a priori probability that the input is equal to 10. Event C is that the encoder was in state 4507 at time=k and made the transition to state 4511 at time=k+1. Similarly, this can be stated $\alpha_k(2)^* \delta_k(11) \times$ the a priori probability that the input is equal to 11. Event D is that the encoder was in state 4509 and made the transition into state 4511. In other words, $\alpha_k(3)^* \delta_k(01) \times$ the a priori probability that the input is equal to 01.

The probability of being in any given state therefore, which has been abbreviated by alpha, is the sum of likelihoods of being in a precursor state times the likelihood of transition to the given state and the a priori probability of the input. In general, probabilistic decoders function by adding multiplied likelihoods.

The multiplication of probabilities is very expensive both in terms of time consumed and circuitry used as when considered with respect to the operation of addition. Therefore, it is desirable to substitute for the multiplication of likelihoods or probabilities the addition of the logarithm of the probabilities or likelihoods which is an equivalent operation to multiplication. Therefore, probabilistic decoders, in which multiplications are common operations, ordinarily employ the addition of logarithms of numbers instead of the multiplications of those numbers.

The probability of being in any given state such as 4511 is equal to the sum probabilities of the precursor states times the probability of transition from the precursor states into the present state times the a prior probability of the inputs. As discussed previously, event A is the likelihood of being in state 0 and making the transition to state 0. B is the event probability equivalent to being in state 1 and making the transition to state 0. Event C is the likelihood of being in state 2 and making the transition to state 0. Event D is the likelihood of being in state 3 and making the transition into state 0. To determine the likelihood of all the states at time k+1 transitions must be evaluated. That is there are 32 possible transitions from precursor states into the current states. As stated previously, the likelihoods or probabilities of being in states and of having effecting certain transitions are all kept within the decoder in logarithmic form in order to speed the decoding by performing addition instead of multiplication. This however leads to some difficulty in estimating the probability of being in a given state because the probability of being in a given state is equal to the sum of events A+B+C+D as previously stated. Ordinarily these probabilities of likelihoods would be simply added. This is not possible owing to the fact that the probability or likelihoods within the decoder are in logarithmic form. One solution to this problem is to convert the likelihoods or probabilities from logarithmic values into ordinary values, add them, and then convert back into a logarithmic values. As might be surmised this operation can be time consuming and complex. Instead an operation of min* is used. The min* is a variation of the more common operation of Max*. The operation of Max* is known in the art. min* is an identity similar to the Max* operation but is one which may be performed in the present case on log likelihood values. The min* operation is as follows.

$$\min*(A,B) = \min(A,B) - 1n(1+e^{-*A-B*})$$

The min* operation can therefore be used to find the sum of likelihoods of values which are in logarithmic form.

Finally, the likelihood of being in state 4511 is equal to the min*(A,B,C,D). Unfortunately, however, min* operation can only take 2 operands for its inputs. Two operands would be sufficient if the decoder being illustrated was a bit decoder in which there were only two precursor states for any present state. The present decoder is of a type of decoder, generally referred to as a symbol decoder, in which the likelihoods are evaluated not on the basis of individual bits input to the encoder, but on the basis of a combination, in this case pairs, of bits. Studies have shown that the decoding is slightly improved in the present case when the decoder is operated as a symbol decoder over when the decoder is operated as a bit decoder. In reality the decoder as described is a hybrid combination symbol and bit decoder.

Figure 46A:
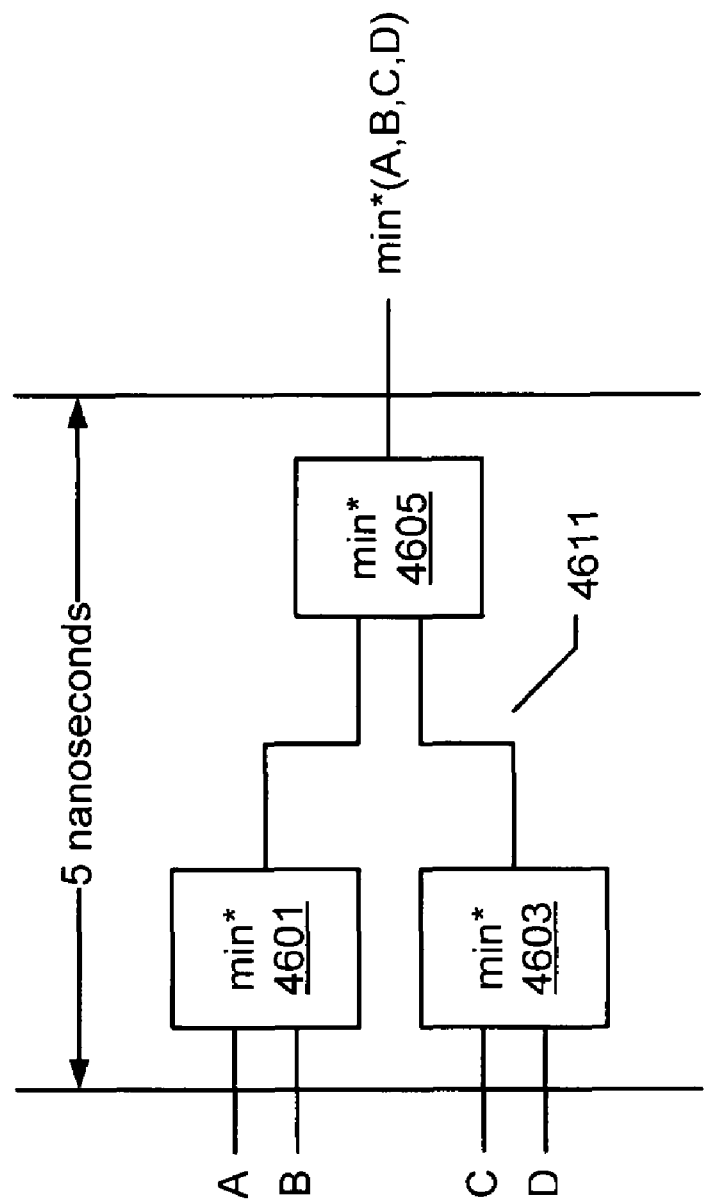
FIG. 46A is a graphical illustration of a method for applying the min* operation to four different values.

FIG. 46A is a graphical illustration of a method for applying the min* operation to four different values. The configuration of FIG. 46A illustrates a block diagram of a method for performing a min* operation on four separate values, A, B, C and D. As indicated in FIG. 46A a timing goal of the operation in one particular embodiment is to be able to perform a min* operation on four operands within five nanoseconds.

Figure 46B:
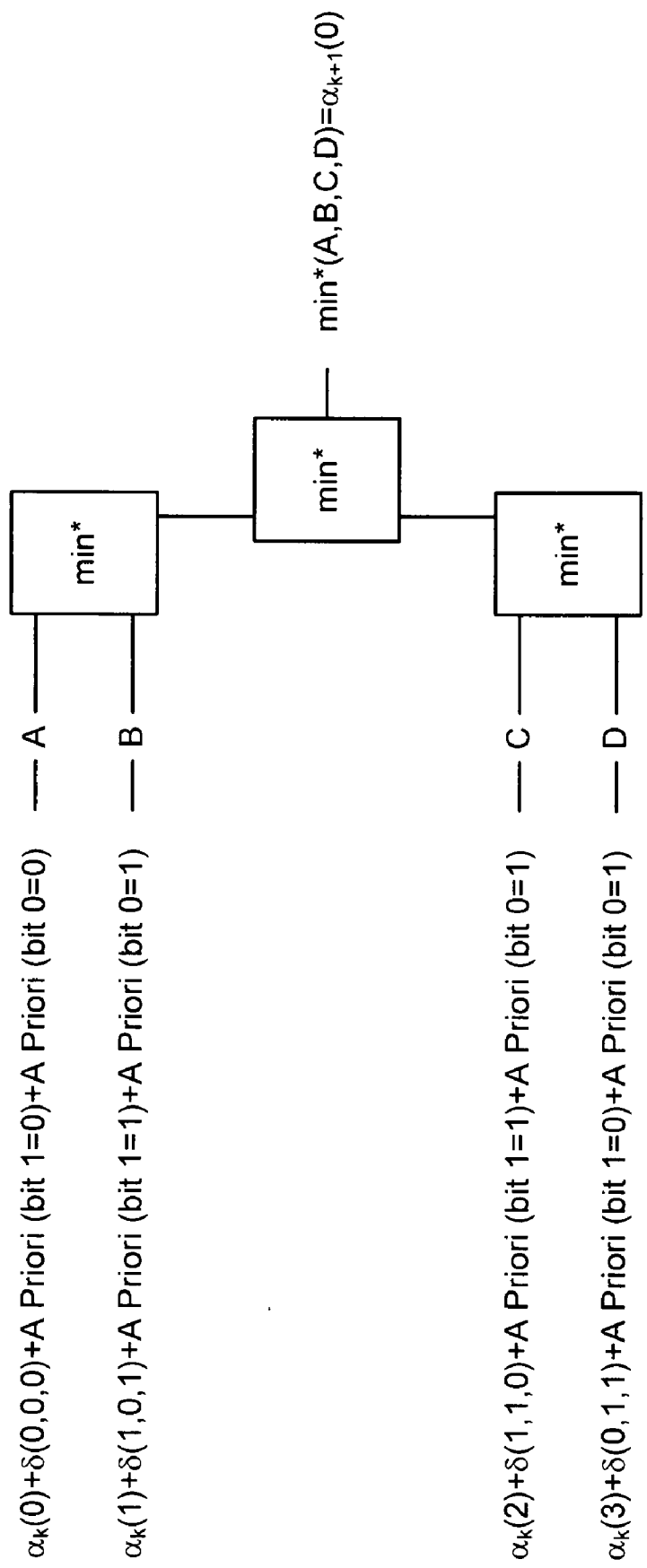
FIG. 46B is a graphical illustration further illustrating the use of the min* operation.

FIG. 46B is a graphical illustration further illustrating the use of the min* operation. FIG. 46B the min* configuration of FIG. 46A with the values for A, B. C, and D substituted, which is used to determine $\alpha_{k+1}(0)$, that is the likelihood of being in state 0. The Four inputs to the min* operation (that is A, B, C and D) are further defined in FIG. 46B. The A term is equal to $\alpha_k(0)$ plus $\delta$ (0, 0, 0, 0), which is a metric corresponding to the generation of an output of 000 i.e., the metric value calculated by the metric calculator, plus the a priori likelihood that bit 1 equal to 0 was received by the encoder plus the priori likelihood that bit 0 equal 0 was received by the encoder. Because all the values illustrated are in logarithmic scale adding the values together produces a multiplication of the likelihood.

Similarly, $B=\alpha_k(1)+\delta(1, 0, 1)$+a priori (bit 1=1)+a priori (bit 0=0)

Similarly $C=\alpha_k(2)+\delta(1, 1, 0)$+a priori (bit 1=1)+a priori (bit 0=1)

Similarly $D=\alpha_k(3)+\delta(0, 1, 1)$+a priori (bit 0=1)+a priori (bit 0=0).

FIG. 46B illustrates that prior to being able to perform a min* operation on the four quantifies A, B, C and D several sub quantities must be added. For example, in order to obtain the value A to provide it to the min* operations the values of $\alpha_k(0)$ must be added to the metric value $\delta(0, 0, 0)$ plus the a priori probability that bit 1=0 plus the a priori probability that bit 0=0. One way to add quantities is in a carry ripple adder as illustrated in FIG. 47.

Figure 47:
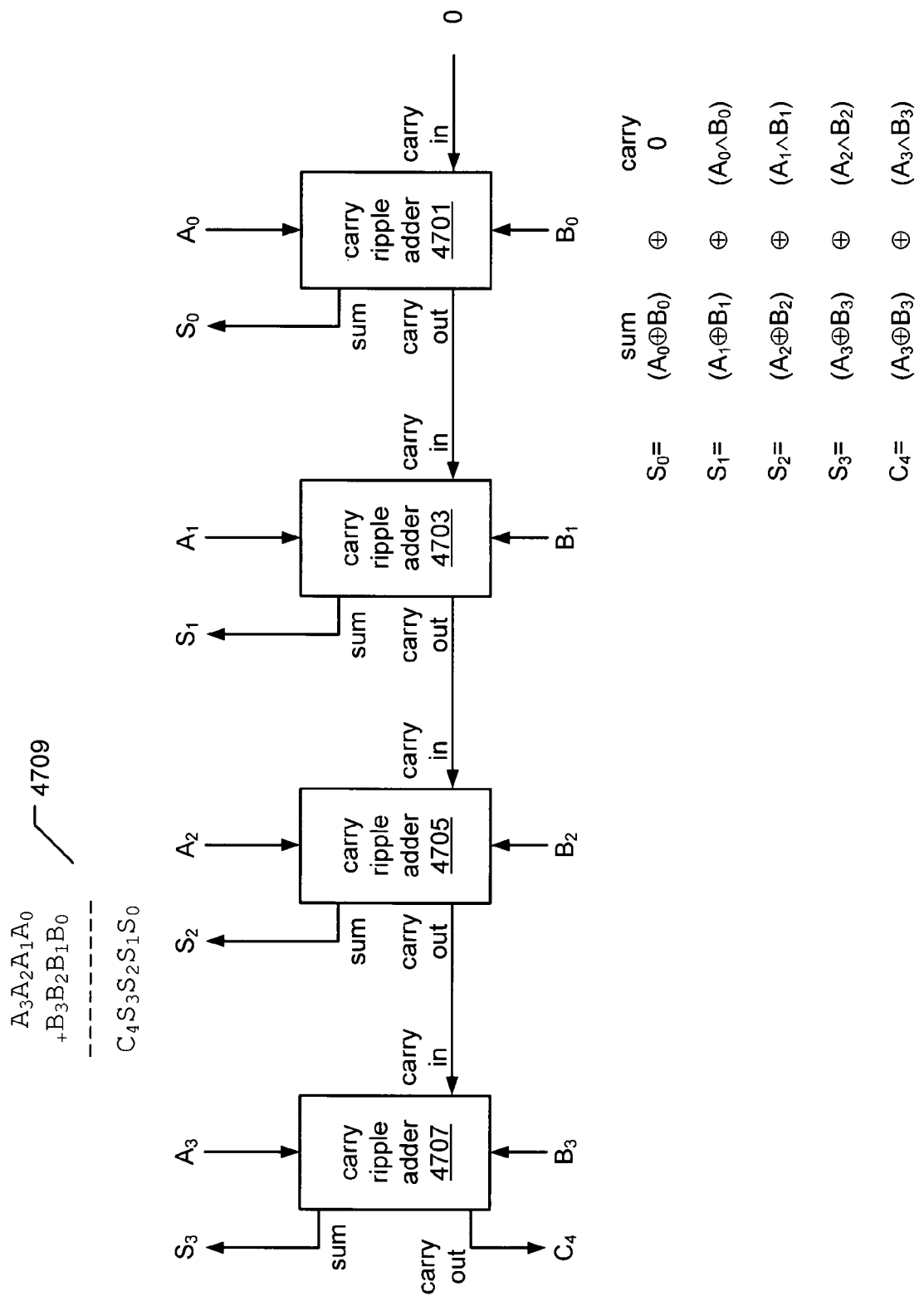
FIG. 47 is a graphical illustration of two methods of performing electronic addition.

FIG. 47 is a graphical illustration of two methods of performing electronic addition. The first method of performing electronic addition is through the use of the carry ripple adder. A carry ripple adder has basically three inputs. Two inputs for each bit to be added and a carry-in input. In addition to the three inputs the carry ripple adder has two outputs, the sum output and a carry-out output. Traditionally the carry-out output is tied to the carry in input of the next successive stage. Because the carry-out output from one stage is coupled to the carry-in input of a second stage the carry must ripple through the adders in order to arrive at a correct result. Performing the calculation illustrated at 4709 using a ripple carry adder four stages of ripple carry adders must be employed. These stages are illustrated at 4701, 4703, 4705 and 4707. It is obvious from the diagram that in order for a correct output to be achieved by a ripple carry adder a carry must ripple, or be propagated from the carry-out of ripple carry adder 4701 through ripple carry adder 4703, through ripple carry adder 4705 and finally into ripple carry adder 4707. Because the carry ripples earlier stages must complete their computation before the later stages can receive a valid input for the carry in and thus compute a valid output. In contrast using the process of carry sum addition can speed the addition process considerably. So in order to perform the addition 4709, carry save addition is performed using the format at 4711. Carry sum addition is a process known in the art. Carry ripple addition 4705 must have the final value ripple through 4 carry ripple adders in order to produce a valid result. In contrast with the carry sum adder, the computation of the sum and carry can be carried out simultaneously. Computation of the sum and carry equation will take only one delay period each. It should be obvious that a carry sum adder does not produce an output that is dependent on the numbers of digits being added because no ripple is generated. Only in the last stage of carry save add will a carry ripple effect be required. Therefore, the computation illustrated in FIG. 48B may be sped up through the substitution of a carry look ahead for a ripple carry type adder.

Figure 48:
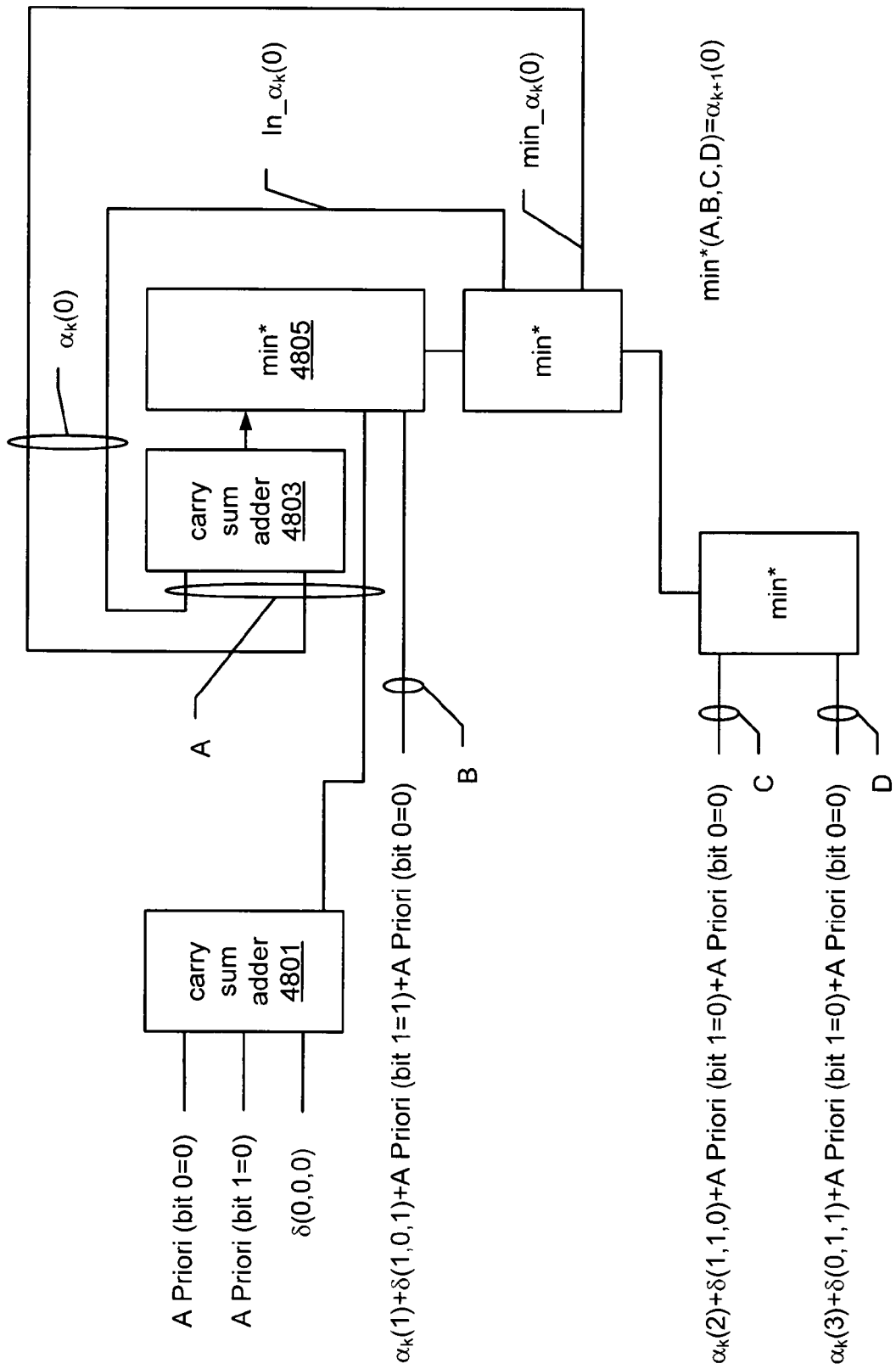
FIG. 48 is a block diagram in which a carry sum adder is added to a min* circuit according to an embodiment of the invention.

FIG. 48 is a block diagram in which a carry sum adder is added to a min* circuit according to an embodiment of the invention. FIG. 48 is essentially a copy of the circuit of FIG. 46B with the addition of carry ripple adder 4801 and carry save adder 4803. The carry ripple adder 4801 performs a carry sum add on the likelihood that an a priori (bit 0=0), the likelihood that an a priori (bit 1=0) and the likelihood of the transition metric Δ (0,0,0).

Figure 49:
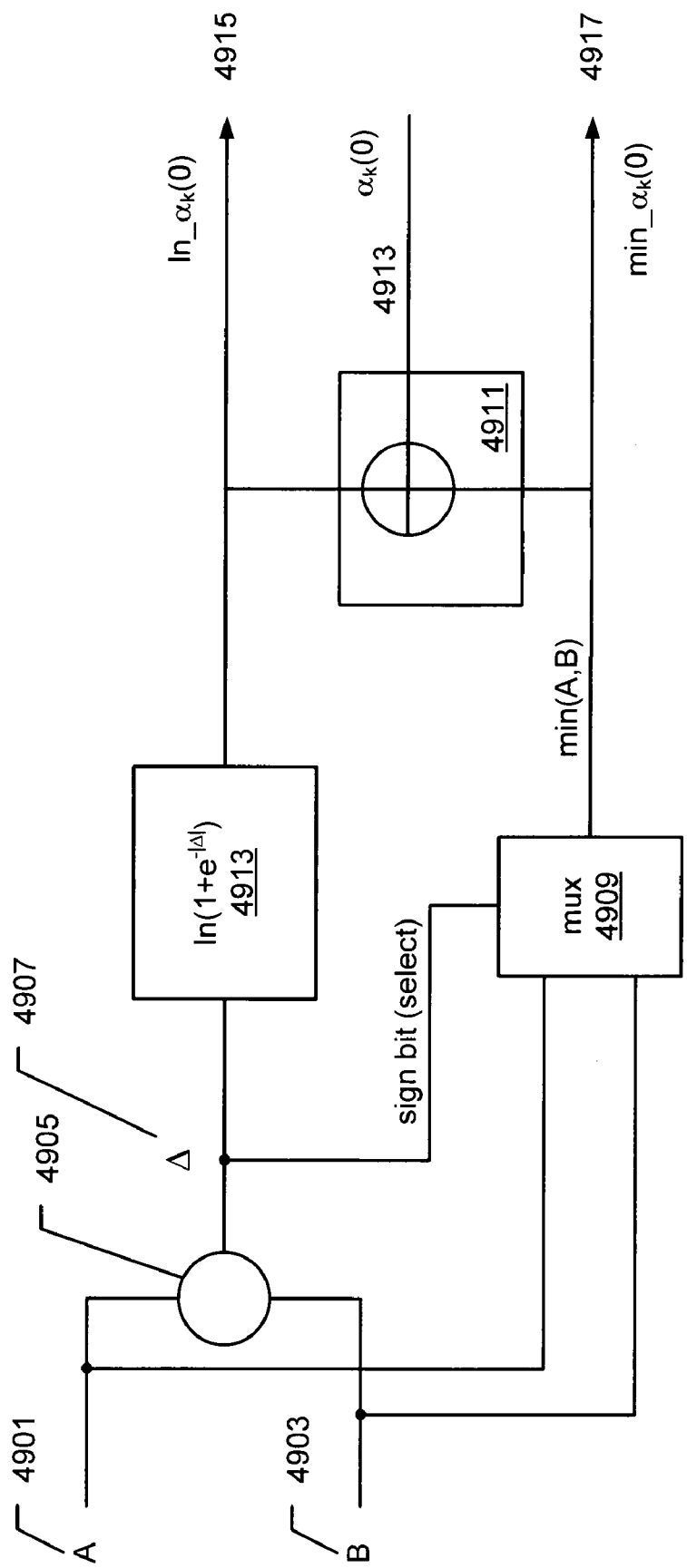
FIG. 49 is a graphical illustration of min* calculation.

FIG. 48 is a block diagram in which a carry sum adder is added to a Min* circuit according to an embodiment of the invention. FIG. 48 is essentially a copy of the circuit of FIG. 46B with the addition of carry sum adder 4801 and carry sum adder 4803. The carry sum adder 4801 performs a carry sum add on the likelihood that an a priori (bit 0=0), the likelihood that an a priori (bit 1=0) and the likelihood of the transition metric Δ (0,0,0). In addition, in FIG. 48 the output of the Min* operation has been split into two outputs. This splitting of the output will be illustrated in successive drawings. To understand why the outputs of the Min* is split into two separate outputs it is necessary to consider a typical Min* type operation. Such a typical Min* operation is illustrated in FIG. 49. FIG. 49 is an implementation of the Min* operation. In FIG. 49 two inputs 4901 and 4903 receive the values on which the Min* operation is to be performed. The values 4901 and 4903 are then subtracted in a subtractor 4905. Typically such a subtractor will involve negating one of the inputs and adding it to the other input. The difference between the A and B input is then provided at output 4907. The difference value Δ is used in both portions of the Min* operation. That is the sign bit of Δ is used to select which of the inputs A or B is the minimum. This input is then selected in a circuit such as multiplexer 4909. Multiplexer 4909 is controlled by the sign bit of the Δ. The output of multiplexer 4909 is the minimum of A, B. In addition, the Δ is used in the log calculation of $\ln(1+e^{-|\Delta|})$. The output of the log calculation block 4913 is then summed with the minimum of A and B and the resulting summation is the Min* of A, B. This operation too can be sped up by eliminating the adder 4911. Instead of making an addition in adder 4901, the output of the log calculation block 4913, also designated as $\ln\_\alpha_k(0)$ and the output of multiplexer 4909 abbreviated as $\min\_\alpha_k(0)$. By eliminating the addition in 4911 the operation of the Min* will be sped up. The addition operation must still be performed elsewhere. The addition operation is performed within the Min*block 4805 in a carry save adder 4803 as illustrated in FIG. 48. Carry sum adder 4803 can work concurrently with carry save adder 4801. In other words, carry sum adder 4801 and carry sum adder 4803 operate in parallel and take the same amount of time to complete. In essence the carry sum add 4803 can be carried on during the same time period that carry sum adder 4801 is operating. In this way the carry sum add 4803 adds no time to the overall functioning of the circuit since it can be done in parallel with another necessary block.

With respect to FIG. 49, although the output of the min* operator, that is $\text{Ln}\_\alpha_k(0)$, i.e. 4915 and $\text{Min}\_\alpha_k(0)$, i.e. 4917 not combined until they are combined in adder 4911 two outputs are combined in block 4911 and form the $\alpha_k(0)$ values 4913. The values 4913 represent the values that are pushed on to stack 4019. As such, the operation 4911 can be relatively slow since the a values are being pushed on a stack for later usage in any instance. In other words, the output of the min* circuit of FIG. 49 is calculated twice. The first instance is the output of the log block 4913 and the multiplexer block 4909 are maintained as integral outputs 4915 and 4917. The integral outputs 4915 and 4917 are fed back to the input of the min* where they are combined with other values that are being carried sum added.

As mentioned before, adding values to a carry sum adder does not slow down the calculation due to a ripple affect. In other words, the more of the Min* operation that can be combined in carry sum adders the faster the operation will be over for example combining elements in a ripple carry adder. In the instance cited, the outputs 4915 and 4917 are combined in a number of carry sum adders in order to make the operation of the multiple additions fast.

Figure 50:
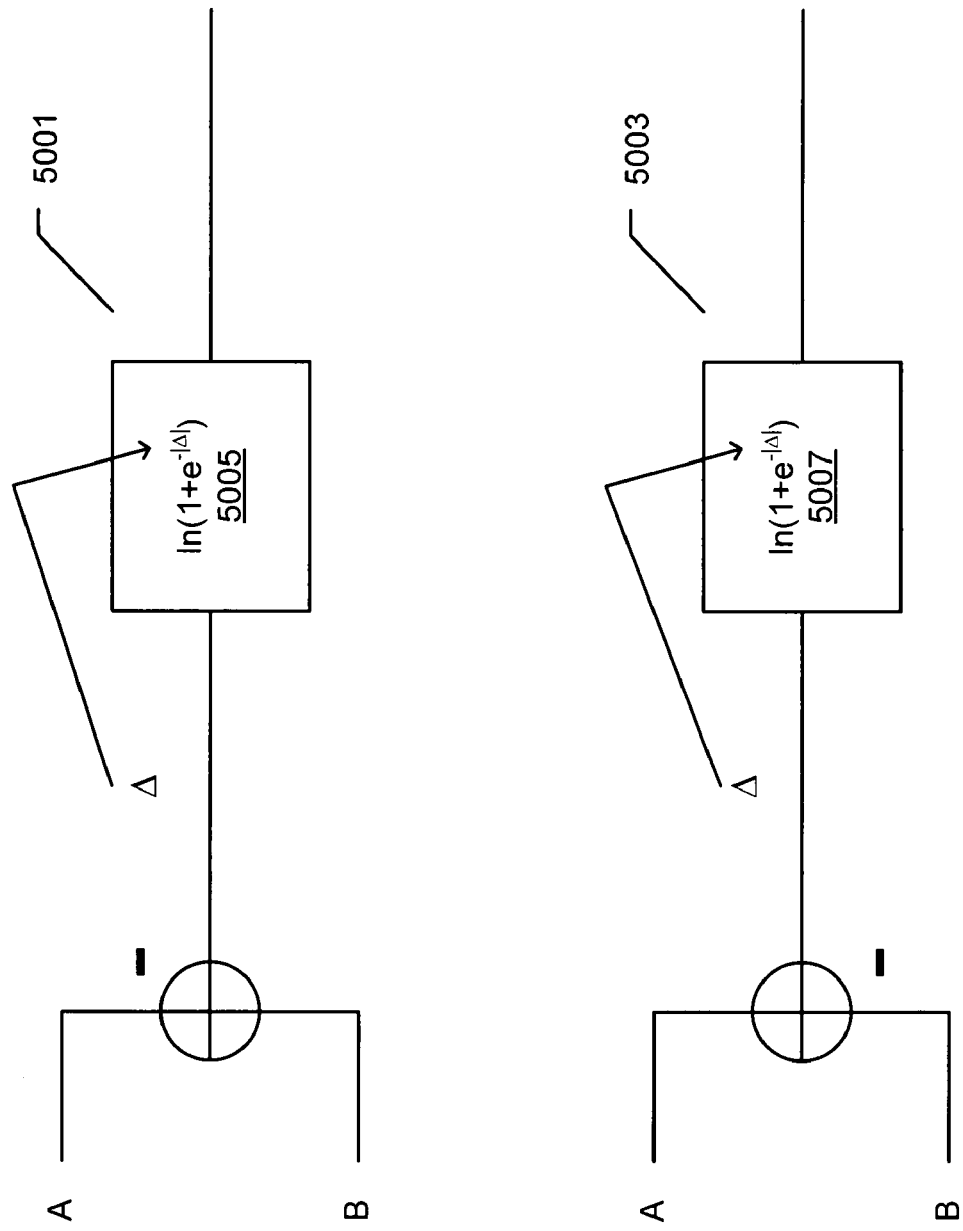
FIG. 50 is a graphical illustration of the computation of the log portion of the min* operation assuming that Δ is positive, as well as negative.

FIG. 50 is a graphical illustration of a portion of two Min* circuits illustrated generally at 5001 and 5003. In the circuit of 5001 A and B are combined but it is assumed that B is larger than A and the value Δ will always be positive. In the second circuit it is assumed that the value of A will be larger than B and hence the Δ in circuit 5003 will always be positive. It is obvious that both assumptions cannot be correct. It is also obvious that one of the two assumptions must be correct. Accordingly, the circuit is duplicated and then a mechanism, which will be described later, is used to select the circuit that has made the correct assumption. In addition, in assuming that Δ values in either circuit 5001 or 5003 will be positive computation 5005 and 5007 can be started based on the assumption that Δ is a positive value. If Δ is a positive value then the process of computation of the log quantity of 5005 or 5007 can start when the first bit is produced by the comparison between A and B. In other words, it is not necessary for the entire value to be computed in order to start the calculations in blocks 5005 and 5007. Of course, one of the calculations will be incorrect, and will have to be discarded. Once the least significant bit has been produced by the comparison between A and B, the least significant bit of .delta. can be placed in the calculation block 5005 or 5007 and the log calculation started. By not waiting until the entire Δ value has been produced, the process of computation can be further sped up.

Once the value of Δ 5107 is computed, it can be used in the calculation in block 5113. In order to compute the value in block 5113 properly, the value of Δ needs to be examined. In order to take the absolute value of Δ, Δ must be negated if it is less than 0. In other operations where Δ is positive, the process of taking its absolute value can be eliminated and hence the overall circuit sped up. Therefore, if it was known a priori whether A or B was larger it would be easy to arrange those inputs so that the value of Δ was always positive, thus minimizing the time that circuit 5113 must take for its computation. Since block 5113 the computation takes longer than the process of operating the multiplexer 5009 with the sign bit of the .delta. value of 5007. Since there is no way to determine a priori which value will be larger A or B there is no way to arrange the circuit so that the value of .delta. will always be positive. However, although it is not known a priori which will be larger A or B duplicate circuits can be fabricated based on the assumption that A is larger than B and a second assumption that B is larger than A. Such a circuit is illustrated in FIG. 51.

The β values to be calculated in a similar fashion to the α value and all comments with respect to speeding up α calculations pertain to β calculations. The speed of the α computation and the speed of the beta computation should be minimized so that neither calculation takes significantly longer than the other. In other words, all speed-up techniques that are applied to the calculation of α values may be applied to the calculation of beta values in the reverse direction.

The calculation of the logarithmic portion of the min* operation represents a of the log function. Approximating a function by using a look-up table is one way of speeding a complex mathematical calculation. In the table it is seen that any value of delta larger than 1.25 or smaller than 1.25 will result in a log output equal to point 5. Therefore, instead of actually calculating the value of the logarithmic portion of the Min* the table of FIG. 51A can be used.

Figure 51:
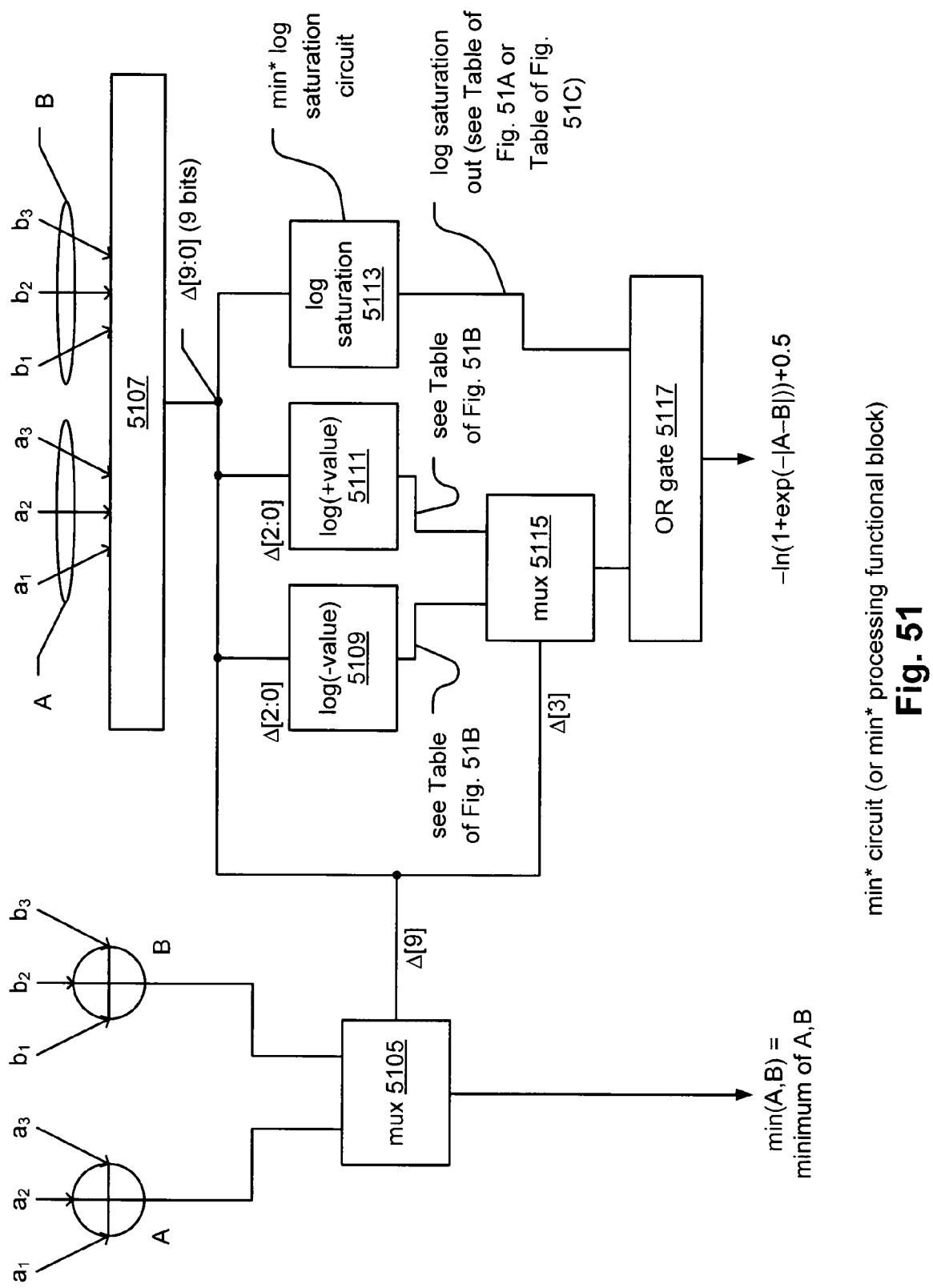
FIG. 51 is a graphical illustration of a min* circuit according to an embodiment of the invention.

FIG. 51A is a α-β log table which contain look-up value for the calculation of the log portion of the Min* operation. The table of FIG. 51A also illustrates that the value of Δ need only be known to the extent of its three least significant bits. Therefore, the value of the logarithm out can be calculated quickly by noticing if bits $B_4$ through $B_1$ are not all zeros and $B_4$ through $B_1$ are not all ones then the value of delta lies in a range that would make the value of the logarithm equal to 0.5. Such a calculation can be accomplished in the log saturation block 5113 through the use of a simple combinational logic. Blocks 5109 and 5111 in FIG. 51 represent the calculation of the logarithm of the minus delta value and the calculation logarithm of the plus delta value. The valid calculation, between 5109 and 5111, is selected by multiplexer 5115.

Multiplexer 5105 also is controlled by the value of Δ as is multiplexer 5115. Multiplexer 5115 can be controlled by bit 3 of Δ (Any error caused by the selection of the wrong block 5109 or 5111 by using bit 3 instead of α9, the sign bit, is made up for in the log saturation block 5113. How this works can be determined by consider FIG. 51B.

FIG. 51B is a graphical illustration of a table used in the log saturation of FIG. 51. In RANGE#2 and RANGE#4 where in_out is 0, Δ3 selects the right range for in_out (i.e., when it's 0, it select log (+value) for in/out to be 0, and when it's 1 it selects log(−value) for in_out to be 0). In RANGE#1 (i.e., +value), when Δ3 changes from 0 to 1, this would select incorrectly log(−value) for the MUX output. However, the selected (MUX) output is overwritten at the OR gate by the Log Saturation block. This Log Saturation block detects that Δ8:3 is not all 0's (e.g., it's 000001) then it would force the in_out to be 1 which is the right value of RANGE#1.

Similarly, for RANGE#4 (i.e., −value), when Δ3 changes from 1 to 0, it would select in correctly the log (+value) for the MUX output. However, the selected (MUX) output is overwritten at the OR gate by the Log Saturation block. This Log Saturation block detects that Δ8:3 is not all 1's (e.g., it's 111110) when it would force the in/out to be 1 which is the right value for RANGE #4. The sign bit of Δ controls whether A or B is selected be passed through the output. The input to the A and B adders 5101 and 5103 are similar to that shown in FIG. 48. A and B form sums separately so that the correct sum may be selected by multiplexer 5105. In contrast the carry sum adder 5107 can accept all the inputs to A and B in order to calculate Δ. Of course, one of the inputs must be in two's compliment form so that the subtraction of A minus B can be accomplished. In other words, either the A or B values can be negated and two's complimented and then add to the other values in order to form the Δ value. The negating of a value is a simple one gate operation. Additionally, the forming of a two's compliment by adding one is relatively simple because in the carry sum addition first stage is assumed to have a carry of zero. By assuming that that carry is equal to one instead of a zero a two's complimentary value can be easily formed.

Figure 52:
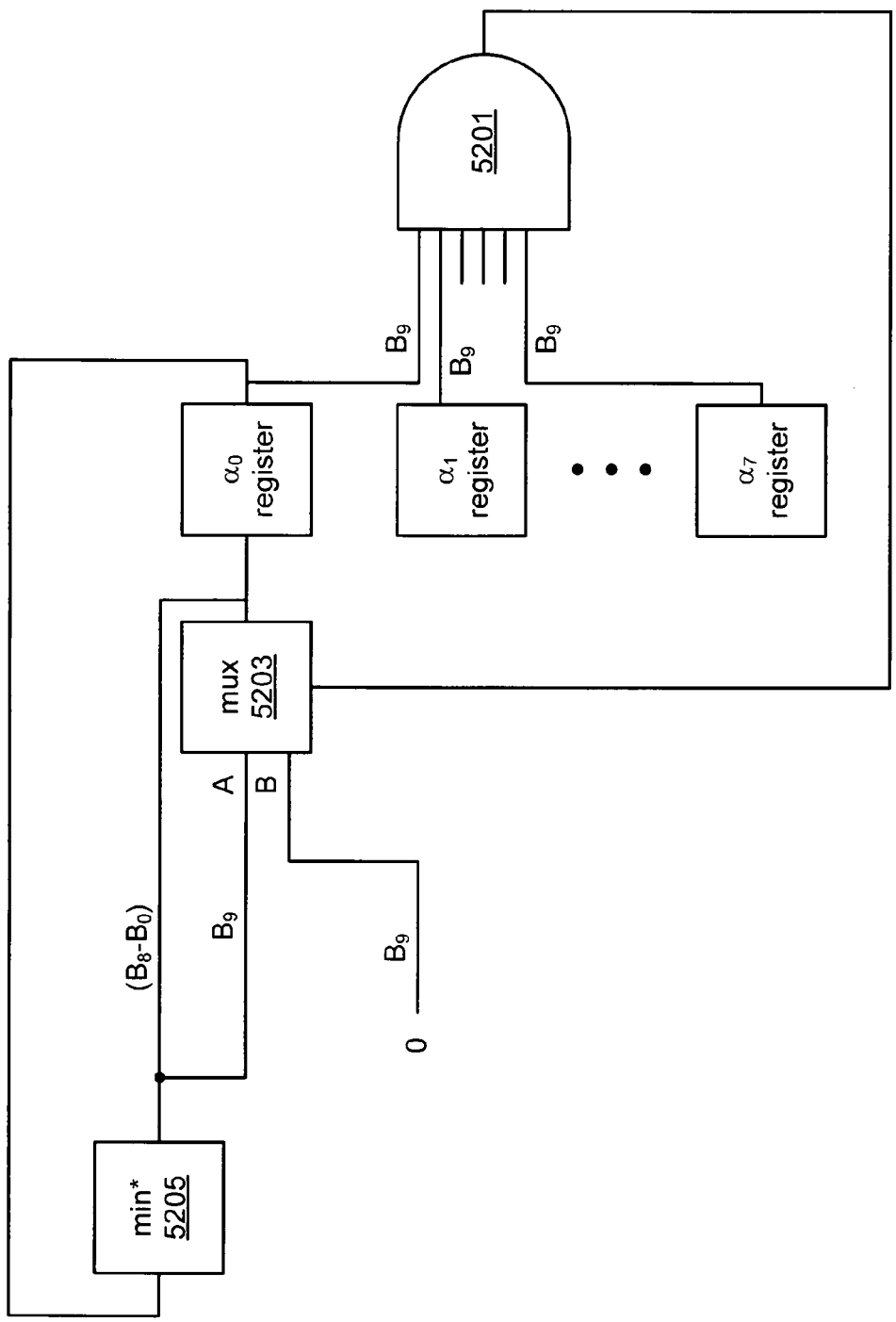
FIG. 52 is a graphical illustration and circuit diagram indicating the way in which alpha values within a SISO are normalized.

FIG. 52 is a graphical illustration and circuit diagram indicating the way in which α values within the SISO are normalized. As the α values within the SISOs tend to converge the values in the registers patrol the α values have a tendency to grow between iterations. In order to keep the operation of the SISO as economical as possible in terms of speed and memory usage, the value stored in the α register should be kept as small as only needed for the calculations to be performed. One method of doing this is the process called normalization. The process of normalization in the present embodiment occurs when the high order bit of the value in all the α registers is 1. This condition indicates that the most significant bit in each α register is set. Once the condition where all of the bits in all of the α registers are set and all of the most significant bits can be immediately reset in order to subtract a constant value from each of the values within the α registers. Such a process can be done using subtraction of course, but that would involve addition delays. The process illustrated in FIG. 52 involves no such addition delays. Once the all most significant α bits condition is detected by AND gate 5201, multiplexer 5203 can be activated. Multiplexer 5203 takes bits $B_0$ through $B_8$ from the output of the Min* block 5205. However, in the case where normalization is performed, only the values $B_0$ through $B_8$ are accepted from Min* block 5205 by the multiplexer 5203. Value for $B_8$ is accepted from a constant value 0 in the case where the normalization AND gate 5201 is activated. In such a manner a constant value can be subtracted from each of the α registers without increasing any cycle time of the overall decoder circuit.

In view of the above detailed description of the invention and associated drawings, other modifications and variations will now become apparent. It should also be apparent that such other modifications and variations may be effected without departing from the spirit and scope of the invention.

What is claimed is:

1. A method for producing a coded signal from a sequence of tuples, the method comprising:
modulo interleaving input tuples in at least one interleaver
encoding the input tuples in an odd encoder and an even encoder;
encoding to interleaved tuples in the odd encoder and to even encoder;
selecting to encoded tuples from each of to odd encoder and to even encoder; and
mapping the selected, encoded tuples using at least one mapping, wherein only encoded tuples corresponding to input tuples having an odd modulo sequence designation are selected from the odd encoder and only encoded tuples corresponding to input tuples having an even modulo sequence designation are selected from the even encoder.

2. The method of claim 1, wherein:
the encoding the interleaved tuples in the odd encoder and the even encoder includes systematic encoding a sequence of N tuples, where N is an integer number.

3. The method of claim 1, wherein:
the encoding the interleaved tuples in the odd encoder and the even encoder includes nonsystematic encoding.

4. The method of claim 1, wherein:
the encoding the interleaved tuples in the odd encoder and the even encoder includes convolutional encoding.

5. The method of claim 1, wherein:
the encoding the interleaved tuples in the odd encoder and the even encoder includes recursive encoding.

6. The method of claim 1, wherein:
the selecting the encoded tuples from each of the odd encoder and the even encoder includes puncturing at least one bit output from at least one of the odd encoder and the even encoder.

7. The method of claim 6, wherein:
the puncturing at least one bit output from at least one of the odd encoder and the even encoder includes substituting at least one uncoded bit for the at least one punctured bit.

8. The method of claim 1, further comprising:
mapping a first selected tuple of the selected tuples to a first constellation whose constellation points have a first mapping; and
mapping a second selected tuple of the selected tuples to a second constellation whose constellation points have a second mapping.

9. The method of claim 1, further comprising:
inverting at least one interleaved tuple of the interleaved tuples before encoding the at least one interleaved tuple in the odd encoder.

10. The method of claim 1, further comprising:
inverting at least one input tuple of the input tuples before encoding the at least one input tuple in the even encoder.

11. The method of claim 1, wherein:
the method is performed within a communication device.

12. The method of claim 1, wherein:
the at least one mapping includes an 8-PSK (Phase Shift Keying) constellation having 8 constellation points; or
the at least one mapping includes a 16-QAM (Quadrature Amplitude Modulation) constellation having 16 constellation points.

13. The method of claim 1, wherein:
the selecting the encoded tuples from each of the odd encoder and the even encoder includes puncturing at least one bit output from the odd encoder and at least one bit output from the even encoder.

14. The method of claim 1, wherein:
the at least one interleaver includes a first interleaver and a second interleaver;
at least one input tuple of the input tuples includes a first bit and a second bit;
the first interleaver interleaves the first bit; and
the second interleaver interleaves the second bit.

15. An apparatus, comprising:
at least one interleaver implemented to modulo interleave input tuples;
a first encoder implemented to encode the input tuples and the interleaved tuples;
a second encoder implemented to encode the input tuples and the interleaved tuples;
a selector implemented to select encoded tuples from each of the first encoder and the second encoder; and
a mapper implemented to map the selected, encoded tuples using at least one mapping; and wherein;
only encoded tuples corresponding to input tuples having an odd modulo sequence designation are selected from the first encoder and only encoded tuples corresponding to input tuples having an even modulo sequence designation are selected from the second encoder.

16. The apparatus of claim 15, further comprising:
an inverter implemented to invert at least one interleaved tuple of the interleaved tuples before the first encoder encodes the at least one interleaved tuple.

17. The apparatus of claim 15, further comprising:
an inverter implemented to invert at least one input tuple of the input tuples before the second encoder encodes the at least one input tuple.

18. The apparatus of claim 15, wherein:
the at least one mapping includes an 8-PSK (Phase Shift Keying) constellation having 8 constellation points; or
the at least one mapping includes a 16-QAM (Quadrature Amplitude Modulation) constellation having 16 constellation points.

19. The apparatus of claim 15, further comprising:
a puncturing module implemented to puncture at least one bit output from at least one of the first encoder and the second encoder.

20. The apparatus of claim 15, further comprising:
a puncturing module implemented to puncture at least one bit output from the first encoder and at least one bit output from the second encoder.

* * * * *

UNITED STATES PATENT AND TRADEMARK OFFICE
CERTIFICATE OF CORRECTION

PATENT NO. : 7,499,503 B2  Page 1 of 1
APPLICATION NO. : 11/728519
DATED : March 3, 2009
INVENTOR(S) : Kelly B. Cameron et al.

It is certified that error appears in the above-identified patent and that said Letters Patent is hereby corrected as shown below:

Title Page, after "(65) Prior Publication Data US 2008/0043878A1 Feb. 21, 2008" please insert the following:
--Related U.S. Application Data (62) Division of application No. 09/878,148, filed on Jun. 8, 2001, now Pat. No. 7,242,725. (60) Provisional application No. 60/232,053, filed on Sep. 12, 2000, provisional application No. 60/232,288, filed on Sept. 12, 2000.--.

Column 50, line 31, in Claim 1: replace "interleaver" with --interleaver;--.

Signed and Sealed this

Twenty-fifth Day of August, 2009

David J. Kappos
*Director of the United States Patent and Trademark Office*